(12) United States Patent
Lee et al.

(10) Patent No.: US 11,812,612 B2
(45) Date of Patent: Nov. 7, 2023

(54) SEMICONDUCTOR DEVICE AND MANUFACTURING METHOD OF SEMICONDUCTOR DEVICE

(71) Applicant: SK hynix Inc., Icheon-si (KR)

(72) Inventors: Kun Young Lee, Icheon-si (KR); Dong Hyoub Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 290 days.

(21) Appl. No.: 17/147,260

(22) Filed: Jan. 12, 2021

(65) Prior Publication Data

US 2021/0408036 A1    Dec. 30, 2021

(30) Foreign Application Priority Data

Jun. 26, 2020   (KR) ........................ 10-2020-0078380

(51) Int. Cl.
| | |
|---|---|
| H01L 27/11582 | (2017.01) |
| H10B 43/27 | (2023.01) |
| H01L 23/522 | (2006.01) |
| H10B 41/10 | (2023.01) |
| H10B 41/27 | (2023.01) |
| H10B 43/10 | (2023.01) |
| H10B 63/00 | (2023.01) |

(52) U.S. Cl.
CPC ......... *H10B 43/27* (2023.02); *H01L 23/5226* (2013.01); *H10B 41/10* (2023.02); *H10B 41/27* (2023.02); *H10B 43/10* (2023.02); *H10B 63/34* (2023.02); *H10B 63/845* (2023.02)

(58) Field of Classification Search
CPC ........ H10B 41/10; H10B 41/27; H10B 63/34; H10B 63/845; H10B 63/30; H10B 41/35; H10B 43/35; H01L 29/7926; H01L 29/7889

See application file for complete search history.

(56) References Cited

U.S. PATENT DOCUMENTS

| | | | |
|---|---|---|---|
| 9,147,468 B1 | 9/2015 | Lue | |
| 9,397,110 B2* | 7/2016 | Lue | ..................... H01L 27/0207 |
| 10,825,829 B2* | 11/2020 | Futatsuyama | .......... H10B 43/10 |
| 10,910,399 B2* | 2/2021 | Lue | ................... H01L 21/31144 |
| 11,545,190 B2* | 1/2023 | Choi | .................. H10B 41/27 |
| 11,594,551 B2* | 2/2023 | Yabuki | .................. H10B 41/10 |
| 2016/0260725 A1* | 9/2016 | Jung | ..................... H10B 43/10 |
| 2017/0062456 A1 | 3/2017 | Sugino et al. | |

(Continued)

FOREIGN PATENT DOCUMENTS

KR             101938502 B1        1/2019

*Primary Examiner* — Jarrett J Stark
(74) *Attorney, Agent, or Firm* — WILLIAM PARK & ASSOCIATES LTD.

(57) ABSTRACT

A semiconductor device includes a stacked structure with conductive layers and insulating layers that are stacked alternately with each other, an insulating pillar passing through the stacked structure, a first channel pattern surrounding a sidewall of the insulating pillar, a second channel pattern surrounding the sidewall of the insulating pillar, a first insulator formed between the first channel pattern and the second channel pattern, and a memory layer surrounding the first channel pattern, the second channel pattern, and the first insulator, the memory layer with a first opening located that is between the first channel pattern and the second channel pattern.

16 Claims, 51 Drawing Sheets

(56) References Cited

U.S. PATENT DOCUMENTS

| | | | |
|---|---|---|---|
| 2018/0019257 A1* | 1/2018 | Son | H10B 41/27 |
| 2018/0182776 A1* | 6/2018 | Kim | H01L 29/66833 |
| 2020/0006375 A1* | 1/2020 | Zhou | H10B 43/20 |
| 2021/0408036 A1* | 12/2021 | Lee | H10B 43/27 |

* cited by examiner

B – B'

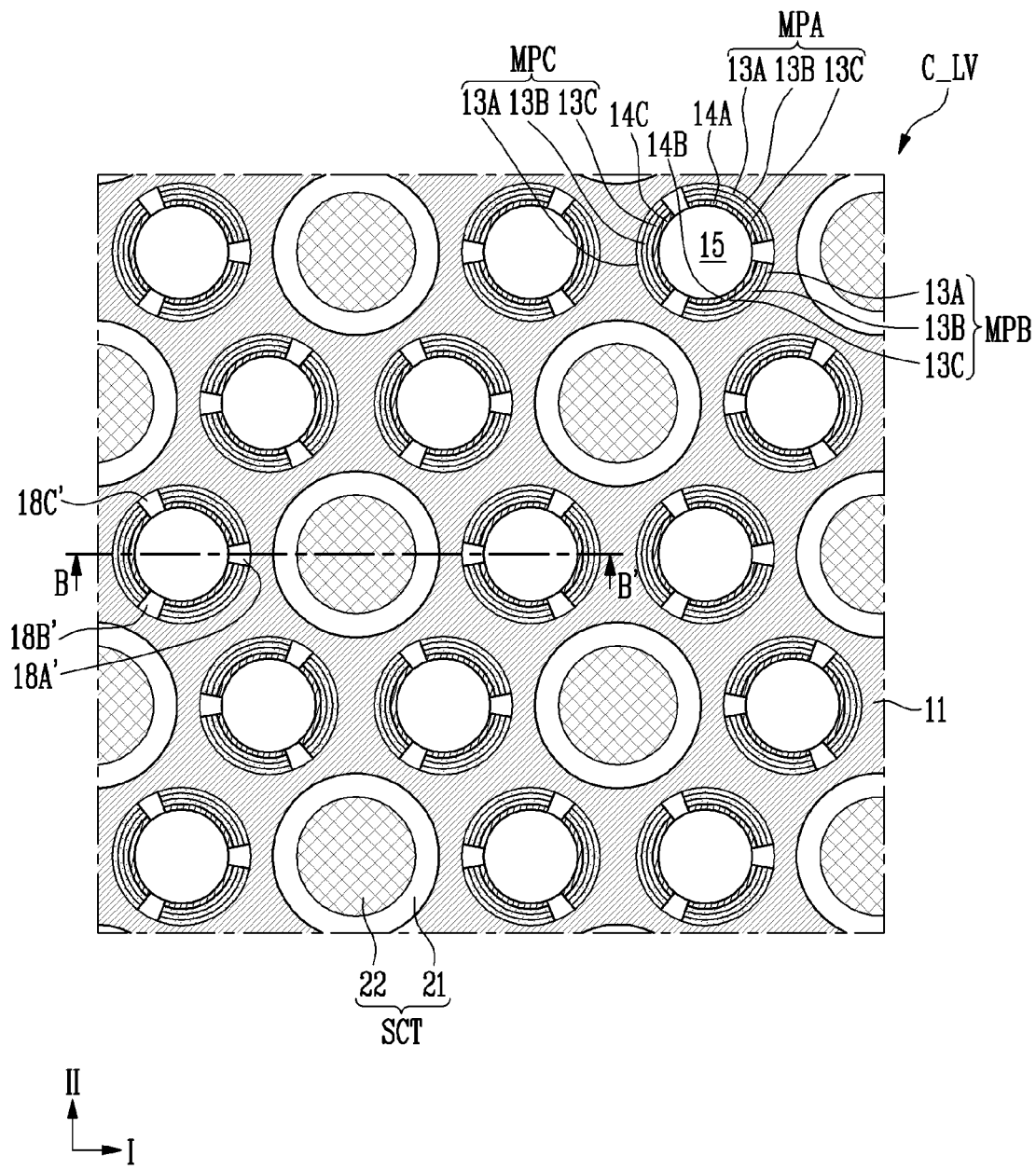

B - B'

B - B'

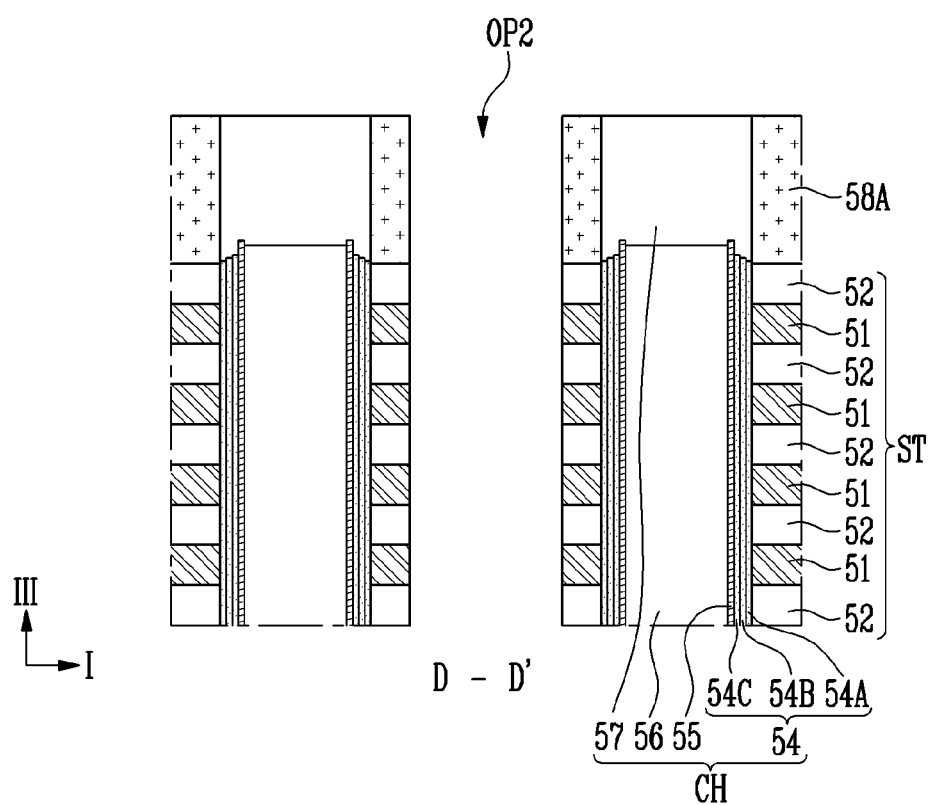

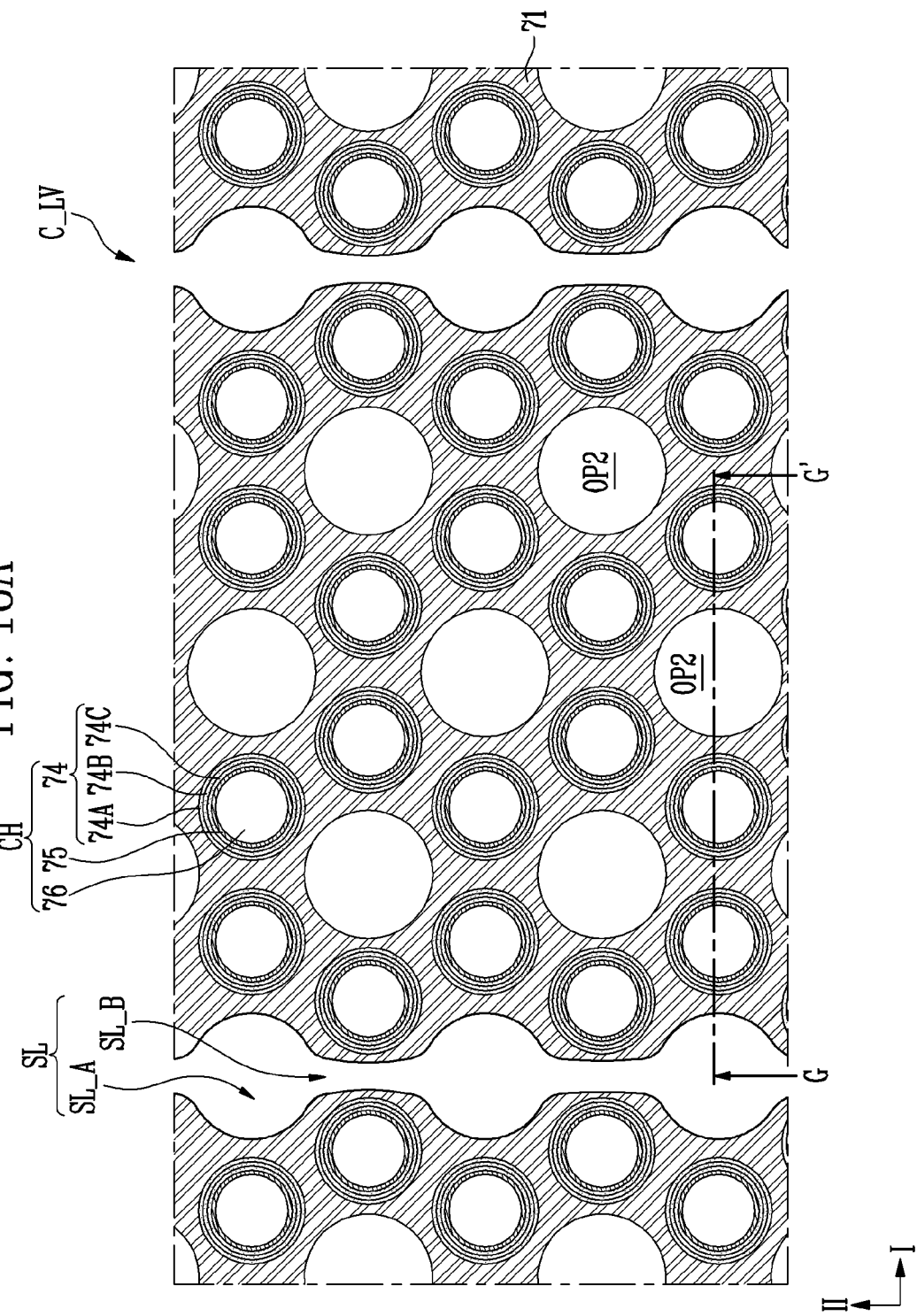

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2020-0078380 filed on Jun. 26, 2020, in the Korean Intellectual Property Office, the entire disclosure of which is incorporated by reference herein.

BACKGROUND

1. Technical Field

Various embodiments of the invention relate generally to an electronic device, and more particularly, to a semiconductor device and a method of manufacturing the semiconductor device.

2. Related Art

Non-volatile memory devices retain stored data regardless of power on/off conditions. The increase in integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate. In addition, various structures and manufacturing methods have been developed to improve the operational reliability of three-dimensional non-volatile memory devices.

SUMMARY

According to an embodiment, a semiconductor device may include a stacked structure with conductive layers and insulating layers that are stacked alternately with each other, an insulating pillar passing through the stacked structure, a first channel pattern surrounding a sidewall of the insulating pillar, a second channel pattern surrounding the sidewall of the insulating pillar, a first insulator between the first channel pattern and the second channel pattern, and a memory layer surrounding the first channel pattern, the second channel pattern, and the first insulator, the memory layer with a first opening that is located between the first channel pattern and the second channel pattern.

According to an embodiment, a semiconductor device may include a stacked structure with conductive layers and insulating layers that are stacked alternately with each other, a source contact structure passing through the stacked structure, channel structures passing through the stacked structure and arranged around the source contact structure, insulating patterns each with a first portion that surrounds a sidewall of the source contact structure and second portions that protrude from the first portion and extend into the channel structures, and insulators located between the second portions that are adjacent to each other in a stacking direction.

According to an embodiment, a method of manufacturing a semiconductor device may include forming a stacked structure with first material layers and second material layers that are stacked alternately with each other, forming channel structures that pass through the stacked structure, each of the channel structures including a channel layer, forming a first opening that passes through the stacked structure, the first opening located between the channel structures, forming second openings that have contact points with the channel structures by etching the second material layers through the first opening, and patterning the channel structures through the contact points to separate the channel layer into channel patterns.

According to an embodiment, a semiconductor device may include a stacked structure with conductive layers and insulating layers that are stacked alternately with each other, an insulating pillar passing through the stacked structure, a first channel pattern surrounding a sidewall of the insulating pillar, a second channel pattern surrounding the sidewall of the insulating pillar, a first insulator between the first channel pattern and the second channel pattern, and a memory layer surrounding the first channel pattern, the second channel pattern, and the first insulator, wherein the memory layer provides openings that expose the first and second channel patterns or the insulating pillar at levels that correspond to the insulating layers.

BRIEF DESCRIPTION OF THE DRAWINGS

FIGS. 3A to 3E are diagrams, illustrating the structure of a semiconductor device, according to an embodiment of the present disclosure;

FIGS. 7A to 7D, FIGS. 8A to 8C, FIGS. 9A and 9B, FIGS. 10A to 10C, FIGS. 11A to 11C, FIGS. 12A to 12C, FIGS. 13A to 13D, and FIGS. 14A to 14D are diagrams, illustrating a manufacturing method of a semiconductor device, according to an embodiment of the present disclosure;

FIGS. 18A and 18B, FIGS. 19A to 19C, FIGS. 20A to 20C, and FIGS. 21A and 21B are diagrams, illustrating a method of manufacturing a semiconductor device, according to an embodiment of the present disclosure;

DETAILED DESCRIPTION

Advantages and features of the present invention and methods for achieving them will be made clear from embodiments described below in detail with reference to the accompanying drawings. However, they may be embodied in different forms and should not be construed as limited to the embodiments set forth herein. Rather, these embodiments are provided so that this disclosure will be thorough and complete, and will fully convey the scope of the example embodiments to those skilled in the art.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Various embodiments are directed to a semiconductor device with a stabilized structure and improved characteristics, and a manufacturing method thereof.

Figure 1A:
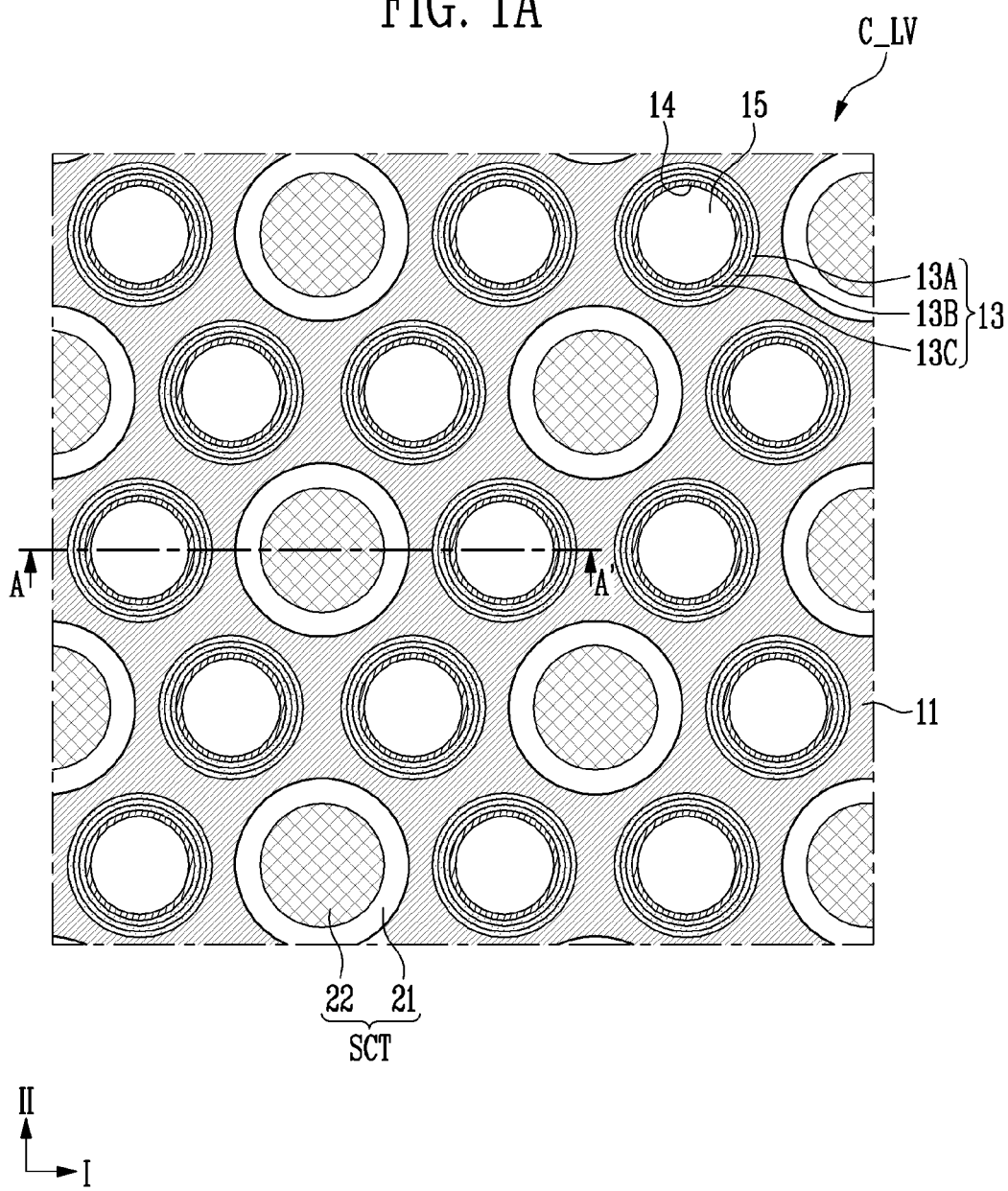
FIGS. 1A and 1B are diagrams, illustrating the structure of a semiconductor device, according to an embodiment of the present disclosure.
Figure 1B:
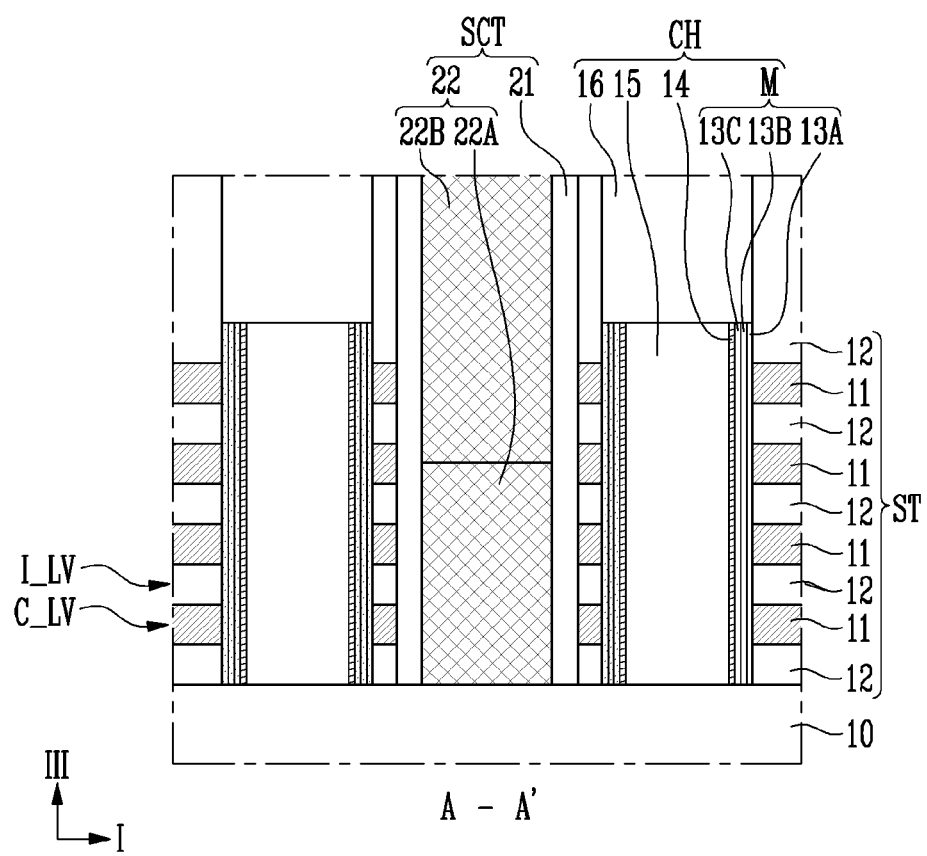

FIGS. 1A and 1B are diagrams, illustrating the structure of a semiconductor device, according to an embodiment of the present disclosure. FIG. 1A is a plan view of a conductive level C_LV, and FIG. 1B is an A-A' cross-sectional view.

Referring to FIGS. 1A and 1B, a semiconductor device may include a stacked structure ST, a channel structure CH, and a source contact structure SCT and may further include a base 10.

The stacked structure ST may include the conductive level C_LV with a conductive material and an insulating level I_LV with an insulating material. According to an embodiment, the stacked structure ST may include conductive layers 11 and insulating layers 12 that are stacked alternately with each other. The conductive layers 11 and the insulating layers 12 may be stacked on each other in a third direction III.

At least one uppermost conductive layer and at least one lowermost conductive layer, among the conductive layers 11, may be select lines, and the remaining conductive layers may be word lines. The conductive layers 11 may include a conductive material, such as polysilicon, or a metal, such as tungsten (W) or molybdenum (Mo). The insulating layers 12 may include an insulating material such as oxide, nitride, or air gaps.

The channel structure CH may pass through the stacked structure ST. More specifically, the channel structure CH may pass through the stacked structure ST in the third direction III and may be coupled to the base 10. The base 10 may be a semiconductor substrate or may include a source region or a source layer. The base 10 may include a lower structure with a peripheral circuit and an interconnection.

The channel structure CH may include a channel layer 14 and may further include an insulating pillar 15, a memory layer M, or a conductive pad 16. The insulating pillar 15 may pass through the stacked structure ST and may include an insulating material such as oxide. The channel layer 14 may surround a sidewall of the insulating pillar 15. The channel layer 14 may refer to a region in which a channel of a memory cell or a select transistor is formed and may include a semiconductor material or a nanostructure. The conductive pad 16 may be provided to electrically couple the channel layer 14 to wires, such as a bit line. The conductive pad 16 may include a conductive material, such as polysilicon. During manufacturing processes, the conductive pad 16 may serve as a mask pattern.

The source contact structure SCT may pass through the stacked structure ST and may extend in the third direction III. The source contact structure SCT may include a source contact plug 22 and an insulating spacer 21. The source contact plug 22 may be electrically coupled to the base 10 and either the source region or the source layer that is included in the base 10. The source contact plug 22 may have a single-layer structure or a multilayer structure. The multilayer structure may include a first conductive layer 22A and a second conductive layer 22B, the second conductive layer 22B having a lower resistance than the first conductive layer 22A. The second conductive layer 22B may include a material with a lower resistance than the first conductive layer 22A. According to an embodiment, the first conductive layer 22A may include polysilicon, and the second conductive layer 22B may include metal, such as tungsten or molybdenum. The insulating spacer 21 may surround a sidewall of the source contact plug 22 and may include an insulating material, such as oxide. The source contact plug 22 and the conductive layers 11 may be electrically isolated from each other by the insulating spacer 21.

According to the above-described structure, the source contact structures SCT, in the form of plugs, may be located between the channel structures CH.

Figure 2A:
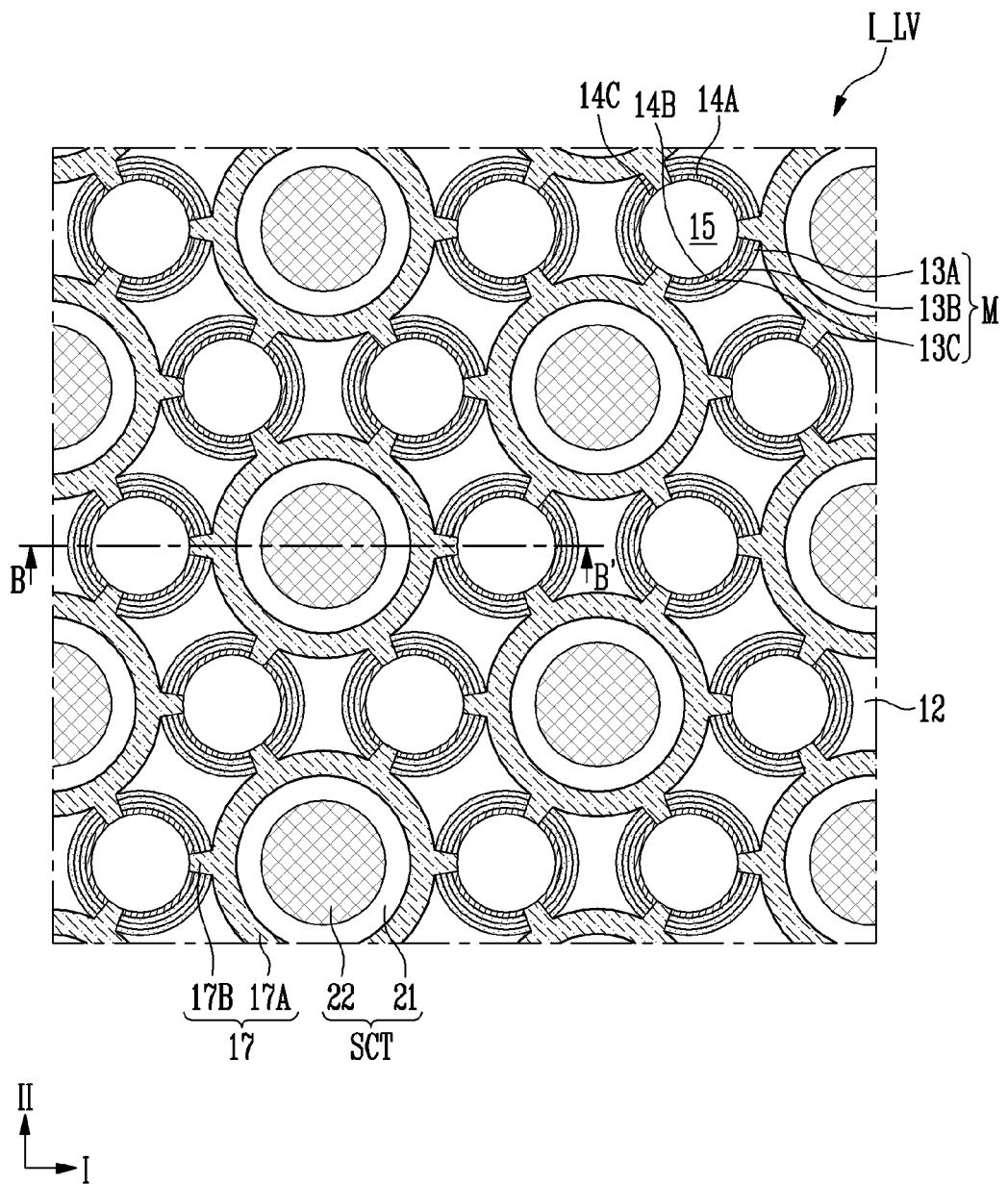
FIGS. 2A to 2F are diagrams, illustrating the structure of a semiconductor device, according to an embodiment of the present disclosure.
Figure 2B:
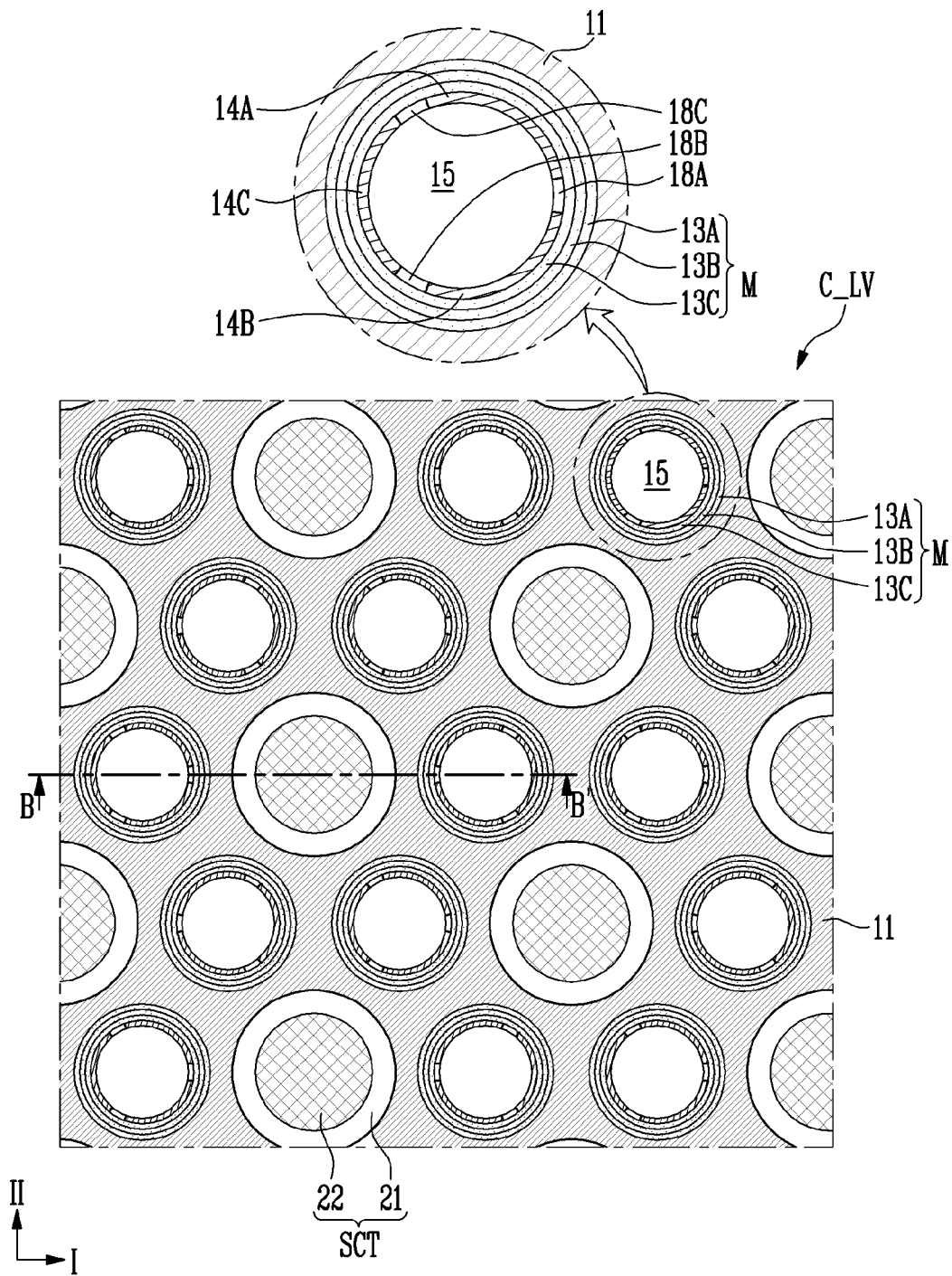
Figure 2C:
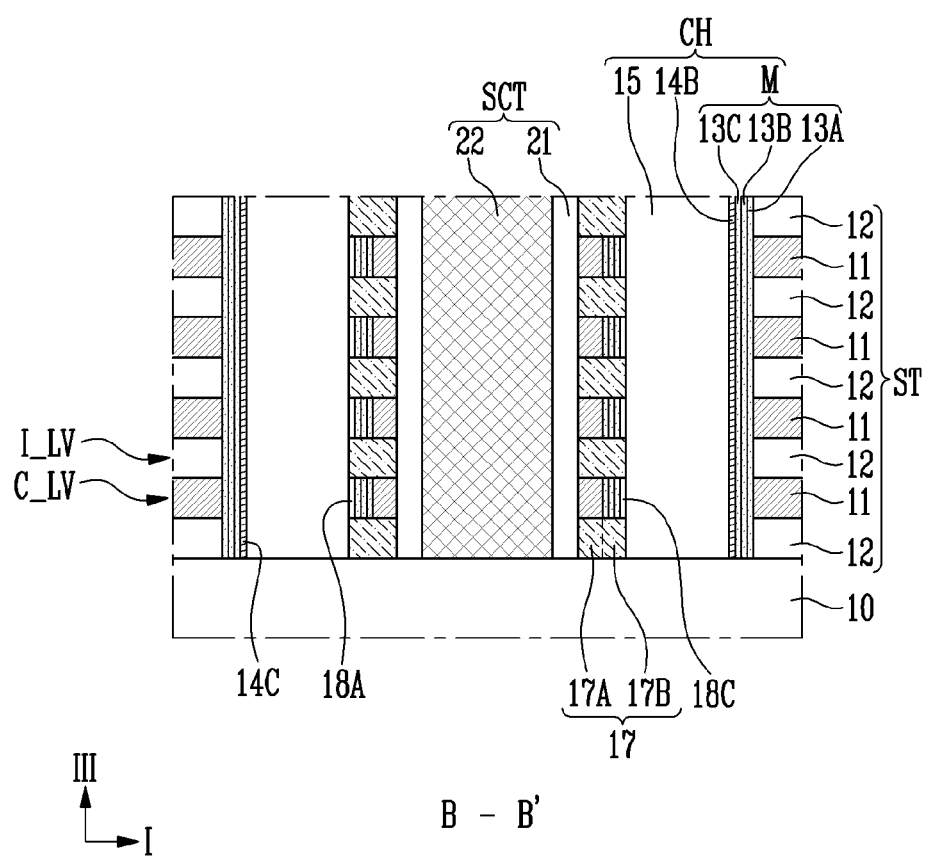
Figure 2D:
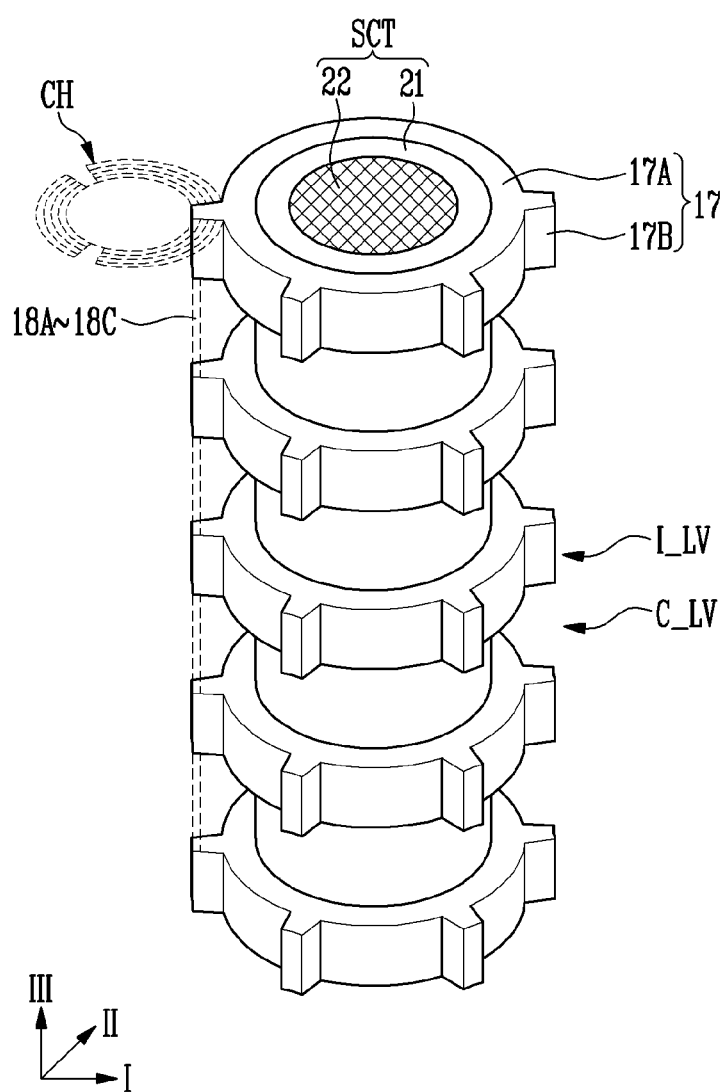
Figure 2E:
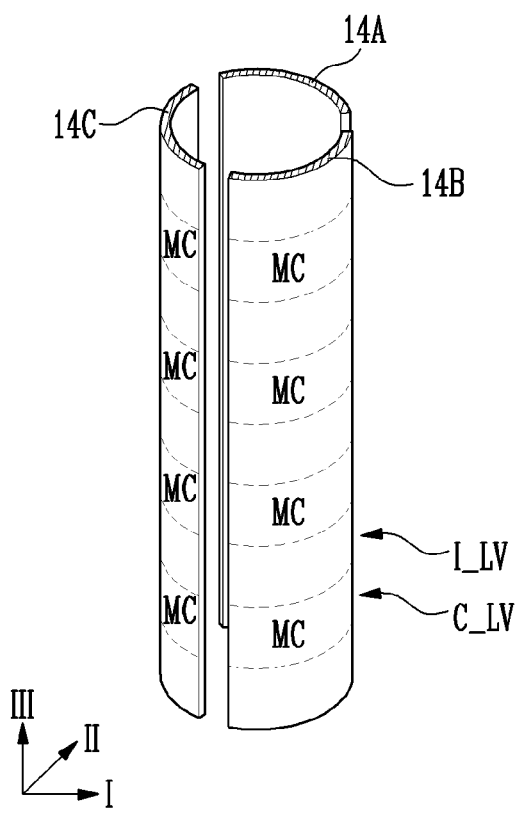
Figure 2F:
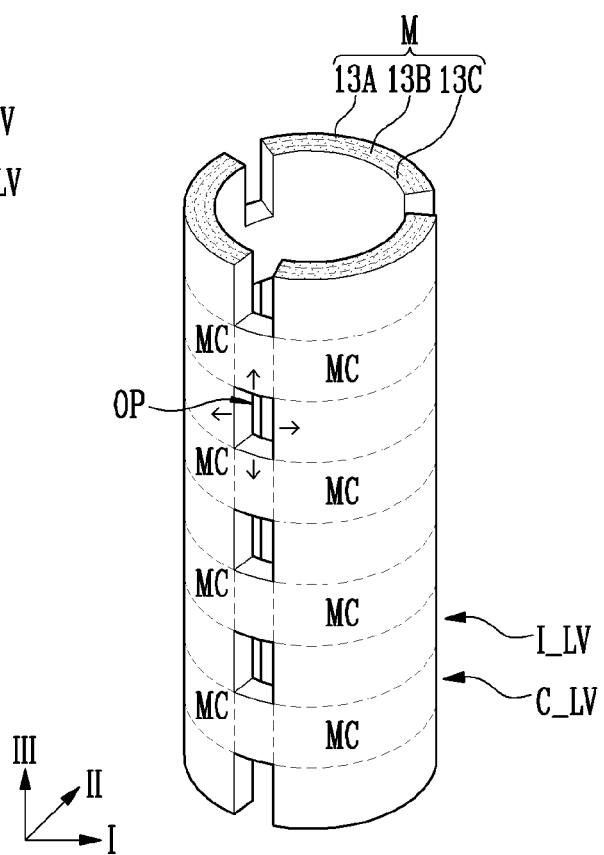

FIGS. 2A to 2F are diagrams, illustrating the structure of a semiconductor device, according to an embodiment of the present disclosure. FIG. 2A is a plan view of the insulating level I_LV. FIG. 2B is a plan view of the conductive level C_LV. FIG. 2C is a B-B' cross-sectional view. FIG. 2D is a perspective view, illustrating the structure of the source contact structure SCT and insulating patterns 17. FIG. 2E is a perspective view, illustrating the structure of first, second, and third channel patterns 14A, 14B, and 14C. In addition, FIG. 2F is a perspective view, illustrating the structure of the memory layer M.

Referring to FIGS. 2A to 2F, a semiconductor device may include the stacked structure ST, the channel structure CH, and first, second, and third insulators 18A, 18B, and 18C. In addition, the semiconductor device may further include the insulating patterns 17, the source contact structure SCT, or the base 10.

The stacked structure ST may include the conductive layers 11 and the insulating layers 12 that are stacked alternately with each other. At least one uppermost conductive layer and at least one lowermost conductive layer, among the conductive layers 11, may be select lines, and the remaining conductive layers may be word lines. The conductive layers 11 may include a conductive material, such as polysilicon, or a metal, such as tungsten (W) or molybdenum (Mo). The insulating layers 12 may include an insulating material, such as oxide, nitride, or air gaps.

The channel structure CH may pass through the stacked structure ST. The channel structure CH may pass through the stacked structure ST in the third direction III and may be coupled to the base 10. The base 10 may be a semiconductor substrate or may include a source region or a source layer.

The base 10 may include a lower structure with a peripheral circuit and an interconnection.

The channel structure CH may include the first to third channel patterns 14A to 14C and may further include the insulating pillar 15 or the memory layer M. The insulating pillar 15 may pass through the stacked structure ST and may include an insulating material, such as oxide. The channel patterns 14A to 14C may refer to a region where a channel of a memory cell or a select transistor is formed and may include a semiconductor material or a nanostructure.

The channel patterns 14A to 14C may surround a sidewall of the insulating pillar 15 and may extend in the third direction III. The channel patterns 14A to 14C may be separated from each other in a horizontal direction. The horizontal direction may be parallel with a plane that is defined in a first direction I and a second direction II. The second direction II may cross the first direction I. The first direction I and the second direction II may cross the third direction III.

The channel structure CH may include the first channel pattern 14A and the second channel pattern 14B. The first insulator 18A may be located between the first channel pattern 14A and the second channel pattern 14B to separate the first channel pattern 14A and the second channel pattern 14B from each other. In the third direction III, the distance between the first channel pattern 14A and the second channel pattern 14B may be constant or variable. For example, the distance between the first and second channel patterns 14A and 14B in the insulating level I_LV may be greater than, substantially the same as, or less than the distance therebetween in the conductive level C_LV.

The channel structure CH may further include the third channel pattern 14C. The third channel pattern 14C may share the insulating pillar 15 with the first channel pattern 14A and the second channel pattern 14B and may be separated from the first channel pattern 14A and the second channel pattern 14B. The second insulator 18B may be located between the second channel pattern 14B and the third channel pattern 14C. The third insulator 18C may be located between the third channel pattern 14C and the first channel pattern 14A.

The first to third insulators 18A to 18C may be located in the conductive level C_LV. In the plane, the first to third insulators 18A to 18C may be located between the insulating pillar 15 and the memory layer M. The first to third insulators 18A to 18C may include an insulating material such as air gaps or insulating layers.

The memory layer M may surround the channel patterns 14A to 14C and the insulators 18A to 18C and may extend in the third direction III. The memory layer M may further include at least one of a tunnel insulating layer 13C, a data storage layer 13B, and a blocking layer 13A. The data storage layer 13B may include a floating gate, a charge trapping 1s material, polysilicon, nitride, a nanostructure, a variable resistance material, a phase change material, or the like. The blocking layer 13A may include a high-k dielectric material. The memory layer M may include openings OP that partially expose the channel patterns 14A to 14C or the insulating pillar 15. The openings OP may be located between the channel patterns 14A to 14C in the insulating level I_LV.

FIG. 2F illustrates openings OP that are located between memory cells MC. However, the opening OP may extend into neighboring memory cells MC (as indicated by arrows in FIG. 2F). According to an embodiment, the width of the opening OP may extend in the third direction III. According to an embodiment, in the plane that is defined in the first direction I and the second direction II, the width of the opening OP may be greater than the distance between the channel patterns 14A to 14C.

Though not shown, the channel structure CH may further include conductive pads. The conductive pads may be coupled to the channel patterns 14A to 14C and may electrically couple the channel patterns 14A to 14C to wires, such as a bit line.

The source contact structure SCT may pass through the stacked structure ST and may extend in the third direction III. The source contact structure SCT may include the source contact plug 22 and the insulating spacer 21. The source contact plug 22 may be electrically coupled to the base 10 and either the source region or the source layer that is included in the base 10. The source contact plug 22 may have a single-layer structure or a multilayer structure. The multilayer structure may include a first conductive layer and a second conductive layer, the second conductive layer having a lower resistance than the first conductive layer. According to an embodiment, the first conductive layer may include polysilicon, and the second conductive layer may include a metal, such as tungsten or molybdenum. The insulating spacer 21 may surround a sidewall of the source contact plug 22 and may include an insulating material, such as oxide. The source contact plug 22 and the conductive layers 11 may be electrically isolated from each other by the insulating spacer 21.

The insulating patterns 17 may surround a sidewall of the source contact structure SCT and may be stacked on each other in the third direction III. Each of the insulating patterns 17 may include a first portion 17A that surrounds the sidewall of the source contact structure SCT and second portions 17B that protrude from the first portion 17A.

The first portion 17A may have a loop shape and may be located in the insulating level I_LV. In cross-section, the first portion 17A may be interposed between the conductive layers 11. In other words, in a portion of the stacked structure ST, the first portions 17A and the conductive layers 11 may be stacked alternately with each other. The first portion 17A may include points that contact neighboring channel structures CH (hereinafter, referred to as "contact points").

The second portions 17B may protrude from the contact points and may extend into the channel structures CH. The second portion 17B may penetrate the memory layer M through the opening OP and may extend into the channel patterns 14A to 14C. Therefore, the channel patterns 14A to 14C, sharing the insulating pillar 15, may be separated from each other by the second portions 17B in the insulating level I_LV. In addition, the insulators 18A to 18C may be located between the second portions 17B that are adjacent to each other in the third direction III. Therefore, the channel patterns 14A to 14C, sharing the insulating pillar 15, may be separated from each other by the insulators 18A to 18C in the conductive level C_LV.

In a planar view, a plurality of channel structures CH may be arranged around one source contact structure SCT and distances from the source contact structure SCT to these channel structures CH may be substantially the same as each other. According to an embodiment, the channel structures CH may be arranged in the form of regular polygons or concentric 1s circles, and the source contact structure SCT may be located at the center thereof. The channel structures CH that are located around the source contact structure SCT may be arranged at substantially regular intervals.

According to the above-described structure, the memory cells MC or select transistors may be located at intersections between the channel patterns 14A to 14C and the conductive layers 11. The memory cells MC and the select transistors, sharing the channel patterns 14A to 14C, may form a single memory string. Therefore, a plurality of memory cells MC may be stacked along the channel structures CH so that the degree of integration of the semiconductor device may be improved.

Figure 3A:
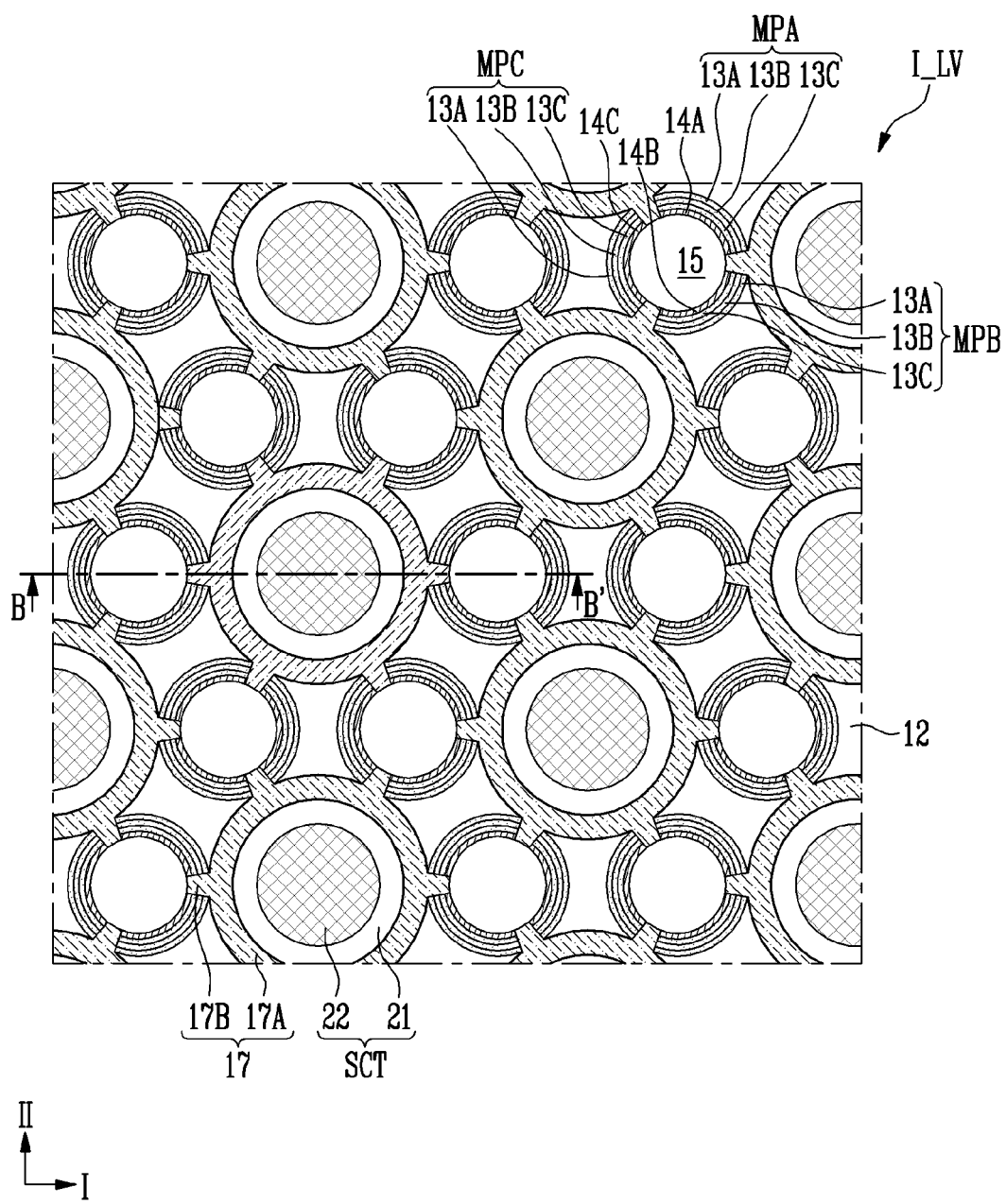
Figure 3C:
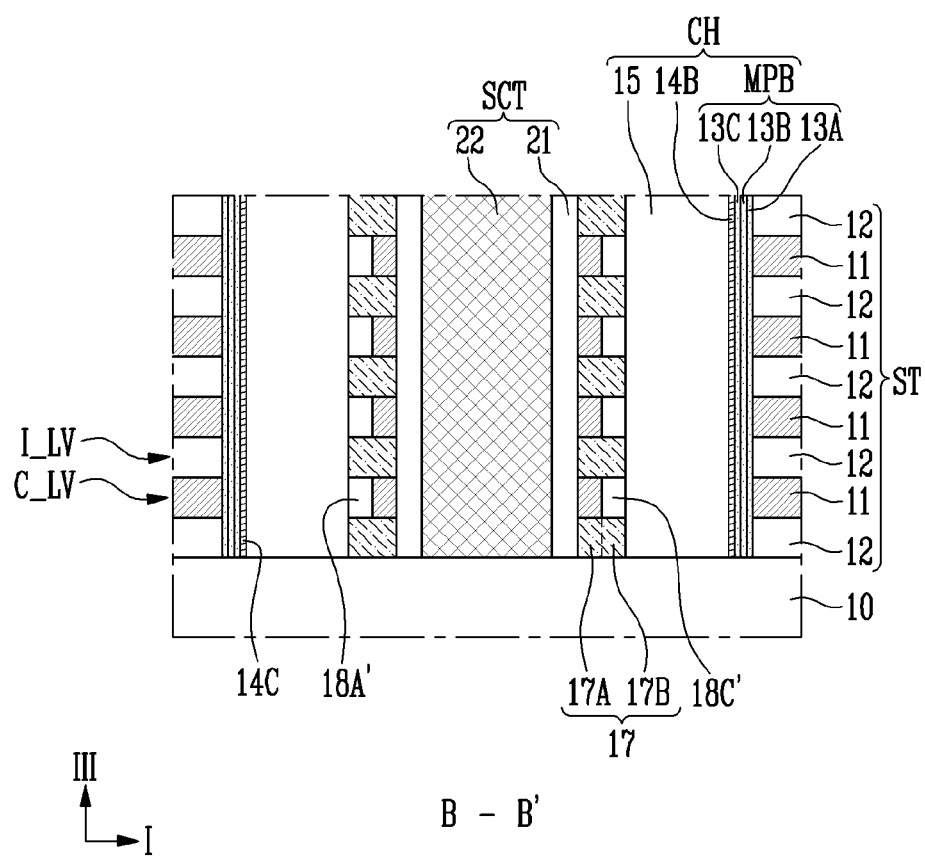
Figure 3D:
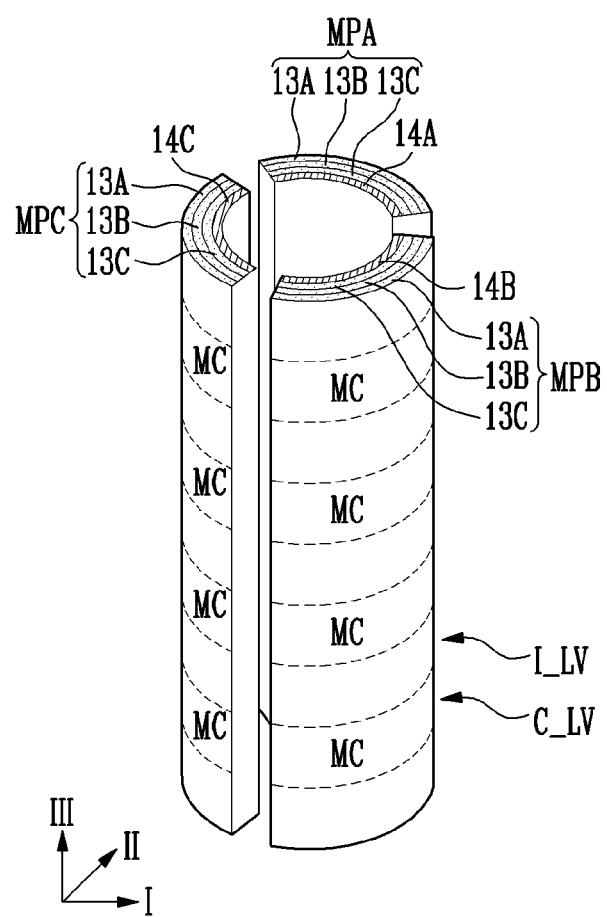
Figure 3E:
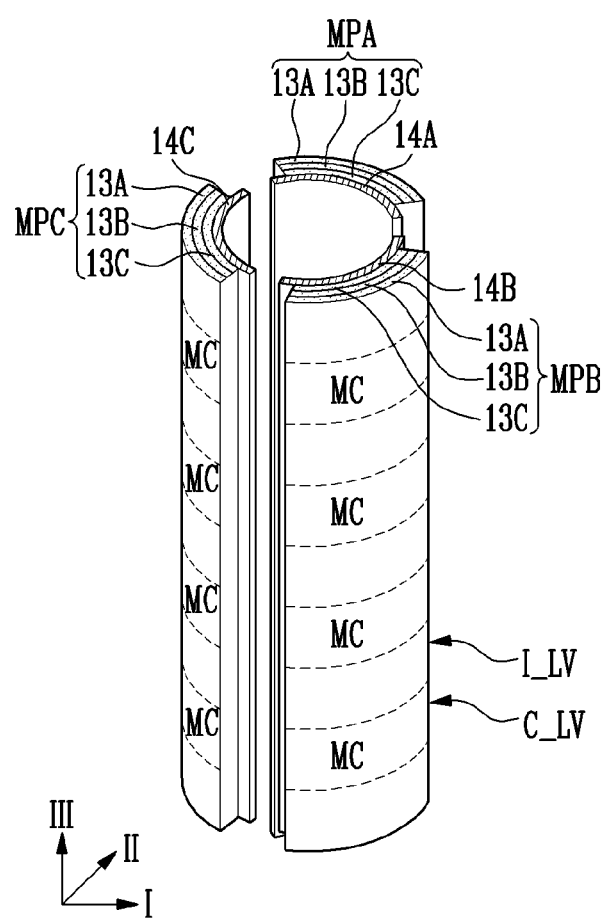

FIGS. 3A to 3E are diagrams, illustrating the structure of a semiconductor device, according to an embodiment of the present disclosure. FIG. 3A is a plan view of the insulating level I_LV. FIG. 3B is a plan view of the conductive level C_LV. FIG. 3C is a B-B' cross-sectional view. In addition, FIGS. 3D and 3E are perspective views, illustrating structures of channel patterns 14A to 14C and first, second and third memory patterns MPA, MPB and MPC. Hereinafter, the description of certain elements that are discussed above is omitted for the sake of brevity.

Referring to FIGS. 3A to 3E, a semiconductor device may include the stacked structure ST, the channel structure CH, and first to third insulators 18A' to 18C'. In addition, the semiconductor device may further include insulating patterns 17, the source contact structure SCT, or the base 10.

The stacked structure ST may include the conductive layers 11 and the insulating layers 12 that are stacked alternately with each other. The channel structure CH may include the channel patterns 14A to 14C and may further include the insulating pillar 15 or the memory patterns MPA to MPC.

The channel patterns 14A to 14C may surround a sidewall of the insulating pillar 15. The memory patterns MPA to MPC may surround the channel patterns 14A to 14C, respectively. More specifically, the first memory pattern MPA may surround the first channel pattern 14A, the second memory pattern MPB may surround the second channel pattern 14B, and the third memory pattern MPC may surround the third channel pattern 14C. The memory patterns MPA to MPC may be separated from each other in a horizontal direction.

The width between the memory patterns MPA to MPC may be substantially the same as or different from the width between the channel patterns 14A to 14C. Referring to FIG. 3D, the width between the memory patterns MPA to MPC may be substantially the same as the width between the channel patterns 14A to 14C. Referring to FIG. 3E, the width between the memory patterns MPA to MPC may be greater than the width between the channel patterns 14A to 14C. In FIG. 3E, the channel patterns 14A to 14C may be exposed between the memory patterns MPA to MPC.

The first to third insulators 18A' to 18C' may be located in the conductive level C_LV. The first to third insulators 18A' to 18C' may be located between the insulating pillar 15 and the conductive layers 11. The first to third insulators 18A' to 18C' may include an insulating material or may include air gaps.

In the conductive level C_LV, the first insulator 18A' may be located between the first channel pattern 14A and the second channel pattern 14B and between the first memory pattern MPA and the second memory pattern MPB. The second insulator 18B' may be located between the second channel pattern 14B and the third channel pattern 14C and between the second memory pattern MPB and the third memory pattern MPC. In addition, the third insulator 18C' may be located between the third channel pattern 14C and the first channel pattern 14A and between the third memory pattern MPC and the first memory pattern MPA.

Each of the insulating patterns 17 may include the first portion 17A that surrounds the sidewall of the source contact structure SCT and the second portions 17B that protrudes from the first portion 17A.

The second portion 17B may extend between the memory patterns MPA to MPC and the channel patterns 14A to 14C. Therefore, the channel patterns 14A to 14C that share the insulating pillar 15 may be separated from each other by the second portions 17B in the insulating level I_LV. The memory patterns MPA to MPC that share the insulating pillar 15 may be separated from each other by the second portions 17B in the insulating level I_LV.

In addition, the insulators 18A' to 18C' may be located between the second portions 17B that are adjacent to each other in the third direction III. Therefore, the channel patterns 14A to 14C that share the insulating pillar 15 may be separated from each other by the insulators 18A' to 18C' in the conductive level C_LV. Therefore, the memory patterns MPA to MPC that share the insulating pillar 15 may be separated from each other by the insulators 18A' to 18C' in the conductive level C_LV.

According to the above-described structure, the memory patterns MPA to MPC of memory cells MC neighboring in the horizontal direction may be separated from each other. Therefore, data retention characteristics may be improved.

Figure 4:
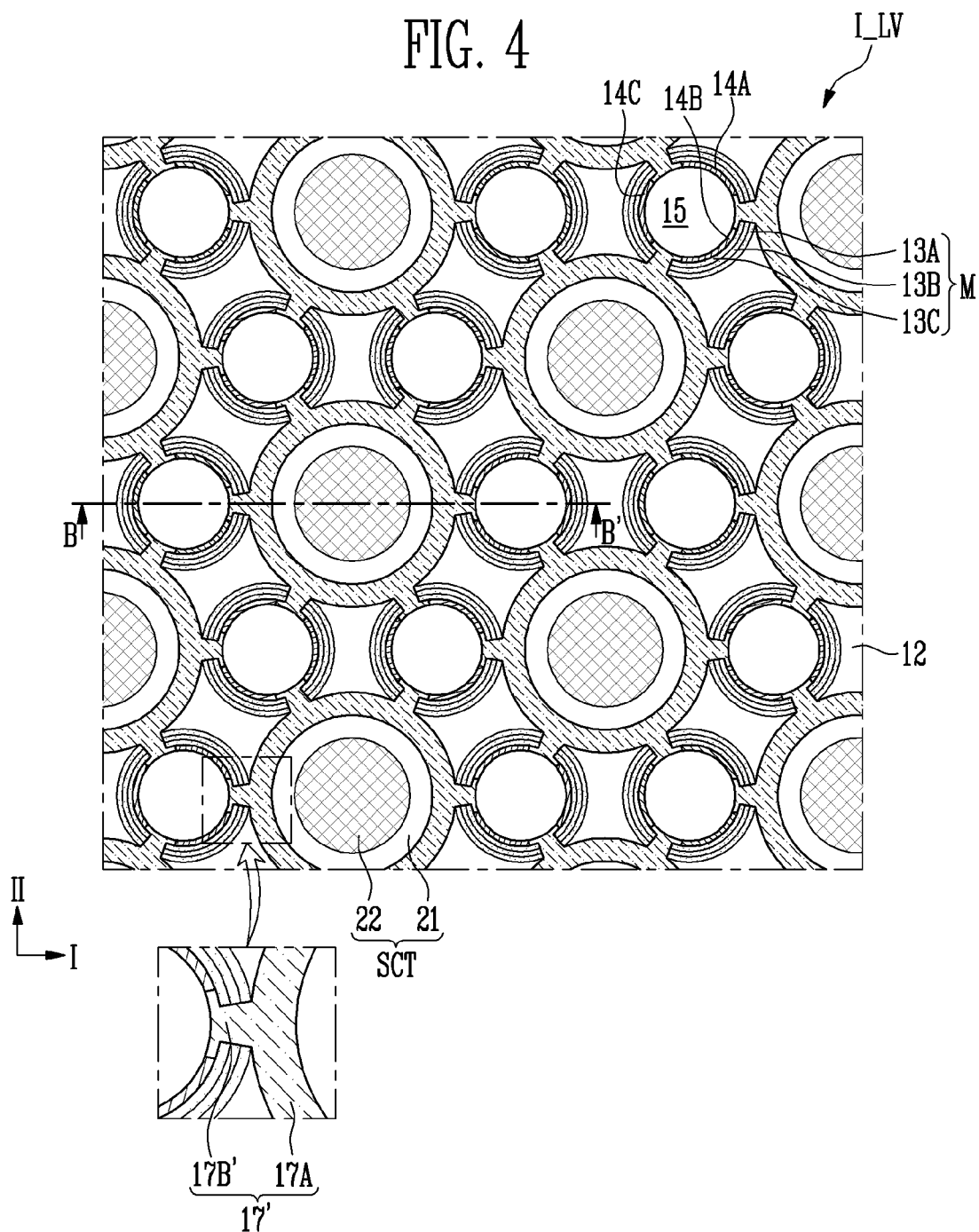
FIG. 4 is a diagram, illustrating the structure of a semiconductor device, according to an embodiment of the present disclosure.

FIG. 4 is a diagram, illustrating the structure of a semiconductor device, according to an embodiment of the present disclosure. FIG. 4 may be a plan view of the insulating level I_LV. Hereinafter, description of certain elements that are discussed above is omitted for the sake of brevity.

Referring to FIG. 4, each of the insulating patterns 17' may include a first portion 17A and a second portions 17B'. The second portion 17B' may pass through the memory layer M and may extend between the channel patterns 14A to 14C. The width between the channel patterns 14A to 14C, neighboring each other in the horizontal direction, may be greater than the width of the opening of the memory layer M. Thus, in a planar view, the second portion 17B' may have a T shape.

Figure 5A:
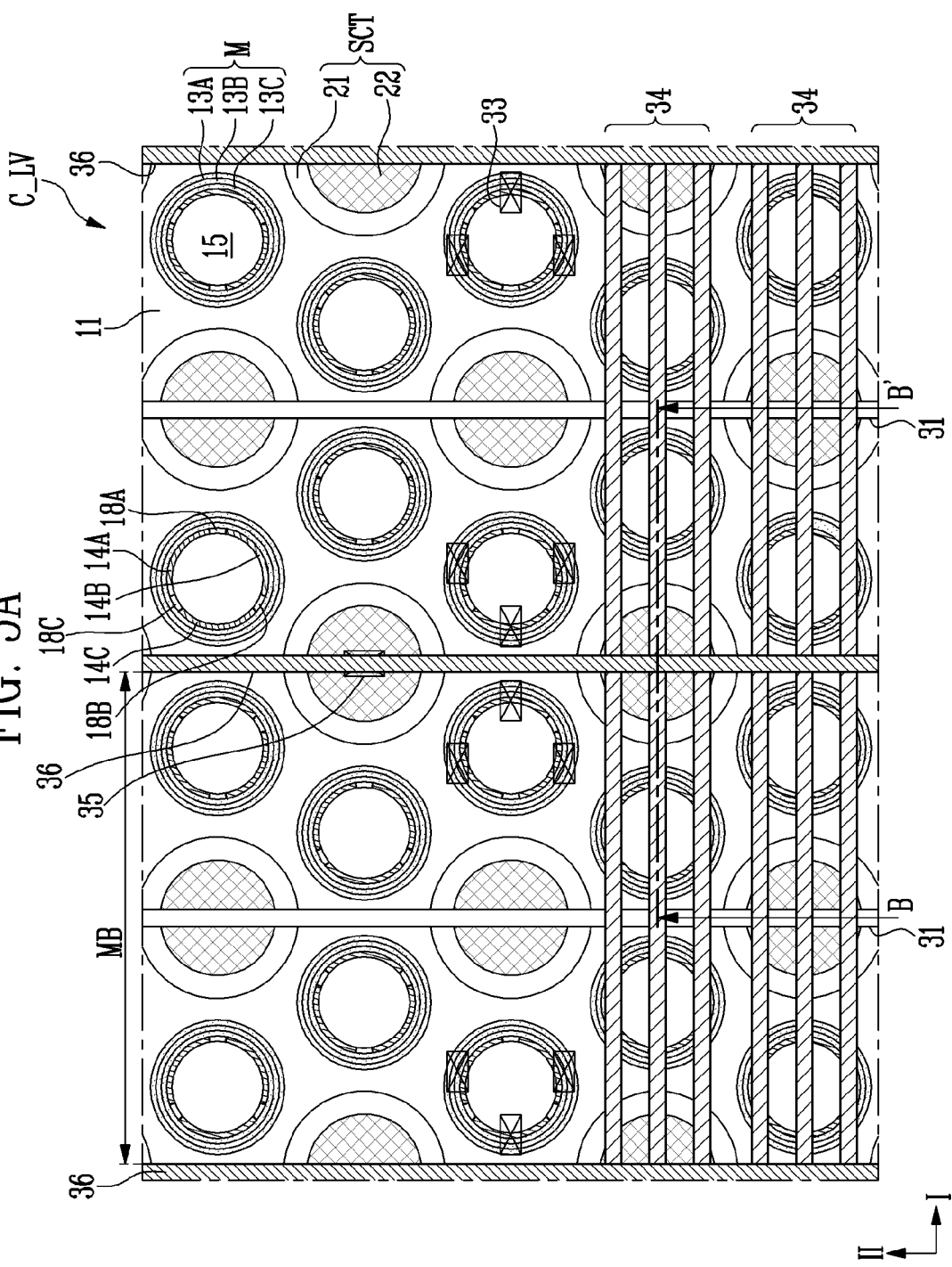
FIGS. 5A and 5B are diagrams, illustrating the structure of a semiconductor device, according to an embodiment of the present disclosure.
Figure 5B:
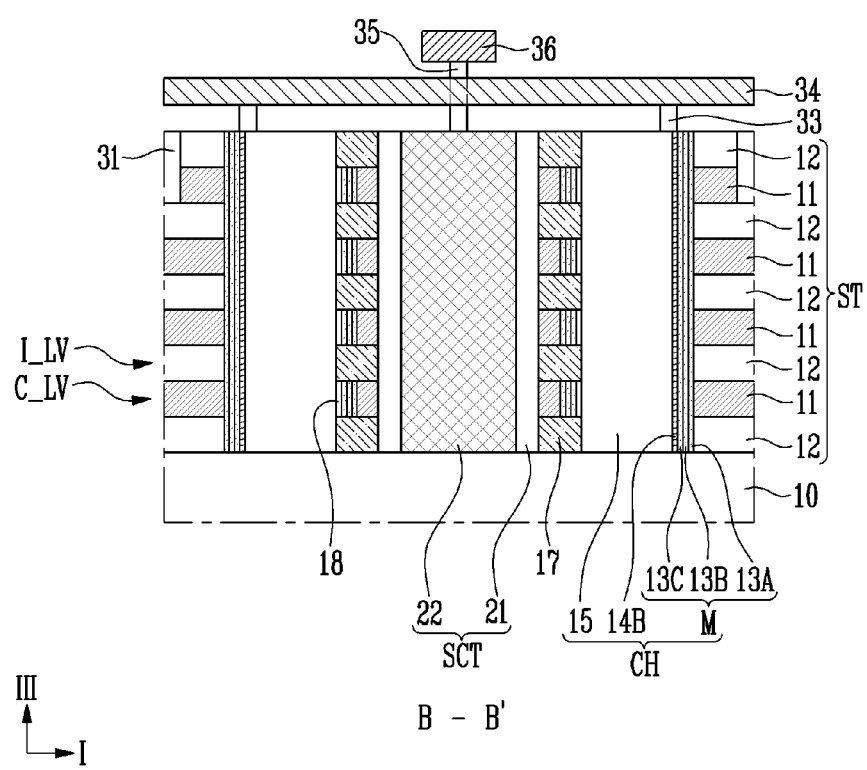

FIGS. 5A and 5B are diagrams, illustrating the structure of a semiconductor device, according to an embodiment of the present disclosure. FIG. 5B is a B-B' cross-sectional view of FIG. 5A. Hereinafter, the description of certain elements that are discussed above is omitted for the sake of brevity.

Referring to FIGS. 5A and 5B, the semiconductor device may include the stacked structure ST, the channel structure CH, an insulator 18, an insolation pattern 31, and an interconnection structure (33 to 36). In addition, the semiconductor device may further include the source contact structure SCT or the base 10.

The channel structure CH may include the channel patterns 14A to 14C and may further include the insulating pillar 15 or the memory layer M. The source contact structure SCT may include the source contact plug 22 and the insulating spacer 21.

The isolation pattern 31 may pass through a portion of the stacked structure ST. The isolation pattern 31 may be deep enough to pass through at least one uppermost conductive layer. At least one uppermost conductive layer may be a select line. As a result, a select line and a word line may be patterned into different shapes. The isolation pattern 31 may overlap the source contact structure SCT. The isolation pattern 31 may extend in the second direction II and may pass through the source contact structures SCT that is adjacent to each other in the second direction II.

The interconnection structure (33 to 36) may be electrically coupled to the channel structures CH or the source contact structure SCT. The interconnection structure (33 to 36) may include a contact plug, wires, and the like. The contact plug and the wires may be located in the insulating layer (not shown) and may be disposed at a plurality of levels.

First contact plugs 33 may be coupled to the channel patterns 14A to 14C, respectively. First wires 34 may be coupled to the channel patterns 14A to 14C through the first contact plugs 33. The first wires 34 may extend in the first direction I and may be commonly coupled to the channel patterns 14A to 14C that are adjacent to each other in the first direction I. According to an embodiment, one channel structure CH may be coupled to three first wires 34. The first wires 34 may be bit lines.

Second contact plugs 35 may be coupled to the source contact structures SCT. Second wires 36 may be coupled to the source contact structures SCT through the second contact plugs 35. Some of the first contact plugs 33 may be electrically coupled to the second contact plug 35, and the second wires 36 may be coupled to the source contact structure SCT through the first and second contact plugs 33 and 35. The second wires 36 may extend in the second direction II and may be commonly coupled to the source contact structures SCT that are adjacent to each other in the second direction II. The second wires 36 may apply a source voltage and may be disposed over the first wires 34.

The portion of the stacked structure ST that is located between adjacent second wires 36 in the first direction I may form a single memory block MB. The single memory block MB may include at least one isolation pattern 31. In addition, though not shown in FIGS. 5A and 5B, a slit insulating structure, passing through the stacked structure ST, may be located at a boundary between the memory blocks MB.

According to this embodiment as described above, the channel structure CH may include the memory layer M. However, the invention is not limited thereto. The channel structure CH may include memory patterns M' instead of the memory layer M as described above with reference to FIGS. 3A to 3E. In addition, for a better understanding of the present disclosure, only portions of the first contact plugs 33, the second contact plugs 35, and the first wires 34 are illustrated in FIG. 5A.

Figure 6A:
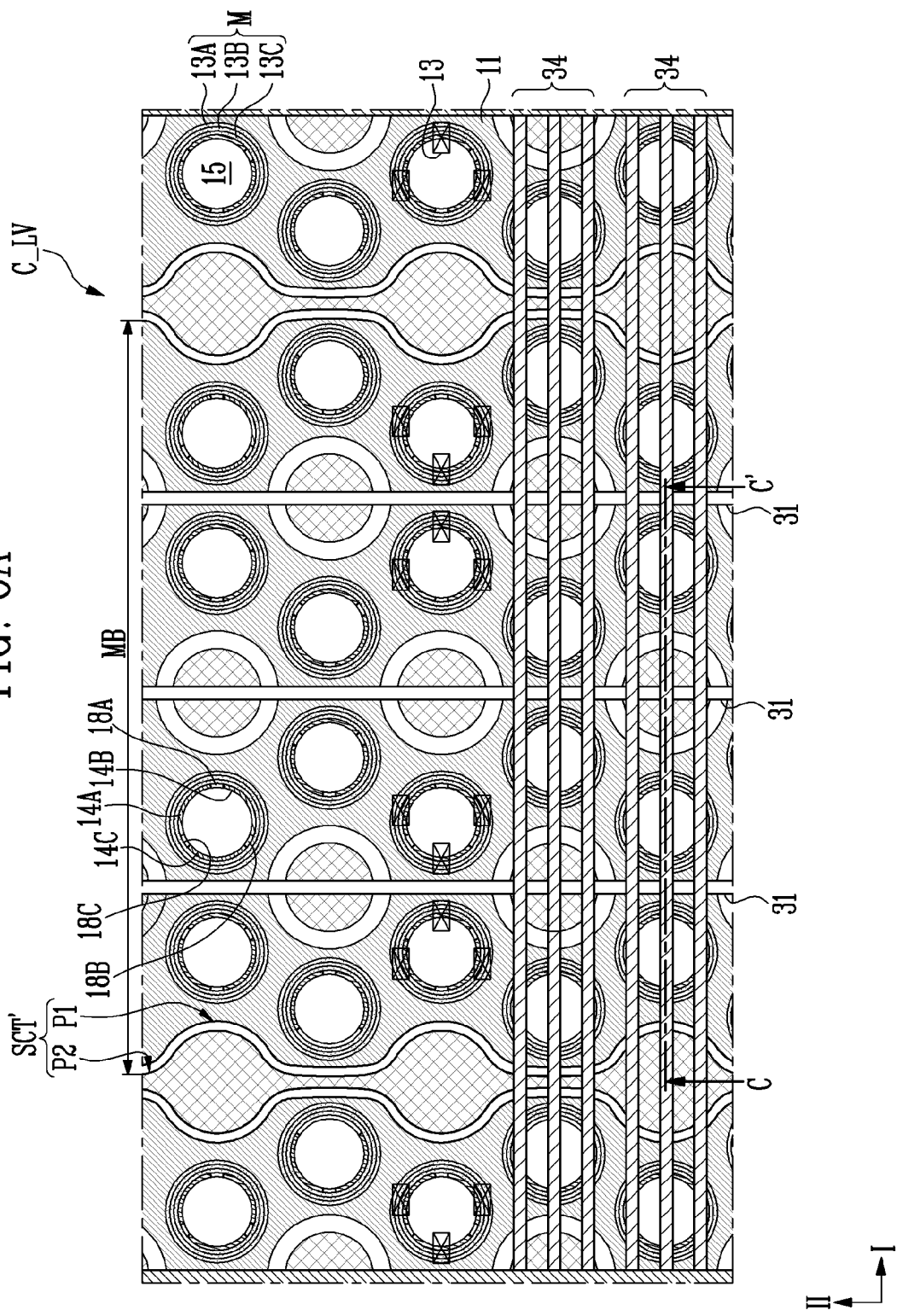
FIGS. 6A and 6B are diagrams, illustrating the structure of a semiconductor device, according to an embodiment of the present disclosure.
Figure 6B:
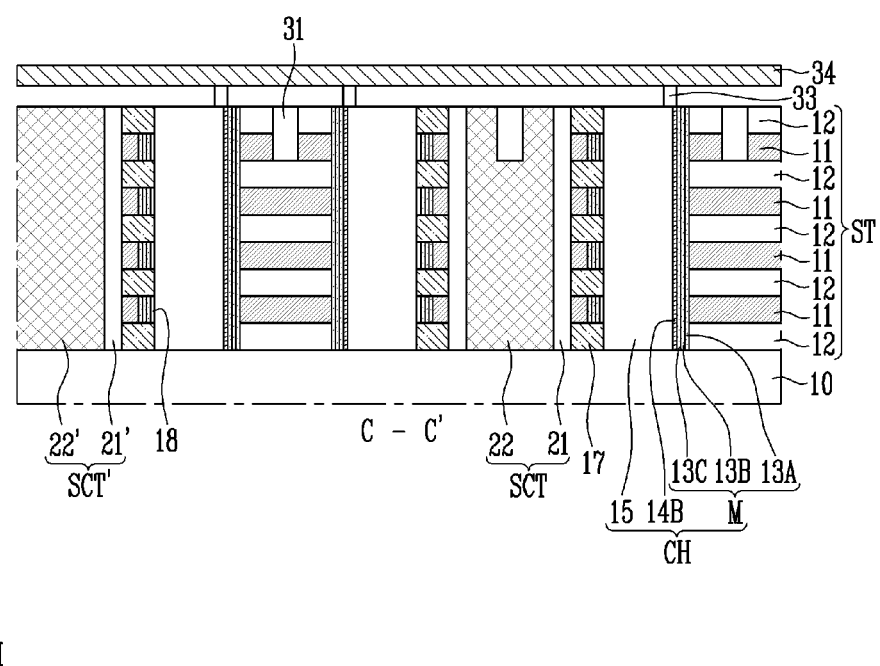

FIGS. 6A and 6B are diagrams, illustrating the structure of a semiconductor device, according to an embodiment of the present disclosure. FIG. 6B is a C-C' cross-sectional view of FIG. 6A. Hereinafter, description of certain elements that are discussed above is omitted for the sake of brevity.

Referring to FIGS. 6A and 6B, the semiconductor device may include the stacked structure ST, the channel structure CH, the insulator 18, the insolation pattern 31, and the interconnection structure (33 to 36). In addition, the semiconductor device may further include a source contact structure (SCT or SCT') or the base 10. The channel structure CH may include the channel patterns 14A to 14C and may further include the insulating pillar 15 or the memory layer M.

The source contact structure SCT may include the source contact plug 22 and the insulating spacer 21. The source contact structure SCT' may include a source contact plug 22' and an insulating spacer 21'. At least one of the source contact plug 22 or the source contact plug 22' may contact a source layer or a source region and may be electrically coupled to the source layer or the source region that is included in the base 10.

The source contact structure SCT' may pass through the stacked structure ST and may extend in the second direction II. The source contact structure SCT' may separate neighboring stacked structures ST in the first direction I. The source contact structure SCT' may have a width that is defined in the first direction I and a length that is defined in the second direction II. The width of the source contact structure SCT' may vary based on the area thereof. According to an embodiment, the source contact structure SCT' may include a first portion P1 with a relatively large width and a second portion P2 with a relatively small width. The source contact structure SCT' may include the first portions P1 and the second portions P2 that are arranged alternately with each other. The source contact plug 22' may be formed in only the first portion P1 or in both the first and second portions P1 and P2.

The stacked structure ST, located between the source contact structure SCT' that neighbor each other in the first direction I, may be a single memory block MB. The single memory block MB may include at least one isolation pattern 31.

According to the embodiment, the channel structure CH may include the memory layer M. However, the invention is not limited thereto. As described above with reference to FIGS. 3A to 3D, the channel structure CH may include memory patterns MPA, MPB, and MPC instead of the memory layer M. In addition, for a better understanding of the present disclosure, only portions of the first contact plugs 33 and the first wires 34 are illustrated in FIG. 6A.

Figure 7A:
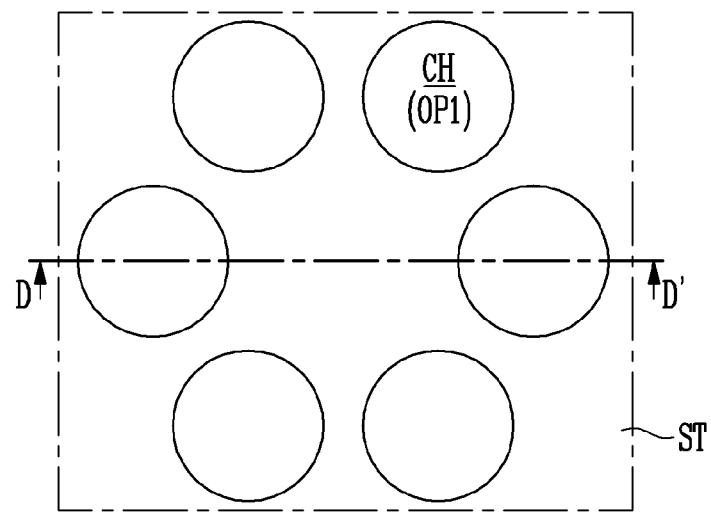
Figure 7B:
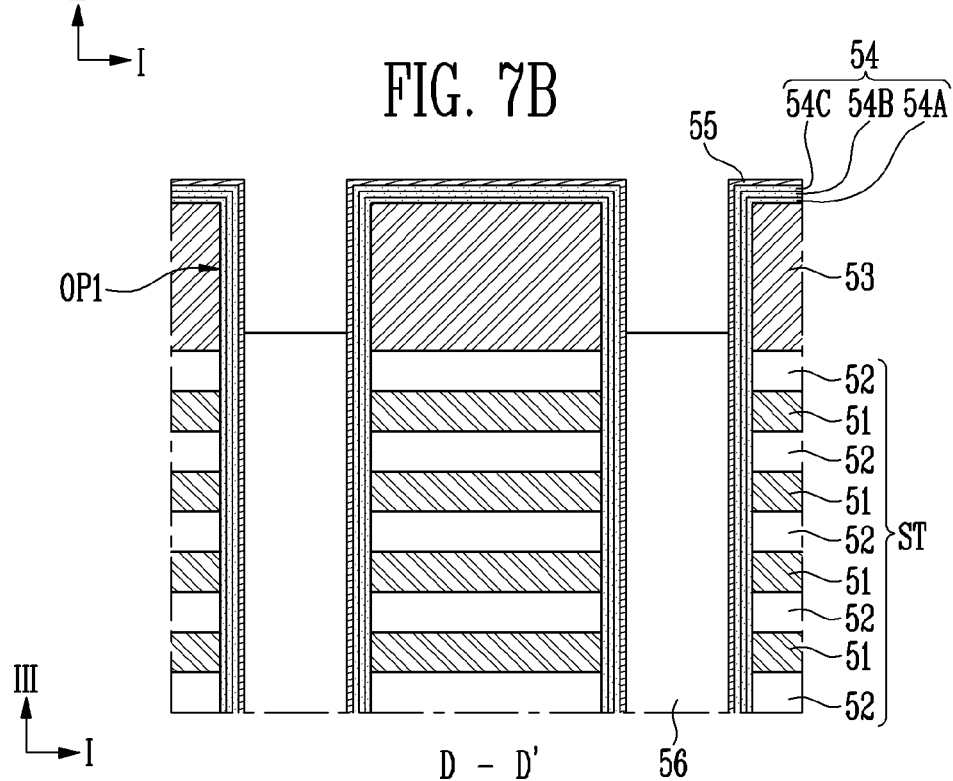
Figure 7C:
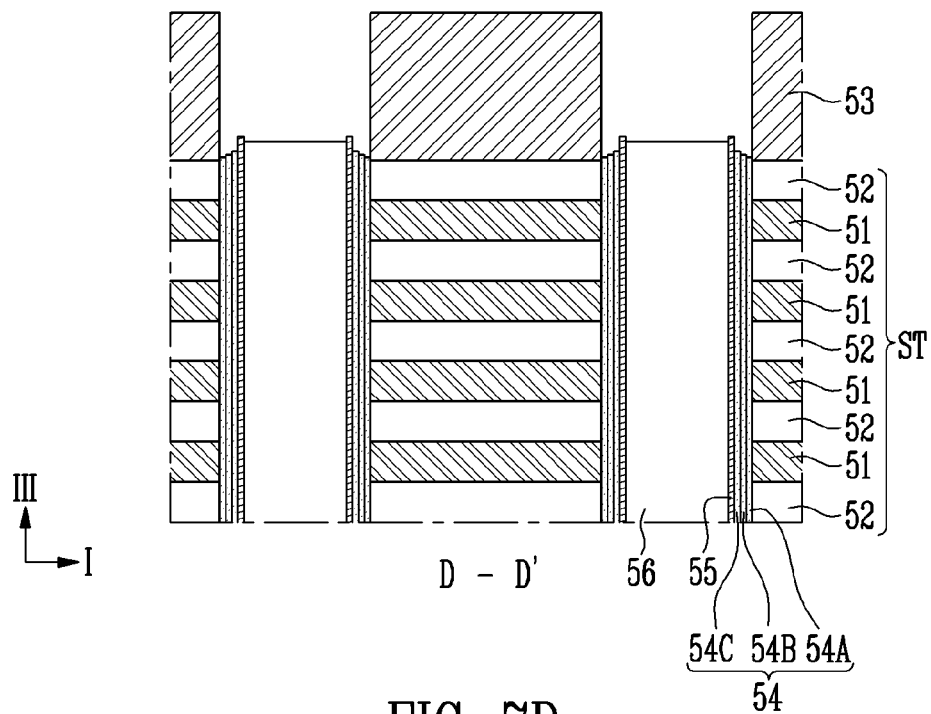
Figure 7D:
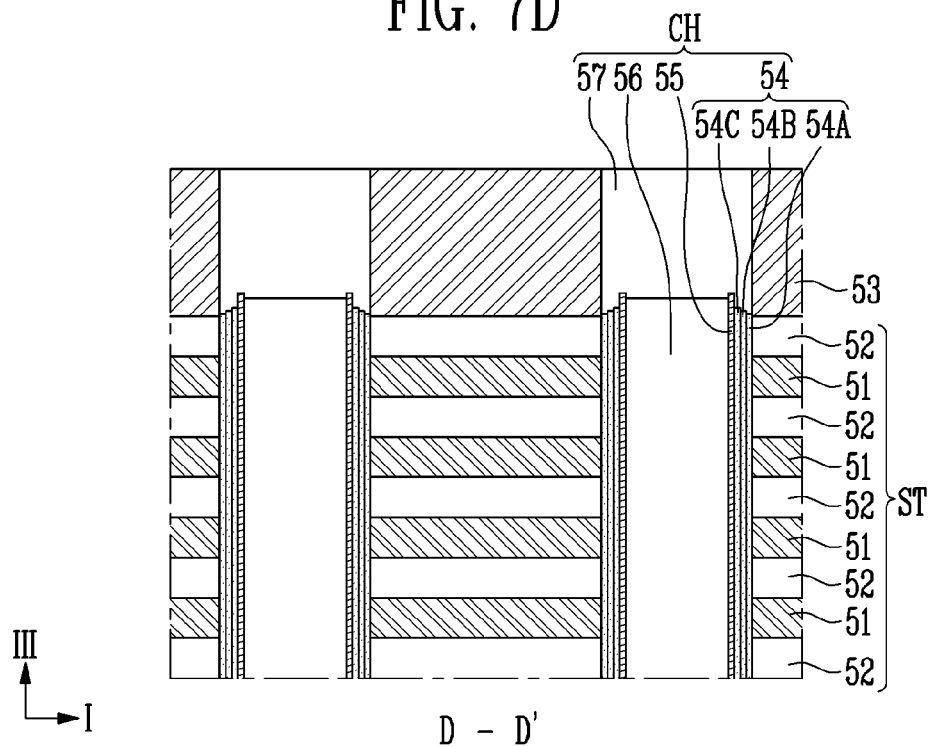
Figure 8A:
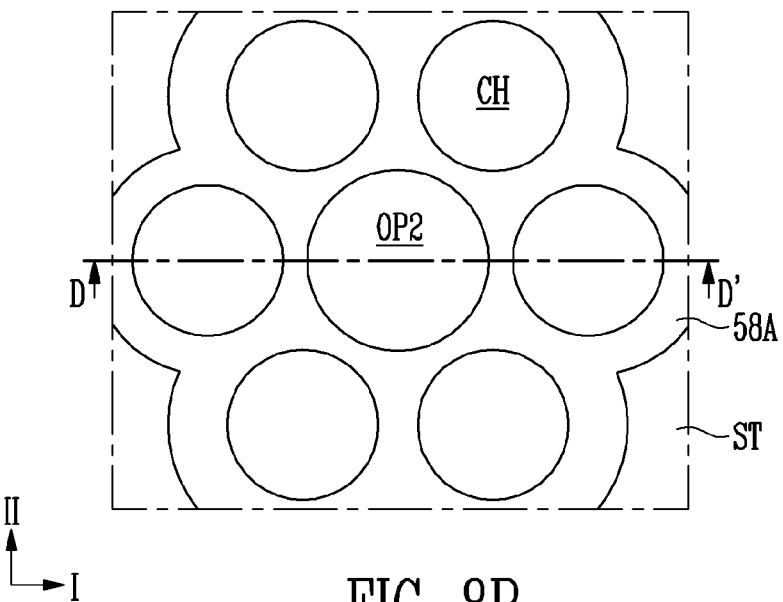
Figure 8B:
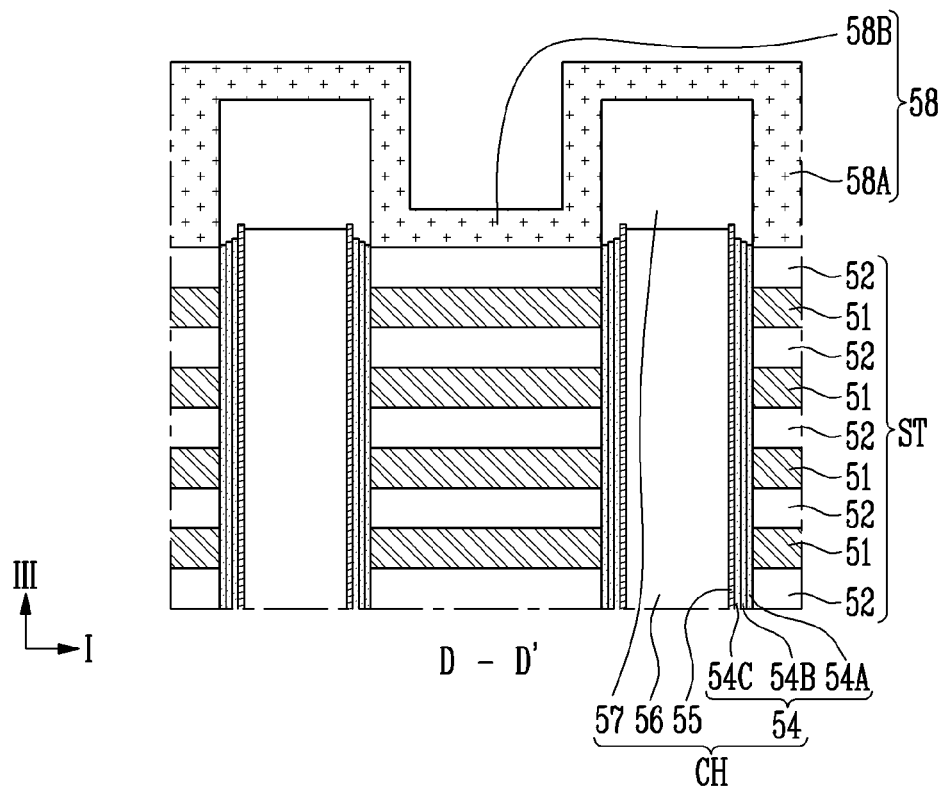

FIGS. 7A to 7D and FIGS. 8A to 8C are views, illustrating a method of manufacturing a semiconductor device according to an embodiment of the present disclosure. FIGS. 7A and 8A are plan views. FIGS. 7B, 7C and 7D are cross-sectional views that are taken along line D-D' of FIG. 7A. FIGS. 8B and 8C are cross-sectional views that are taken along line D-D' of FIG. 8A. Hereinafter, the description of certain elements that are discussed above is omitted for the sake of brevity.

Referring to FIGS. 7A to 7D, the stacked structure ST may be formed on a base (not shown). First openings OP1 may be formed through the stacked structure ST and the channel structures CH may be respectively formed in the first openings OP1. This manufacturing method is described below in more detail.

Referring to FIGS. 7A and 7B, the stacked structure ST may include first material layers 51 and second material layers 52. The first material layers 51 may include a material with a high etch selectivity with respect to the second material layers 52. For example, the first material layers 51 may include a sacrificial material, such as nitride, and the second material layers 52 may include an insulating material, such as oxide. For example, the first material layers 51 may include a conductive material, such as polysilicon, tungsten, or molybdenum, and the second material layers 52 may include an insulating material, such as oxide.

A mask pattern 53 may be formed on the stacked structure ST. The mask pattern 53 may include a material with a high etch selectivity with respect to the first material layers 51 and the second material layers 52. The mask pattern 53 may include a carbon layer, a nitride layer, or the like. According to an embodiment, the mask pattern 53 may include silicon carbon nitride (SiCN).

Subsequently, the first openings OP1 may be formed through the stacked structure ST. The first openings OP1 may be formed by etching the stacked structure ST by using the mask pattern 53 as an etch barrier. The first openings OP1 may be arranged in the form of regular polygons or circles and may be disposed at substantially regular intervals.

Subsequently, a memory layer 54 may be formed in the first openings OP1. The memory layer 54 may include at least one of a blocking layer 54A, a data storage layer 54B, and a tunnel insulating layer 54C. The memory layer 54 may be formed in the first openings OP1 and may be disposed over the stacked structure ST. Subsequently, a channel layer 55 may be formed in the memory layer 54. The channel layer 55 may be conformally formed along the surface of the memory layer 54.

Subsequently, insulating pillars 56 may be respectively formed in the first openings OP1. The insulating pillars 56 may include an insulating material, such as oxide. First, after a gap-filling material is formed to fill the first openings OP1, the gap-filling material may be partially removed to form the insulating pillars 56. According to an embodiment, the insulating pillars 56 may be formed by etching the gap-filling material through a planarizing process or an etch process. The planarizing process may be a chemical mechanical polishing (CMP) process. The etch process may be a wet etch process or a dry etch process.

Referring to FIGS. 7A and 7C, the channel layer 55 and the memory layer 54 that are exposed through the insulating pillars 56 may be etched. The channel layer 55, the tunnel insulating layer 54C, the data storage layer 54B, and the blocking layer 54A may be etched in a sequential manner. As a result, top portions of the first openings OP1 may be re-opened.

Upper surfaces of the channel layer 55 and the memory layer 54 may be exposed through the first openings OP1. Upper surfaces of the insulating pillar 56, the channel layer 55, the tunnel insulating layer 54C, the data storage layer 54B and the blocking layer 54A may be located at substantially the same level or at different levels. The channel layer 55 may protrude farther than the insulating pillar 56 and the memory layer 54. The upper surface of the memory layer 54 may have a stepped shape. The upper surface of the tunnel insulating layer 54C may protrude farther than the upper surface of the data storage layer 54B, and the upper surface of the data storage layer 54B may protrude farther than the blocking layer 54A. The upper surface of the blocking layer 54A may be higher than the upper surface of the stacked structure ST in order to avoid exposing the stacked structure ST. According to an embodiment, the upper surface of the blocking layer 54A may be higher than an upper surface of the second material layer 52.

Referring to FIGS. 7A and 7D, conductive pads 57 may be formed in the first openings OP1. After a conductive material is formed to fill the first openings OP1, the conductive material may be planarized to form the conductive pads 57. The conductive pads 57 may include a conductive material, such as polysilicon. As a result, the channel structures CH with the channel layer 55 may be formed. Each of the channel structures CH may include the insulating pillar 56, the channel layer 55 surrounding a sidewall of the insulating pillar 56, the memory layer 54 surrounding the channel layer 55, and the conductive pad 57.

Referring to FIGS. 8A to 8C, a second opening OP2 may be formed through the stacked structure ST and may be located between the channel structures CH, which will be described below in more detail.

Referring to FIGS. 8A and 8B, the mask pattern 53 may be removed. As a result, an upper portion of the channel structure CH may be exposed and the channel structure CH may protrude farther than an upper surface of the stacked structure ST. Subsequently, a spacer material 58 may be formed. The spacer material 58 may be conformally formed on the upper surface of the stacked structure ST and the protruding upper portion of the channel structure CH. The spacer material 58 may include a first portion 58A that is formed along the sidewall of the channel structure CH and a second portion 58B that is formed on the upper surface of the stacked structure ST or the upper surface of the channel structure CH. The spacer material 58 may include a material with a high etch selectivity with respect to the first material layers 51 and the second material layers 52. The spacer material 58 may include polysilicon.

Referring to FIGS. 8A and 8C, the spacer material 58 may be etched. As a result, the second portion 58B may be removed from the spacer material 58 and the first portion 58A may remain in the form of a spacer on the sidewalls of the channel structures CH. Hereinafter, the remaining first portion is referred to as a spacer 58A. The spacer material 58 may expose a portion of the upper surface of the stacked structure ST which corresponds to the center of the channel structures CH.

The second opening OP2 may be formed by etching the stacked structure ST by using the conductive pad 57 and the spacer 58A as an etch barrier. In a planar view, the second opening OP2 may be located at the center of the channel structures CH. However, the plane shape of the second opening OP2 may vary based on the number and arrangement of neighboring channel structures CH. In a planar view, the second opening OP2 may have a shape, such as a circle, a rectangle, a hexagon, or a polygon.

According to the above-described manufacturing method, the position of the second opening OP2 may be defined by the spacer 58A. Therefore, the second opening OP2 may be formed through self-alignment without using a separate mask pattern. According to an embodiment, the second openings OP2 may serve as a path for patterning the channel structure CH or for replacing the first material layers 51 with conductive layers. In addition, though not shown, a source contact structure may be formed in the second openings OP2.

FIGS. 9A and 9B, FIGS. 10A to 10C, FIGS. 11A to 11C, FIGS. 12A to 12C, FIGS. 13A to 13D, and FIGS. 14A to 14D are diagrams, illustrating a manufacturing method of a semiconductor device, according to an embodiment of the present disclosure. In the drawings, cross-sectional views show E-E' cross-sections. Hereinafter, description of certain elements that are discussed above is omitted for the sake of brevity.

Figure 9A:
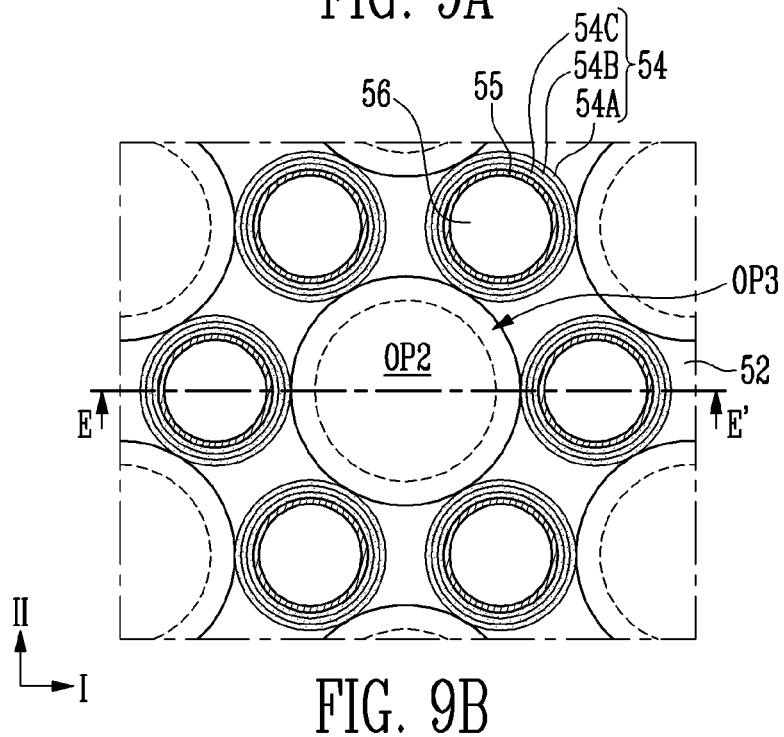
Figure 9B:
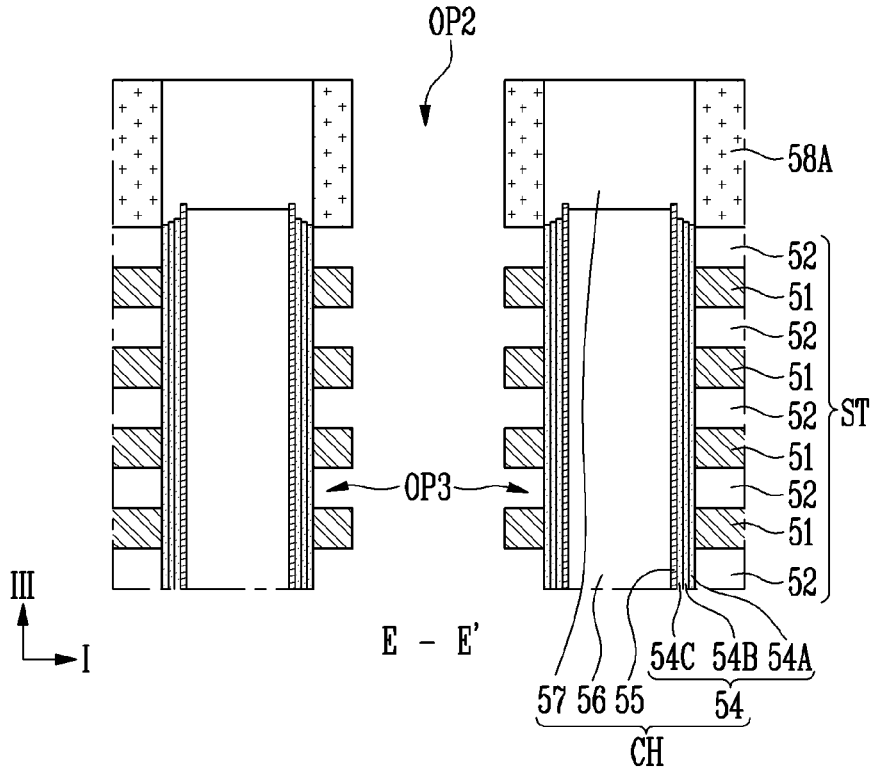

Referring to FIGS. 9A and 9B, the stacked structure ST may include the first material layers 51 and the second material layers 52 that are stacked alternately with each other. The channel structures CH may be formed through the stacked structure ST. The second openings OP2 may be formed between the channel structures CH. According to an embodiment, the second openings OP2 may be formed in the self-aligning manner as described above with reference to FIGS. 7A to 8C. However, the second openings OP2 may also be formed by an etch process that uses a mask pattern.

Third openings OP3 may be formed by etching the second material layers 52 through the second openings OP2. Since the second material layers 52 are selectively etched, the width of the second opening OP2 may be extended only in levels that correspond to the second material layers 52, and the third openings OP3 may be formed at the widened portions of the second opening OP2. As the second material layers 52 are etched, the third openings OP3 may extend in a horizontal direction. Therefore, the third openings OP3 may have contact points that contact the channel structures CH that is adjacent to the second opening OP2. In addition, the channel structures CH may be exposed through the contact points.

Figure 10A:
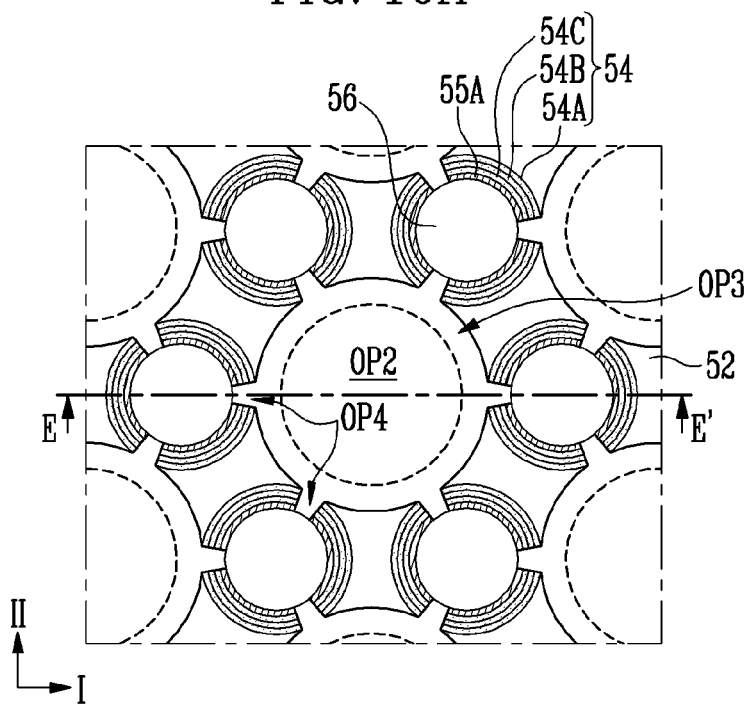
Figure 10B:
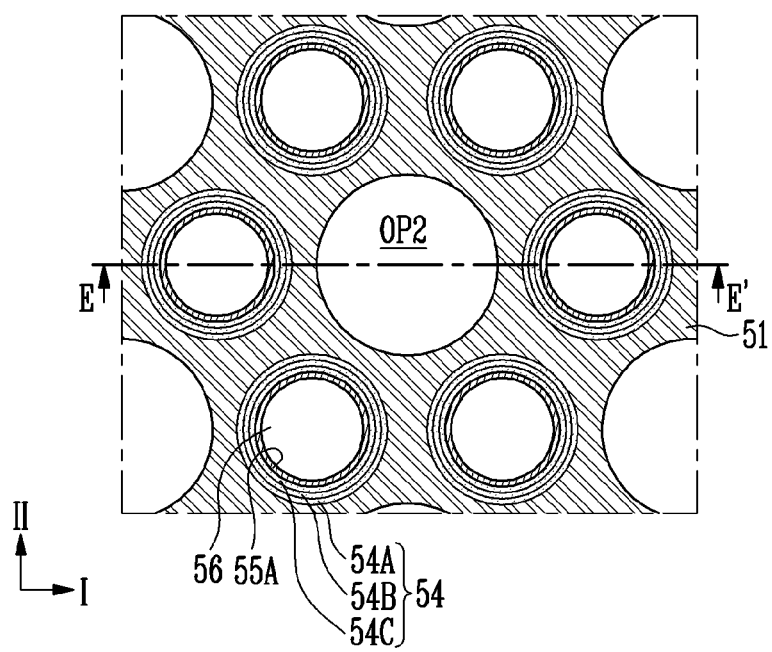
Figure 10C:
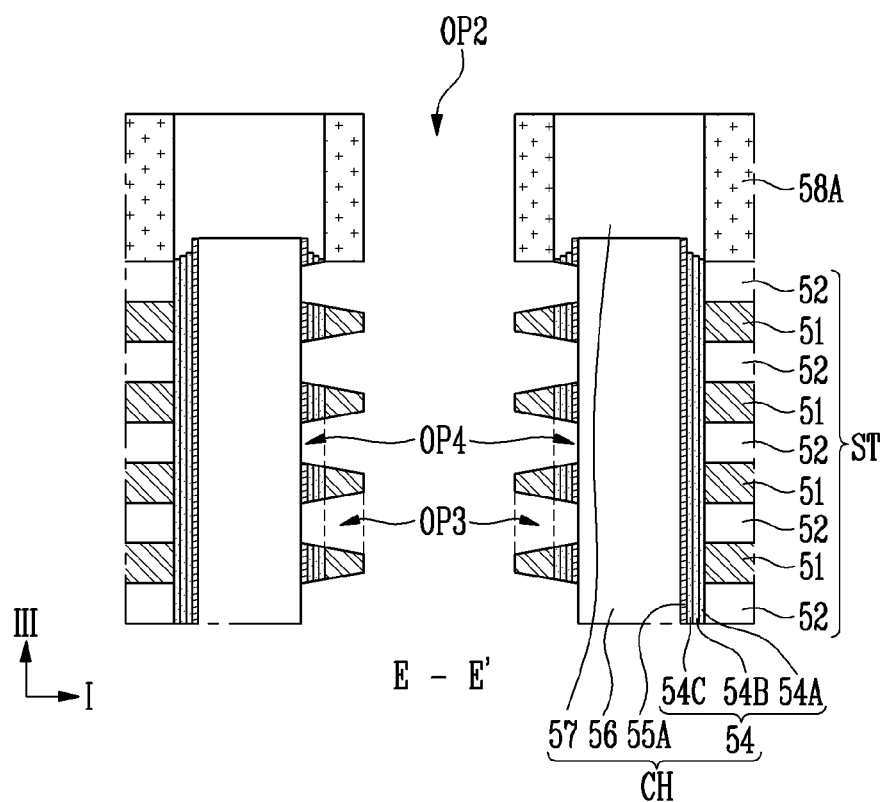

Referring to FIGS. 10A to 10C, the channel structure CH may be etched through the third openings OP3. After the memory layer 54 is etched through the contact points, the channel layer 55 may be etched. As a result, fourth openings OP4 may be formed through the memory layer 54 and the channel layer 55. The fourth openings OP4 may be located at only levels that correspond to the second material layers 52. When the memory layer 54 and the channel layer 55 are etched, the first material layers 51 may be partially etched and the width of the third opening OP3 in the third direction III may be extended.

Figure 11A:
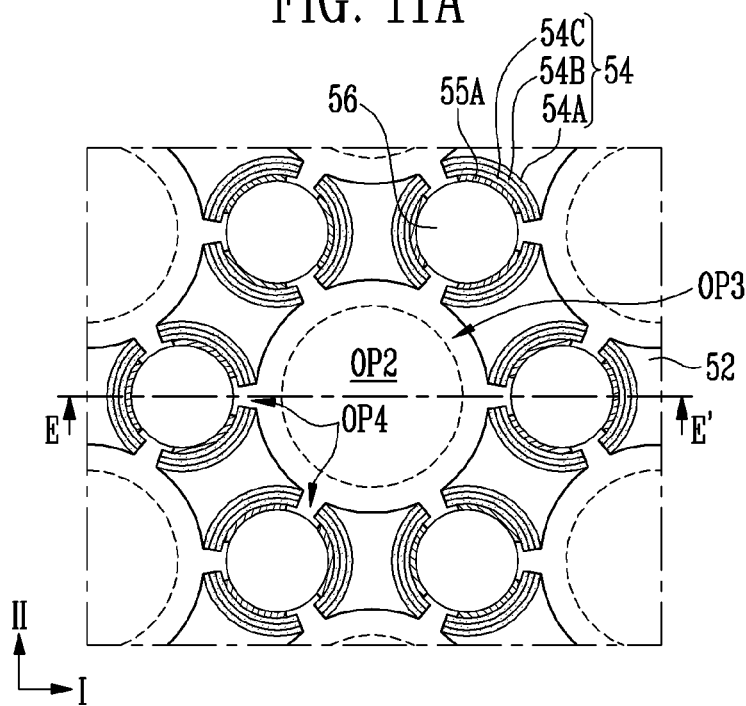
Figure 11B:
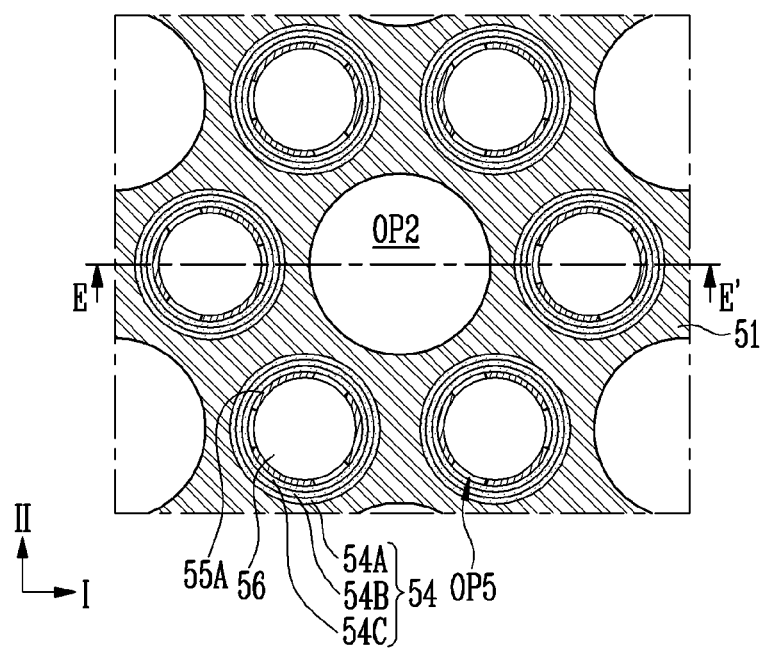
Figure 11C:
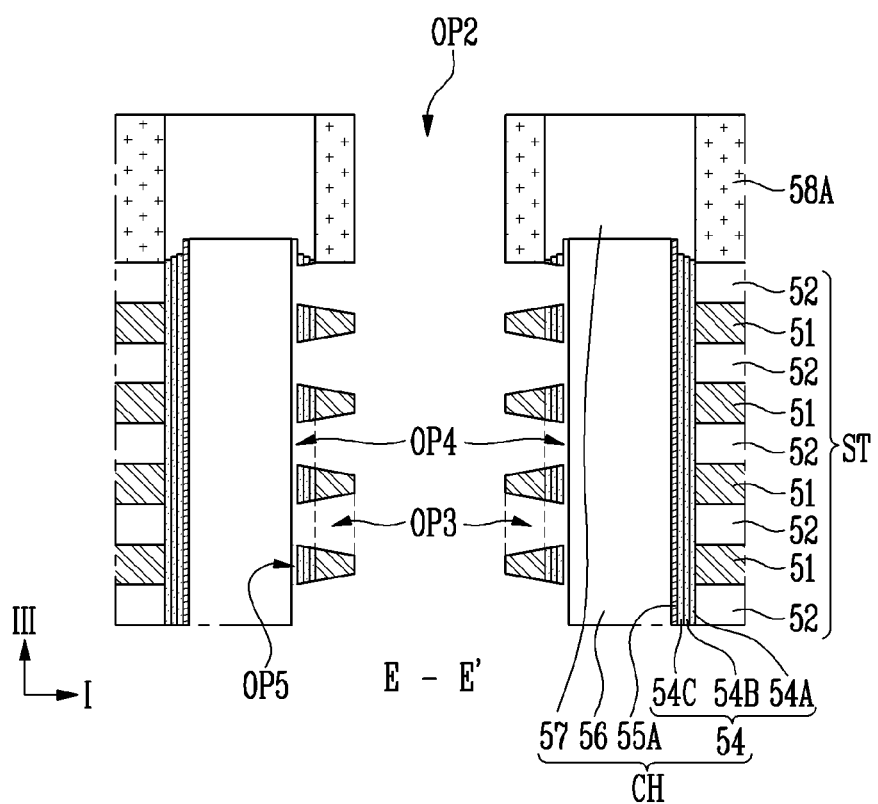

Referring to FIGS. 11A to 11C, the channel layer 55 may be selectively etched through the fourth openings OP4. As a result, the fourth openings OP4 may extend in the third direction III and fifth openings OP5 may be formed in the region from which the channel layer 55 is etched. The fifth openings OP5 may be located at only levels that correspond to the first material layers 51. The fourth openings OP4 adjacent to each other in the third direction III may be coupled to each other through the fifth openings OP5. In addition, the channel layer 55 may be separated into channel patterns 55A by the fourth openings OP4 and the fifth openings OP5.

The channel layer 55 may be selectively etched. More specifically, the channel layer 55 exposed through the fourth openings OP4 may be etched in the horizontal direction and the fourth openings OP4 may extend in the horizontal direction. Thus, the fourth openings OP4 may have a T-shaped plane at levels that correspond to the second material layers 52.

Figure 12A:
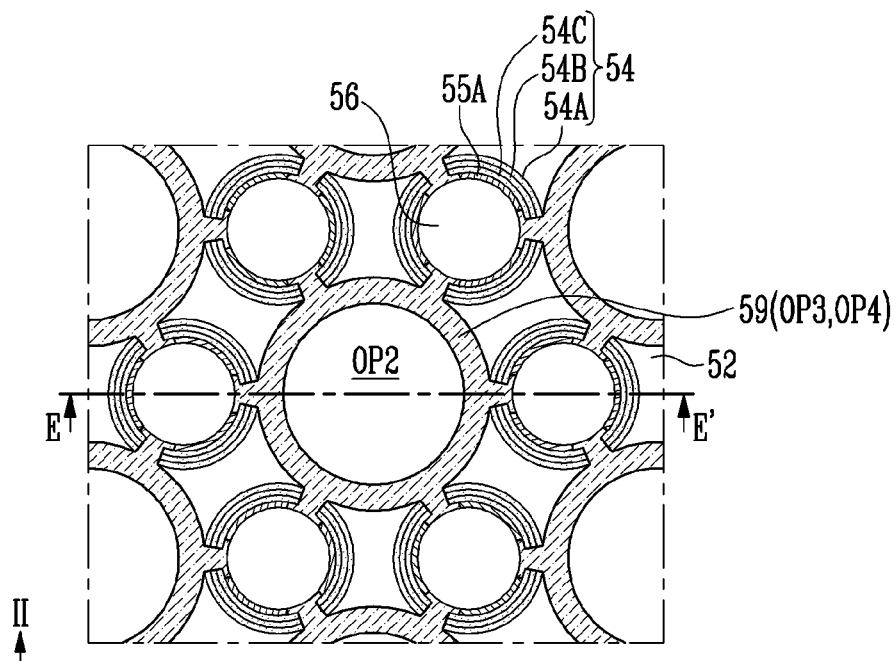
Figure 12B:
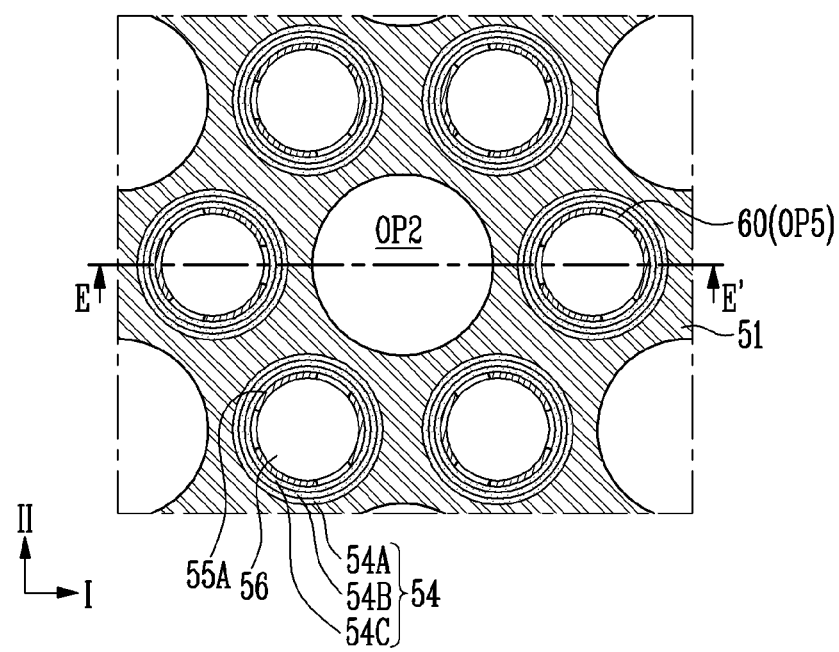
Figure 12C:
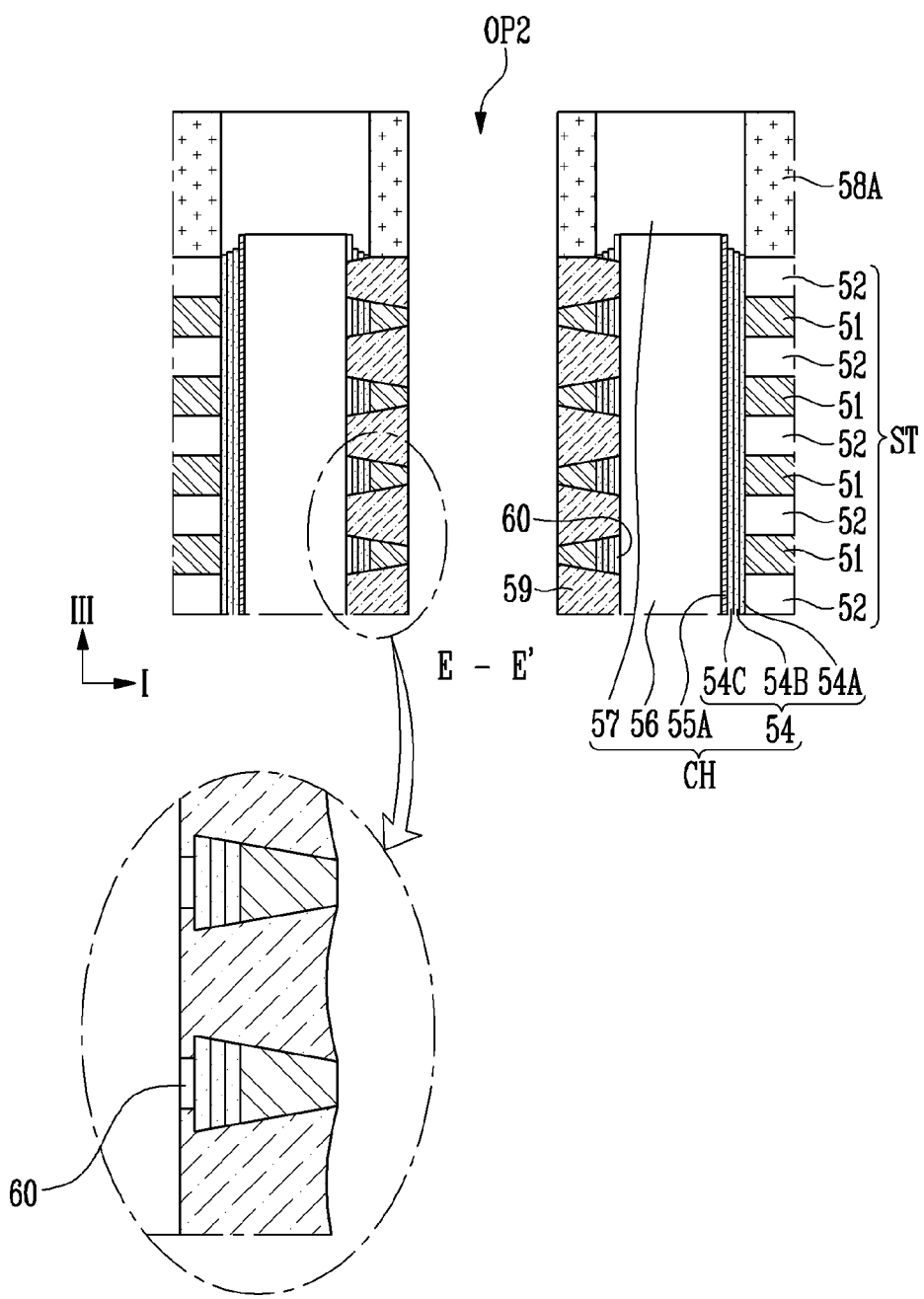

Referring to FIGS. 12A to 12C, insulating patterns 59 may be formed. After an insulating material is deposited, the insulating material in the second opening OP2 may be etched to form the insulating patterns 59. The insulating material may be deposited through a method, such as atomic layer deposition (ALD). The insulating material may be etched by dry etching or wet etching. When the insulating material is etched by dry etching, the insulating patterns 59 may have flat sidewalls. When the insulating material is etched by wet etching, the insulating patterns 59 may have concave sidewalls.

The insulating patterns 59 may be formed in the third openings OP3 and the fourth openings OP4. Alternatively, the insulating patterns 59 may be formed in the third openings OP3, and air gaps in the fourth openings OP4 may be sealed by the insulating patterns 59. The insulating patterns 59 may include an insulating material, such as oxide or nitride.

Insulators 60 may be formed in the fifth openings OP5. According to an embodiment, air gaps in the fifth openings OP5 may be sealed by the insulating patterns 59, and the insulators 60 may be air gaps. According to an embodiment, the insulating patterns 59 may extend into the fifth openings OP5, and the insulators 60 may be insulating layers with oxide or nitride.

Referring to FIGS. 13A to 13D, the first material layers 51 may be replaced with conductive layers 61, which is described below in more detail.

Figure 13A:
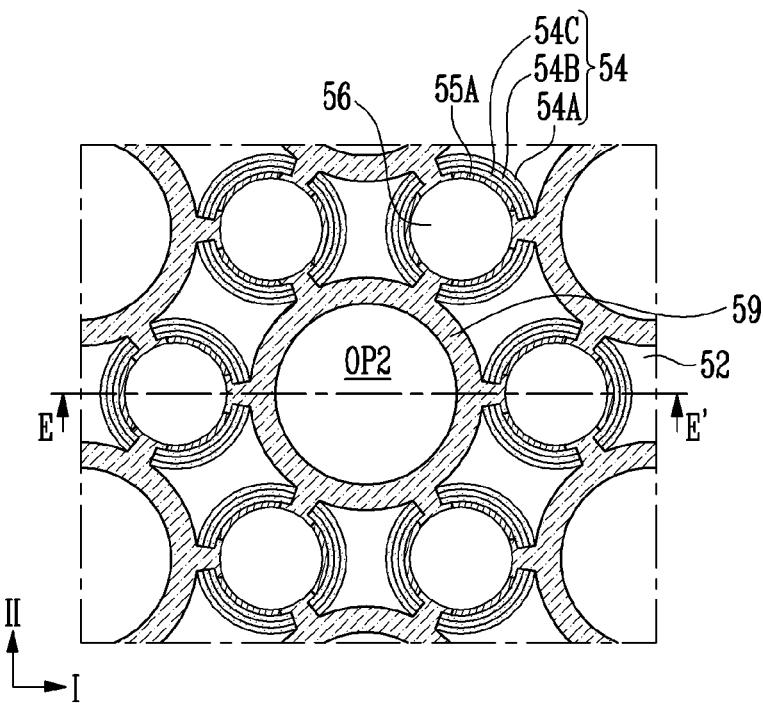
Figure 13B:
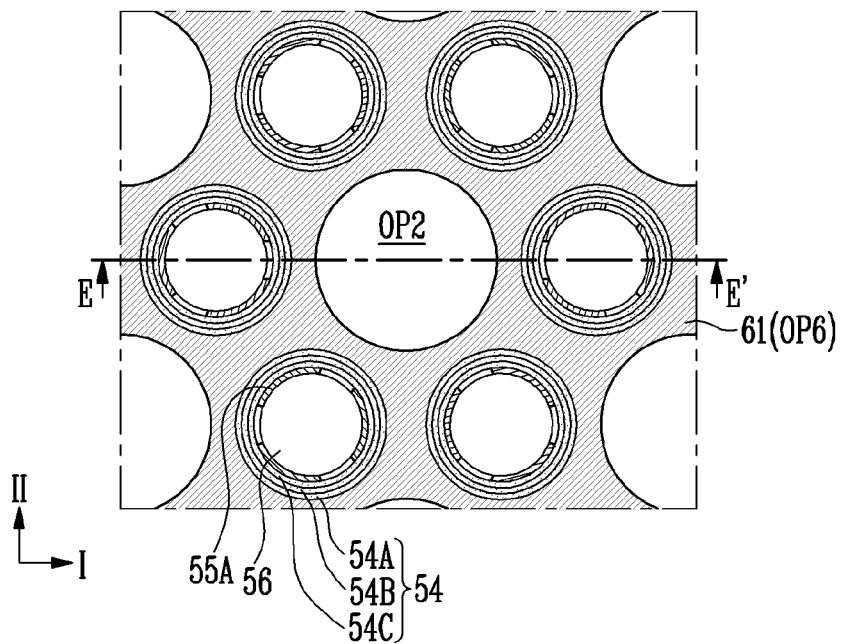
Figure 13C:
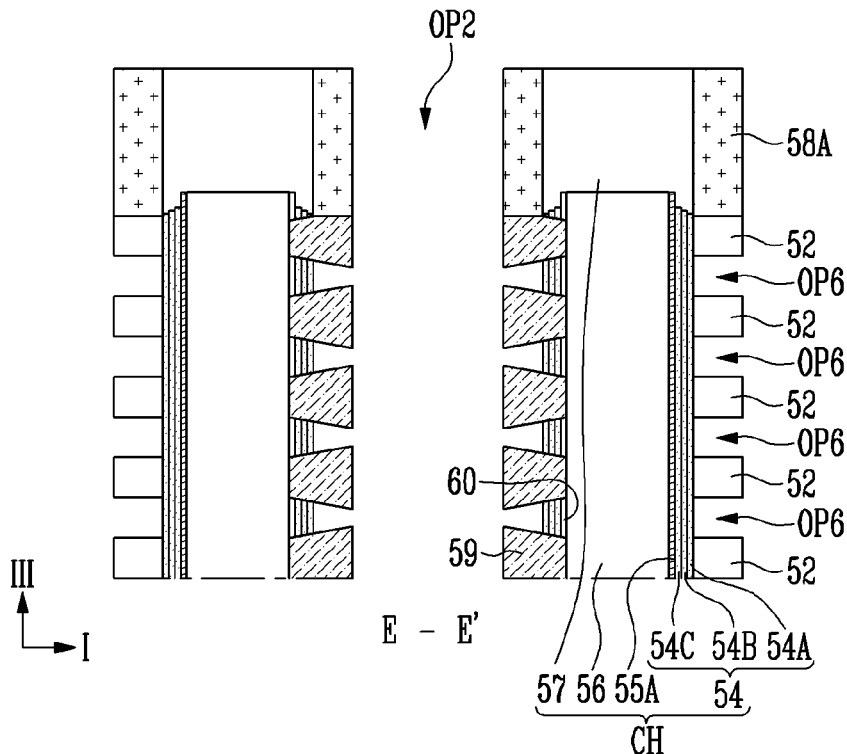
Figure 13D:
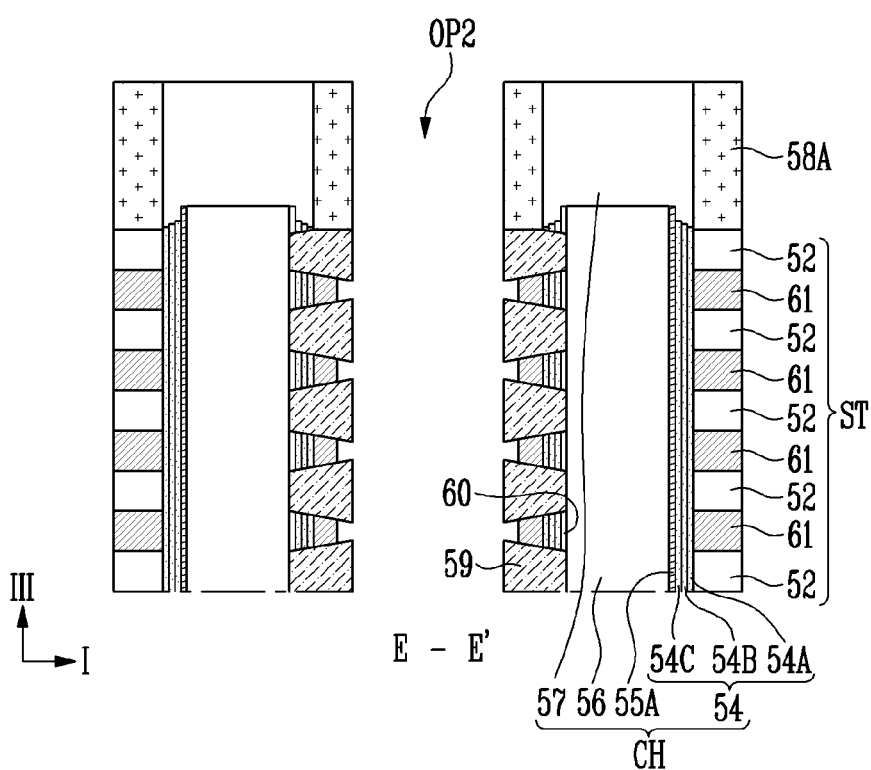

Referring to FIGS. 13A, 13B, and 13C, sixth openings OP6 may be formed by removing the first material layers 51 through the second opening OP2. Referring to FIGS. 13A, 13B and 13D, the conductive layers 61 may be formed in the sixth openings OP6. After a conductive material is deposited to fill the sixth openings OP6, the conductive material in the second opening OP2 may be etched to form the conductive layers 61. More specifically, the conductive material that is deposited onto portions of the sixth openings OP6, which are adjacent to the second opening OP2, may be etched. As a result, the portions of the sixth openings OP6 that are adjacent to the second opening OP2 may be re-opened. The conductive layers 61 may include a metal, such as tungsten or molybdenum.

Referring to FIGS. 14A to 14D, the source contact structure SCT may be formed in the second opening OP2, which is described below in more detail.

Figure 14A:
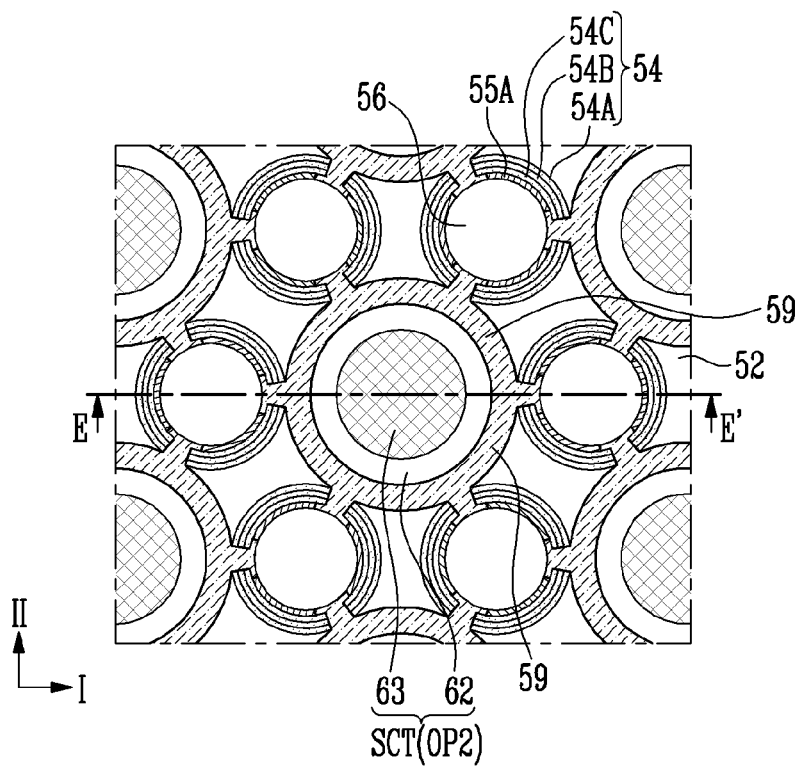
Figure 14B:
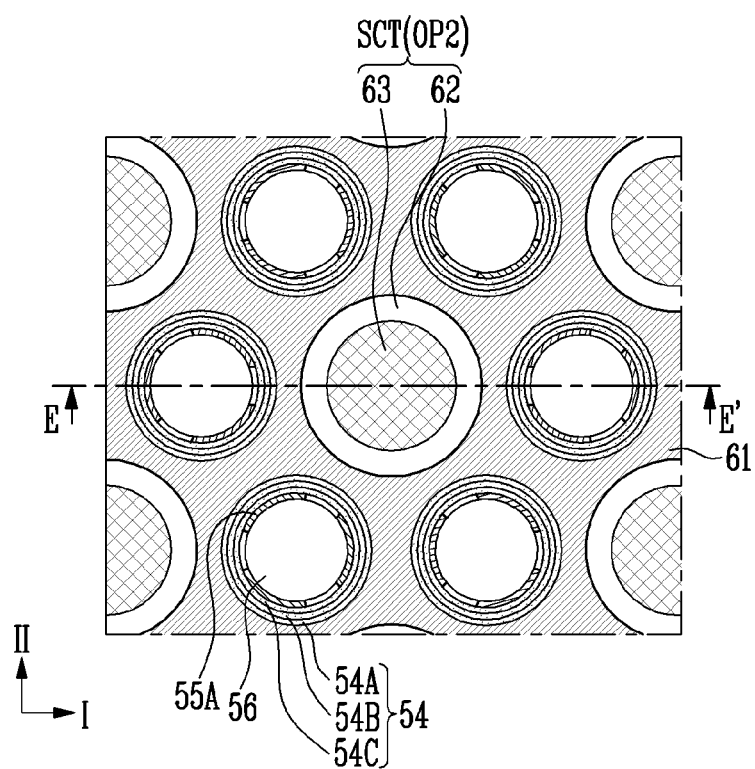
Figure 14C:
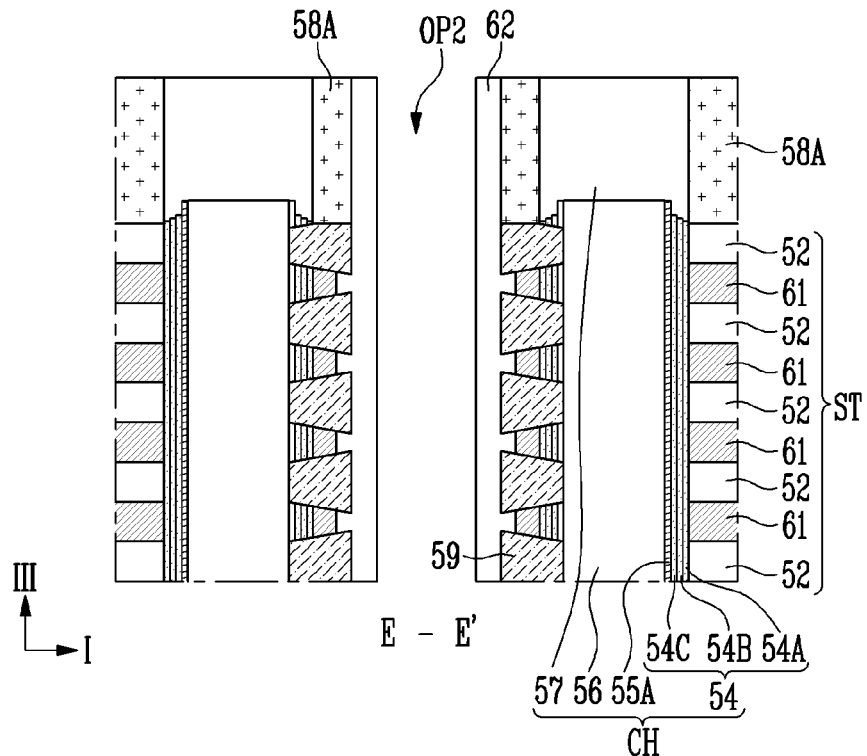

Referring to FIGS. 14A, 14B and 14C, an insulating spacer 62 may be formed in the second opening OP2. According to an embodiment, the insulating spacer 62 may be formed by oxidizing the conductive layers 61. However, the insulating spacer 62 might not be formed in levels that correspond to the second material layers 52. In other words, the insulating spacer may be formed only in levels that correspond to the conductive layers 61. In addition, the spacer 58A may be oxidized, and the insulating spacer 62 may be further formed on the sidewall of the spacer 58A. According to an embodiment, the insulating spacer 62 may be formed by depositing an insulating material in the second opening OP2. The insulating spacer 62 may be formed conformally along an inner surface of the second opening OP2. The insulating spacer 62 may fill the re-opened sixth openings OP6 and may include protrusions on a sidewall thereof. The protrusions may be located at levels that correspond to the conductive layers 61.

Though not shown, the insulating spacer 62 may be further formed on a bottom surface of the second opening OP2 (e.g., an upper surface of a base). For example, the upper surface of the base may be opened by etching a portion of the insulating spacer 62 that is formed on the bottom surface of the second opening OP2.

Figure 14D:
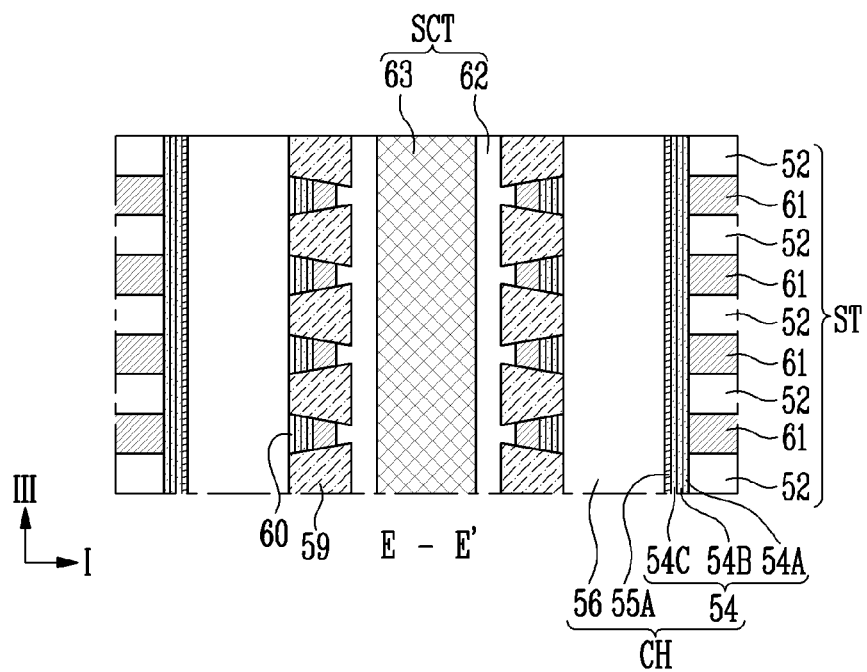

Referring to FIGS. 14A, 14B, and 14D, a source contact plug 63 may be formed in the second opening OP2. A process of exposing the channel patterns 55A may then be performed. The channel patterns 55A may be exposed by removing the conductive pad 57. According to an embodiment, the spacer 58A, the conductive pad 57, and the source contact structure SCT may be planarized through a chemical mechanical polishing (CMP) process until the channel patterns 55A are exposed. As shown in FIGS. 14A to 14C, the second material layers 52 may have a uniform thickness. However, in consideration of some loss during the planarizing process, the uppermost second material layer 52 may be thicker than the other second material layers 52.

Though not shown, an isolation pattern that partially penetrates the stacked structure ST, a slit insulating structure located at the boundary between the memory blocks MB, an interconnection structure that is coupled to the channel structure CH, and an interconnection structure that is coupled to the source contact structure SCT may be further formed. In addition, when the base includes a sacrificial layer for forming a source layer, a process of replacing the sacrificial layer with the source layer may be further performed.

According to the above-described manufacturing method, the third openings OP3 with contact points with the channel structures CH, adjacent thereto, may be formed by selectively extending the second opening OP2 at levels that correspond to the second material layers 52. In addition, by selectively etching the channel layer 55 through the third openings OP3, the channel layer 55 may be separated into channel patterns 55A. Therefore, the channel structure CH with the channel patterns 55A that are separated from each other may be formed.

FIGS. 15A to 15C, FIGS. 16A to 16C, and FIGS. 17A to 17C are diagrams, illustrating a method of manufacturing a semiconductor device, according to an embodiment. In the drawings, cross-sectional views show F-F' cross-sections. Hereinafter, description of certain elements that are discussed above is omitted for the sake of brevity.

Figure 15A:
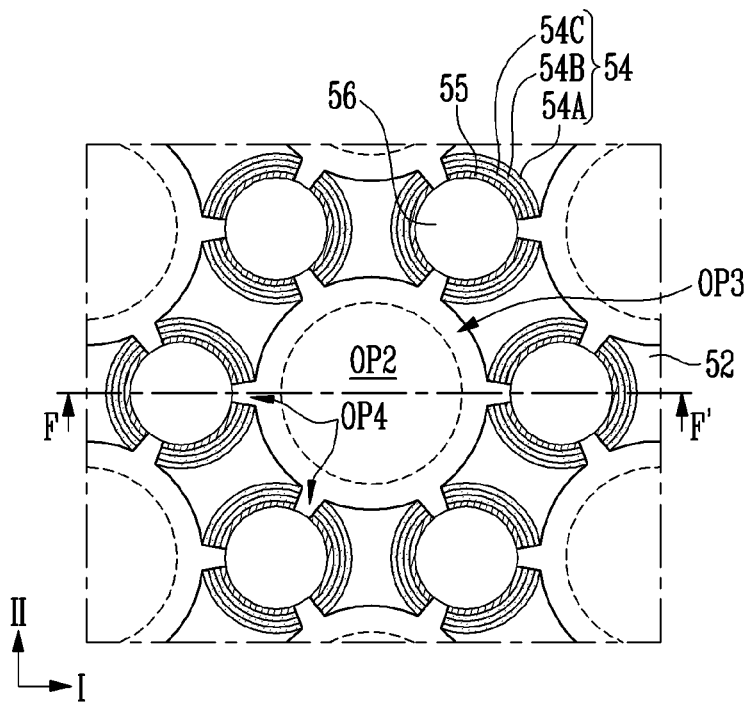
FIGS. 15A to 15C, FIGS. 16A to 16C, and FIGS. 17A to 17C are diagrams, illustrating a method of manufacturing a semiconductor device according to an embodiment.
Figure 15B:
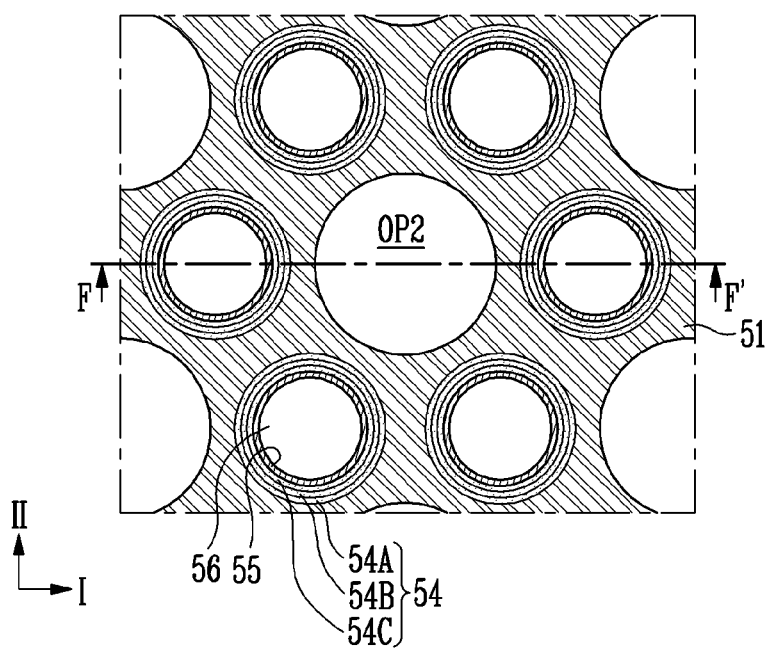
Figure 15C:
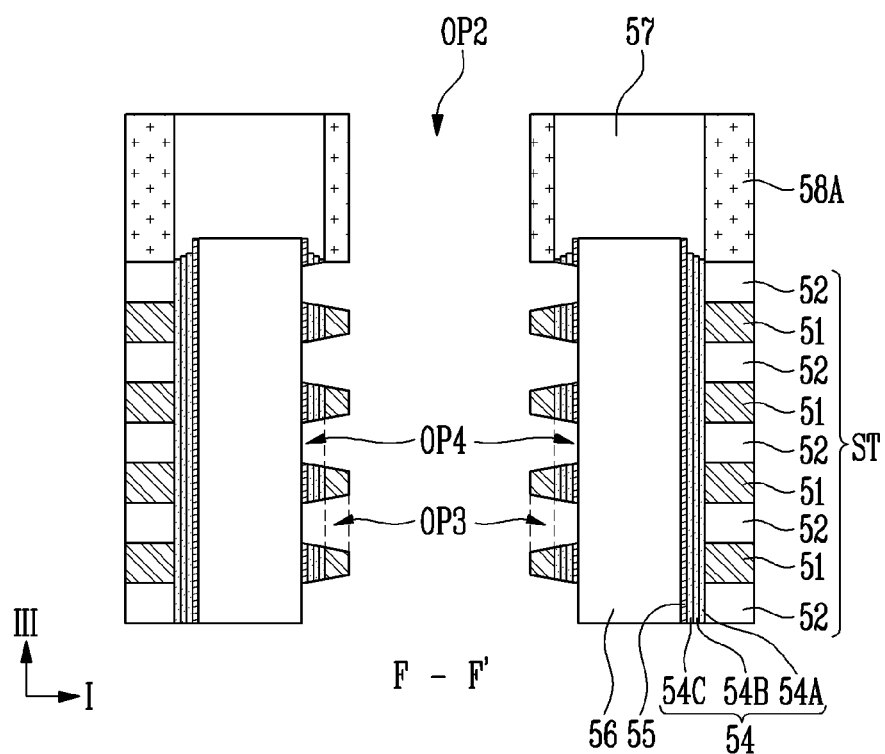

FIGS. 15A to 15C may correspond to the manufacturing method as described above with reference to FIGS. 10A to 10C. Referring to FIGS. 15A to 15C, the memory layer 54 and the channel layer 55 may be etched through the third openings OP3. After the memory layer 54 is etched through contact points, the channel layer 55 may be etched. As a result, the fourth openings OP4 may be formed through the memory layer 54 and the channel layer 55.

Figure 16A:
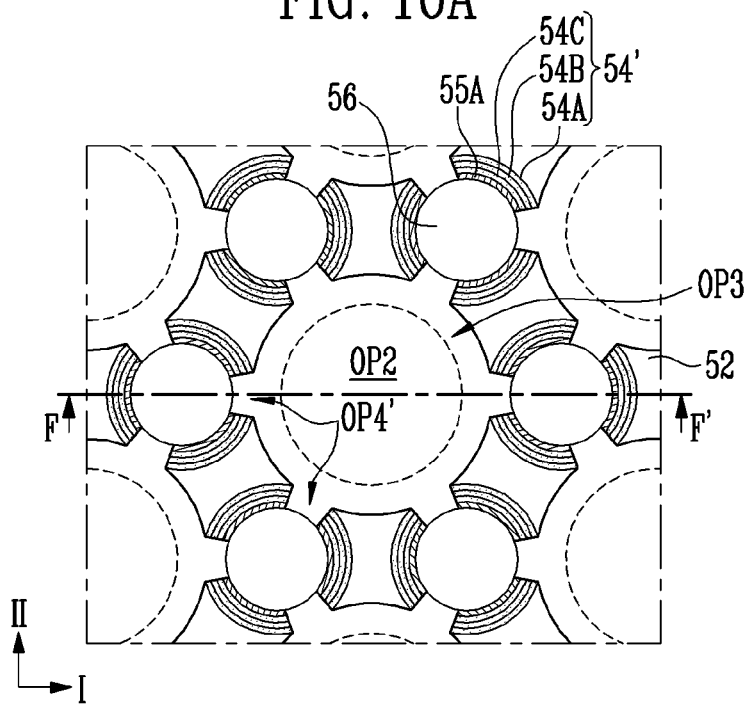
Figure 16B:
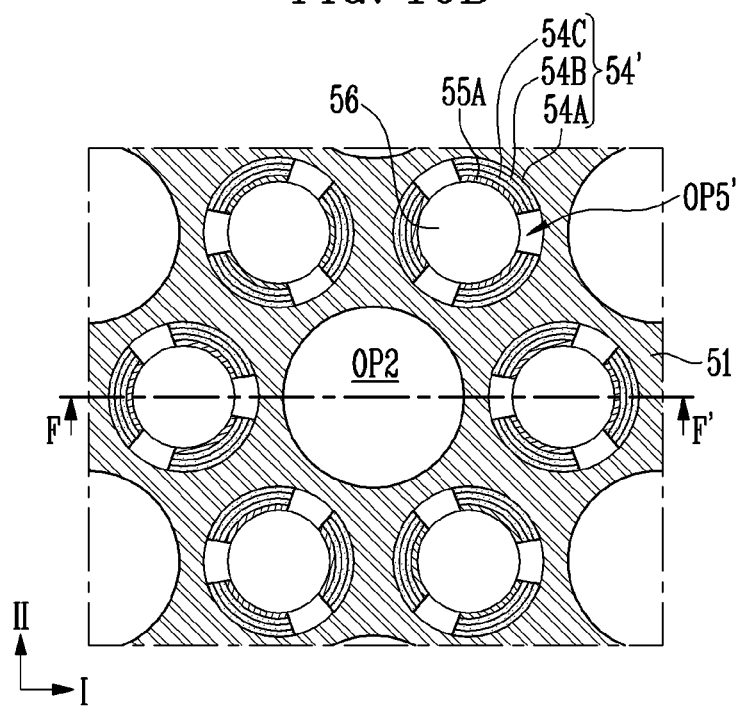
Figure 16C:
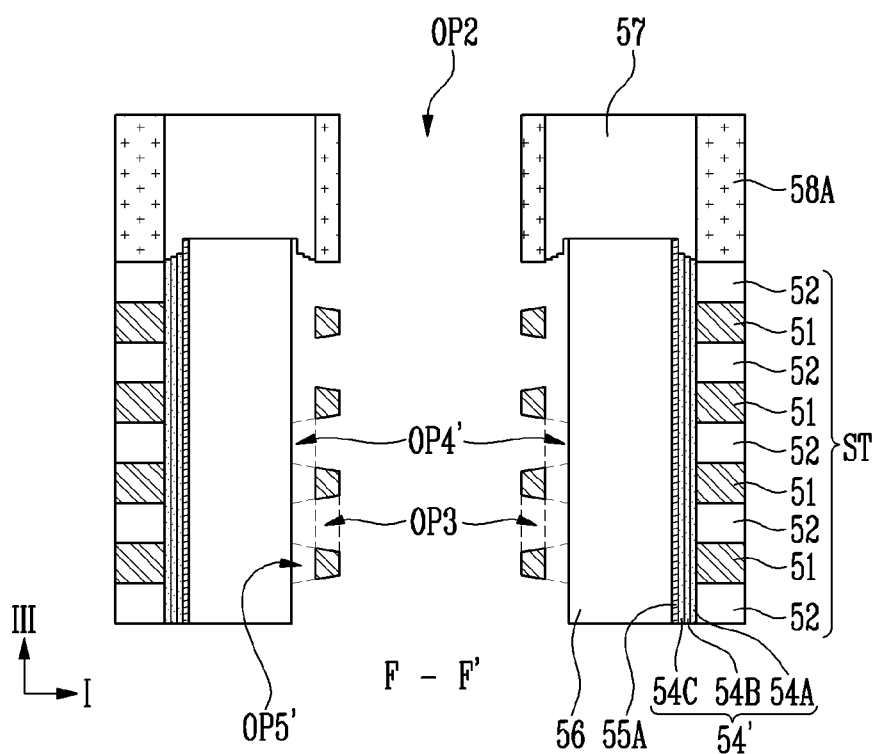

Referring to FIGS. 16A to 16C, the channel layer 55 and the memory layer 54 may be selectively etched through the fourth openings OP4. The channel layer 55 may be selectively etched after the memory layer 54 is selectively etched. The channel layer 55 may be etched through dry etching or wet etching. According to an embodiment, the channel layer 55 may be selectively etched by using Tetra Methyl Ammonium Hydroxide (TMAH). According to an embodiment, at least one of the tunnel insulating layer 54C, the data storage layer 54B, and the blocking layer 54A may be etched. As a result, fourth openings OP4' may extend in the third direction III and fifth openings OP5' may be formed in the region from which the channel layer 55 and the memory layer 54 are etched.

The fourth openings OP4' that are adjacent to each other in the third direction III may be coupled to each other through the fifth openings OP5'. In addition, the channel layer 55 may be separated into channel patterns 55A by the fourth openings OP4' and the fifth openings OP5'. In addition, the memory layer 54 may be separated into memory patterns 54' by the fourth openings OP4' and the fifth openings OP5'.

The channel layer 55 may be selectively etched. More specifically, the channel layer 55 that is exposed through the fourth openings OP4' may be etched in a horizontal direction. In the same manner, the memory layer 54 may be selectively etched. More specifically, the memory layer 54 exposed through the fourth openings OP4' may be etched in the horizontal direction. Therefore, the fourth openings OP4' may extend in the horizontal direction in levels that correspond to the second material layers 52.

Figure 17A:
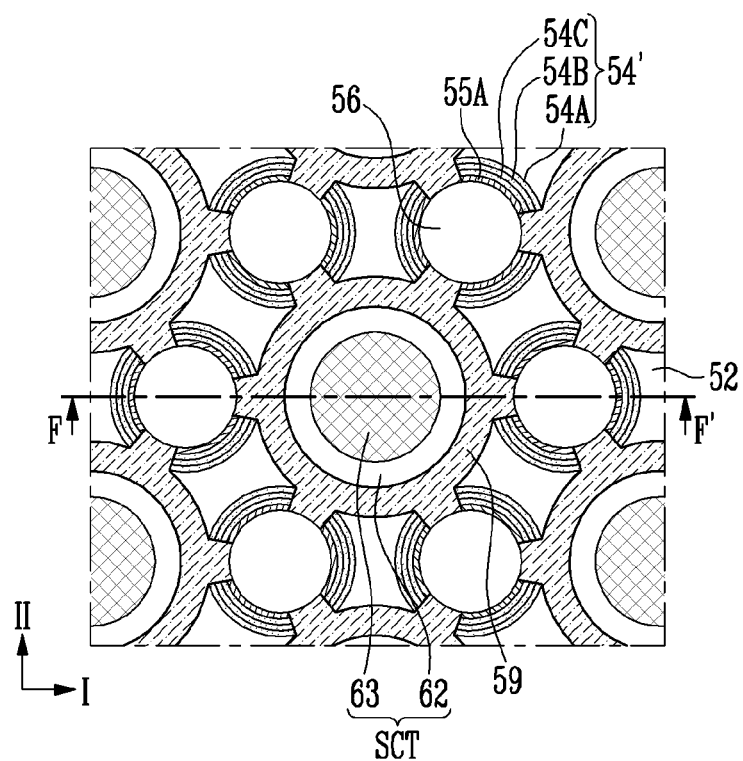
Figure 17B:
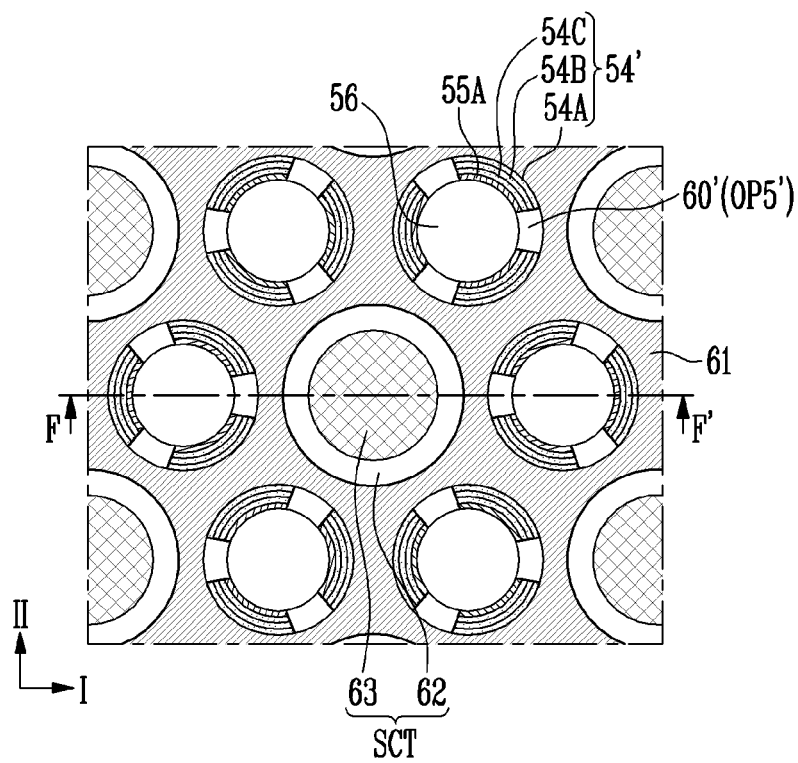
Figure 17C:
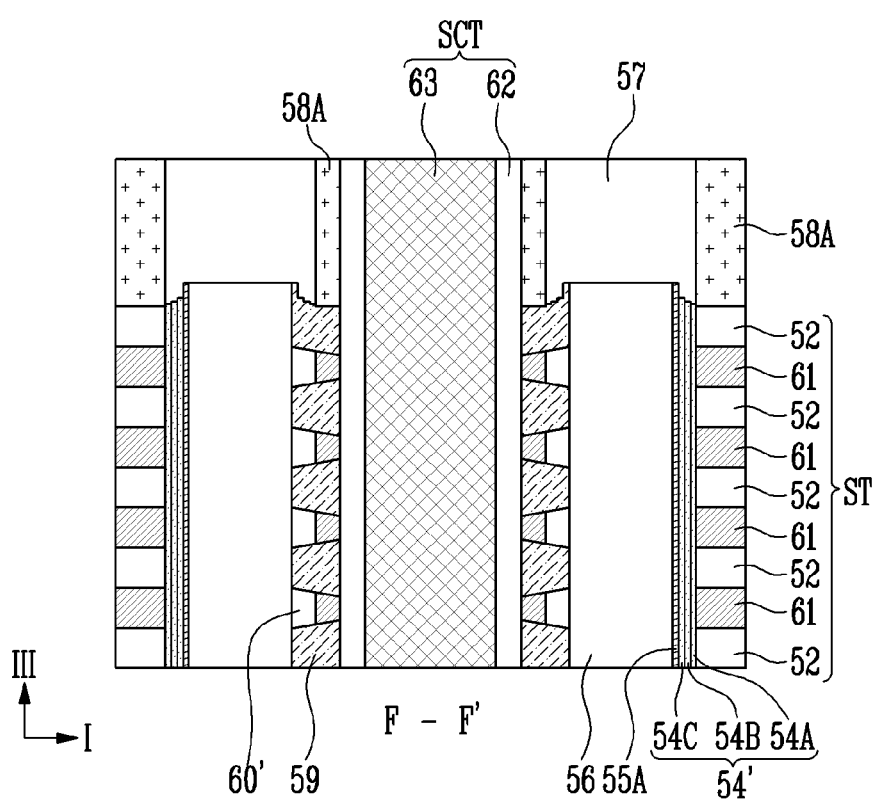

Referring to FIGS. 17A to 17C, the insulating patterns 59 may be formed in the third openings OP3 and the fourth openings OP4'. Insulators 60' may be formed in the fifth openings OP5'. The insulators 60' may be located between neighboring channel patterns 55A in the horizontal direction and between neighboring memory patterns 54' in the horizontal direction. As described above, the insulating patterns 59 may have flat sidewalls or concave sidewalls. In addition, the insulating patterns 59 may extend into the fifth openings OP5'.

Subsequently, the first material layers 51 may be replaced by the conductive layers 61. The source contact structure SCT may then be formed in the second opening OP2.

Though not shown, a planarizing process may be additionally performed to expose the channel patterns 55A. In addition, an isolation pattern that penetrates a portion of the stacked structure ST, an interconnection structure that is coupled to the channel structure CH, and an interconnection structure that is coupled to the source contact structure SCT may be further formed. In addition, when a base includes a sacrificial layer for forming a source layer, a process of replacing the sacrificial layer with the source layer may be further performed.

According to the above-described manufacturing method, the channel layer 55 may be separated into the channel patterns 55A and the memory layer 54 may be separated into the memory patterns 54'. Therefore, the channel structure CH with the channel patterns 55A that are separated from each other and the memory patterns 54' that are separated from each other may be formed.

FIGS. 18A and 18B, FIGS. 19A to 19C, FIGS. 20A to 20C, and FIGS. 21A and 21B are diagrams, illustrating a method of manufacturing a semiconductor device, according to an embodiment of the present disclosure. In the drawings, cross-sectional views show G-G' cross-sections. Hereinafter, description of certain elements that are discussed above is omitted for the sake of brevity.

Figure 18B:
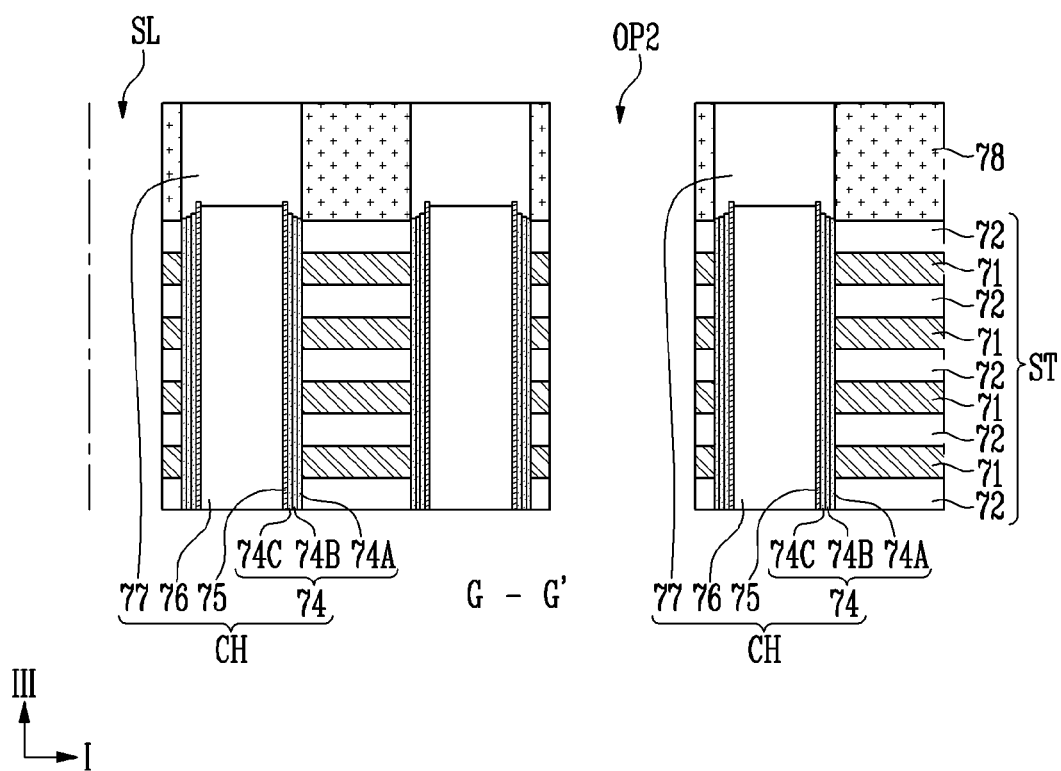

Referring to FIGS. 18A and 18B, the stacked structure ST may include first material layers 71 and second material layers 72 that are stacked alternately with each other. The channel structures CH may be formed through the stacked structure ST. Each of the channel structures CH may include an insulating pillar 76, a channel layer 75 surrounding a sidewall of the insulating pillar 76, a memory layer 74 surrounding the channel layer 75, and a conductive pad 77. A spacer 78 that surrounds the upper sidewalls of the channel structures CH may be formed.

The second openings OP2 and slits SL may be formed through the stacked structure ST and may be located between the channel structures CH. The stacked structure ST may be etched by using the spacer 78 and the conductive pad 77 as an etch barrier to form the second openings OP2 and the slits SL. According to an embodiment, the slits SL may be located at a boundary between the memory blocks, and the second openings OP2 may be formed in the memory blocks.

Each of the slits SL may extend in the second direction II. The slit SL may include a first portion SL_A and a second portion SL_B. The first portion SL_A may have a relatively large width, and the second portion SL_B may have a relatively small width. The slit SL may have a structure in which the first portions SL_A and the second portions SL_B are arranged alternately with each other.

Figure 19A:
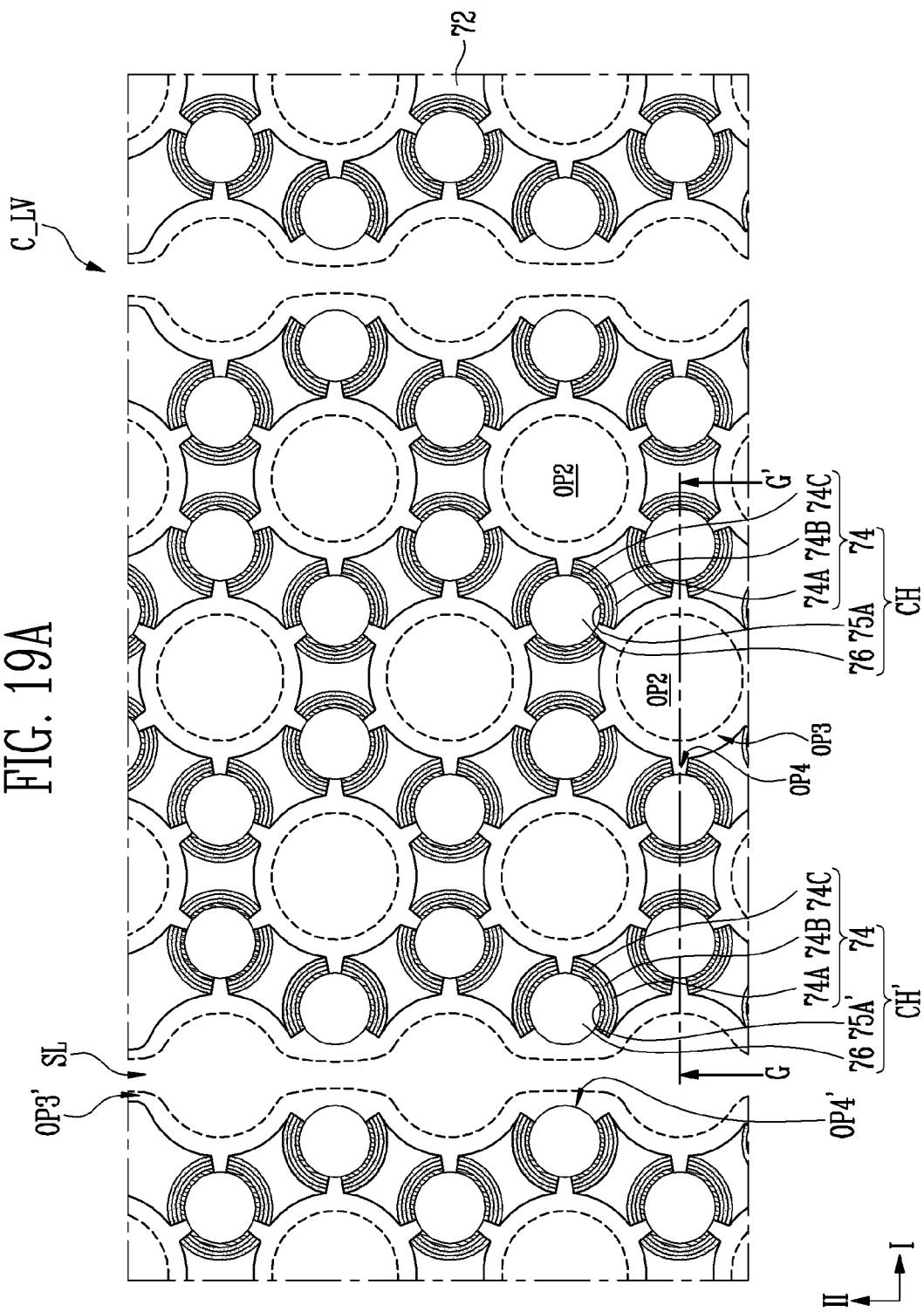
Figure 19B:
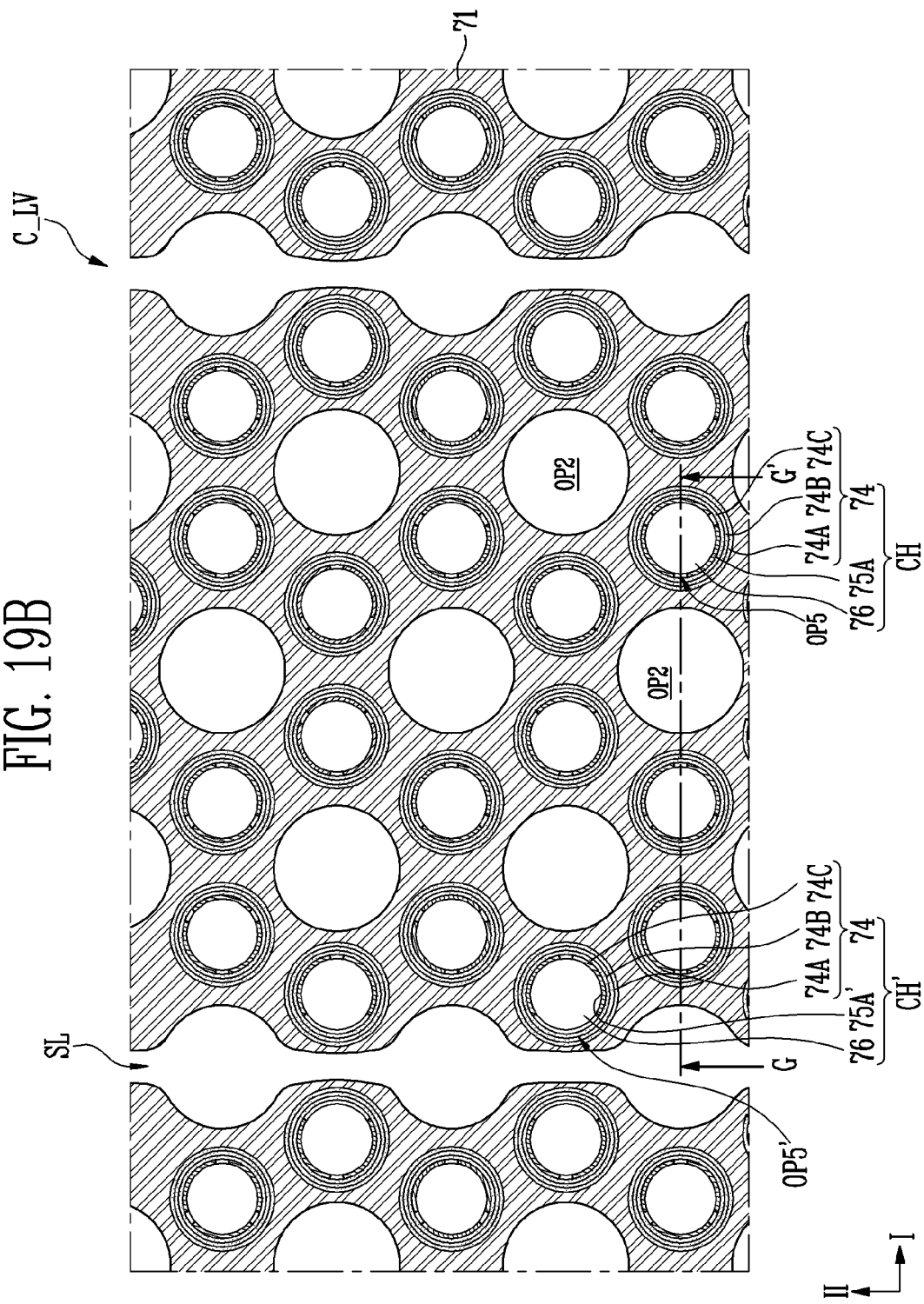
Figure 19C:
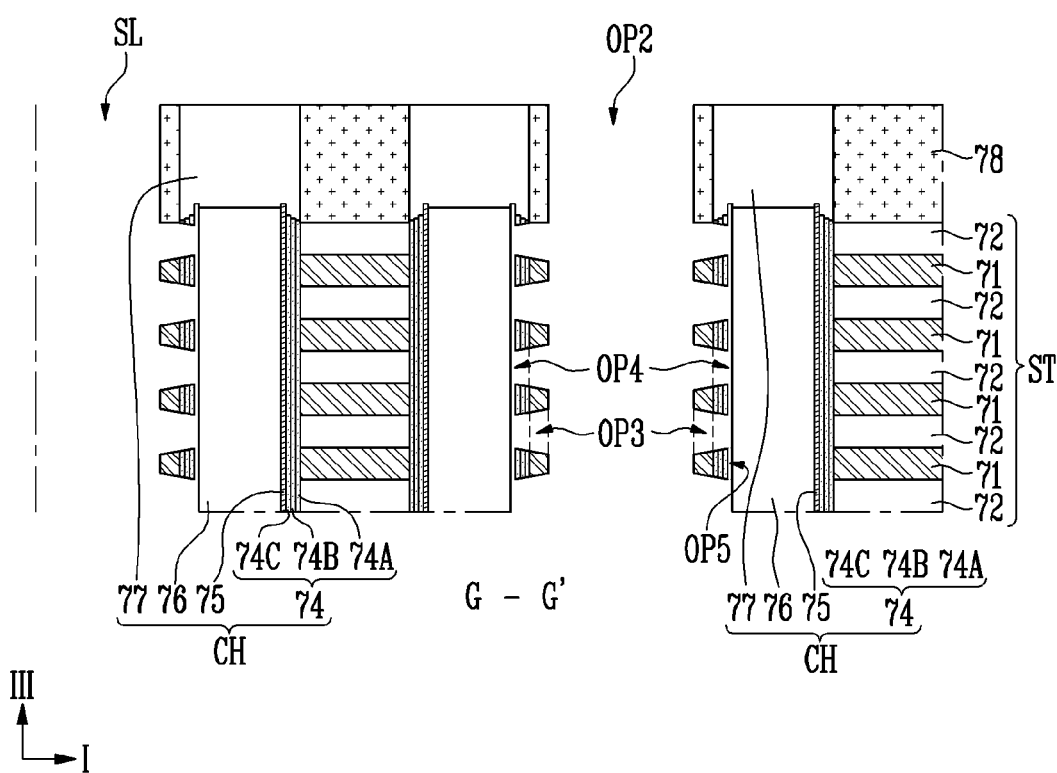

Referring to FIGS. 19A to 19C, the second material layers 72 may be selectively etched through the second openings OP2 and the slits SL. As a result, the second openings OP2 may extend in levels that correspond to the second material layers 72 to form the third openings OP3 that have contact points with the channel structures CH adjacent thereto. In addition, the slits SL may extend in levels that correspond to the second material layers 72 to form third openings OP3' that have contact points with the channel structures CH adjacent thereto.

The channel structures CH may be etched through the contact points of the third openings OP3. As a result, the fourth openings OP4 may be formed through the memory layer 74 and the channel layer 75. In addition, the channel structures CH' may be etched through the contact points of the third openings OP3'. As a result, the fourth openings OP4' may be formed through the memory layer 74 and the channel layer 75. The contact points of the third openings OP3' may have substantially the same width as or a greater width than the contact points of the third openings OP3. Accordingly, the fourth openings OP4' may have substantially the same width as or a greater width than the fourth openings OP4.

Subsequently, by selectively etching the channel layer 75 through the fourth openings OP4, the channel layer 75 may be separated into channel patterns 75A. As a result, the fifth openings OP5 may be formed in the channel structure CH. In addition, by selectively etching the channel layer 75 through the fourth openings OP4', the channel layer 75 may be separated into channel patterns 75A'. As a result, the fifth openings OP5' may be formed in the channel structure CH'. The fifth openings OP5' may have substantially the same or greater width than the fifth openings OP5. The number of channel patterns that are included in the channel structure CH' may be smaller than or equal to the number of channel patterns that are included in the channel structure CH.

Figure 20A:
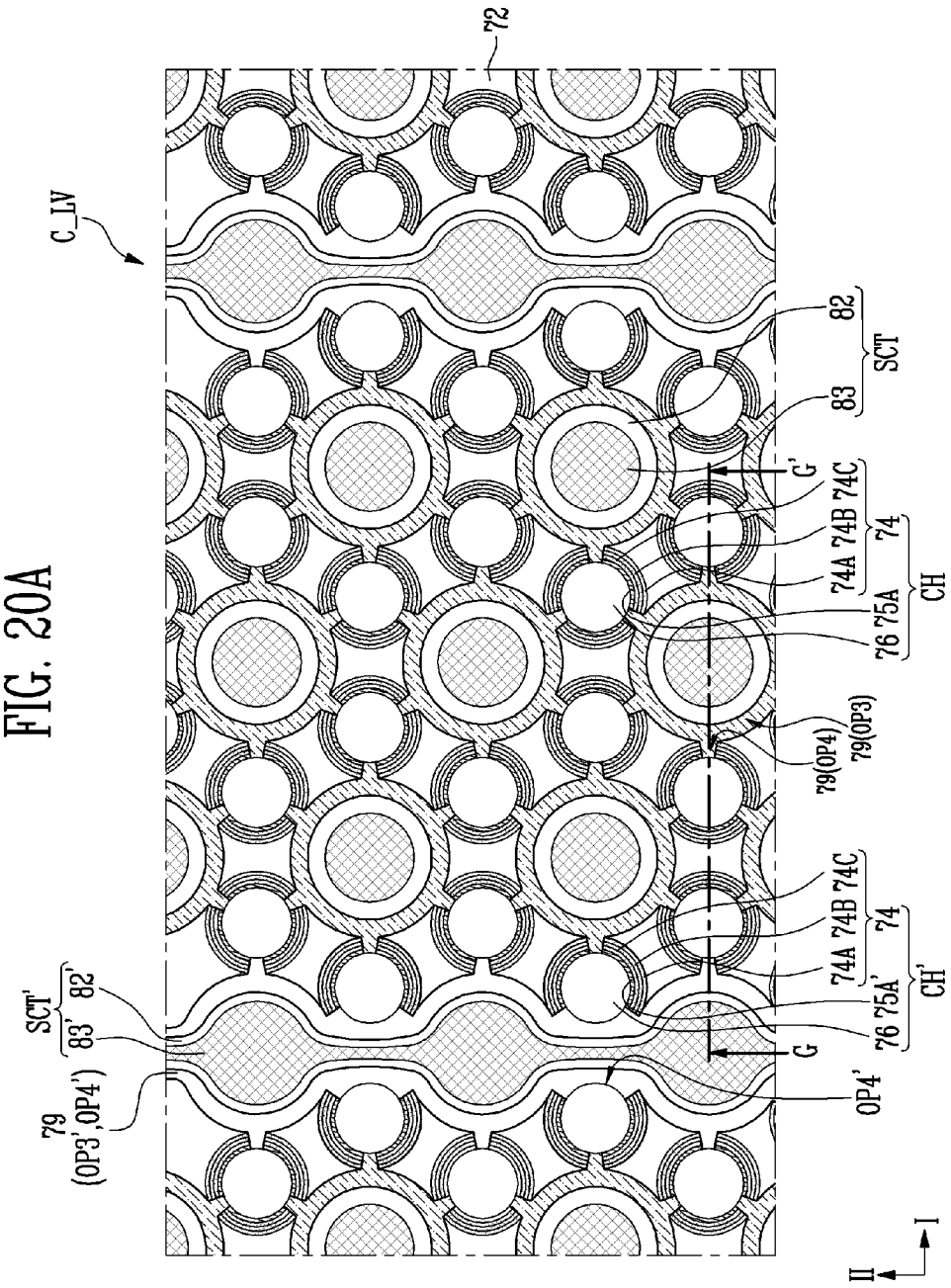
Figure 20B:
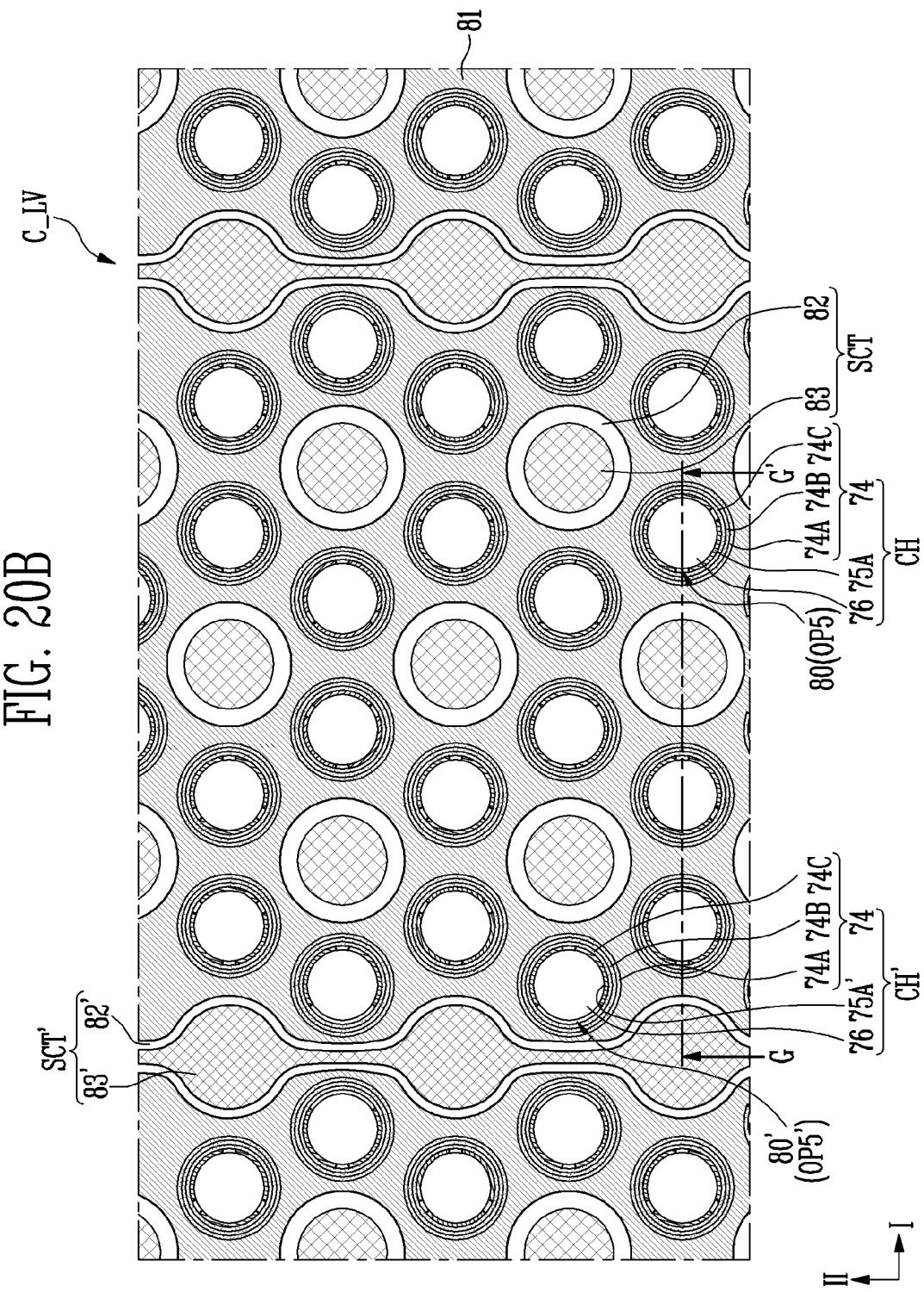
Figure 20C:
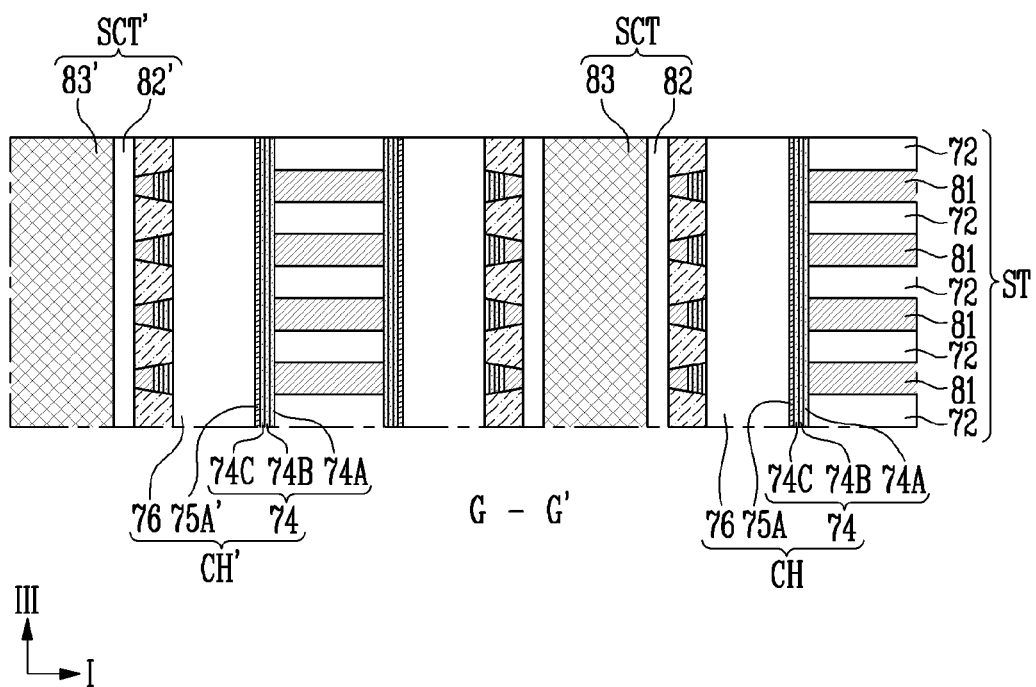

Referring to FIGS. 20A to 20C, insulating patterns 79 may be formed in the third openings OP3 and OP3' and the fourth openings OP4 and OP4', and insulators 80 may be formed in the fifth openings OP5 and OP5'. The insulating patterns 79 may extend into the fifth openings OP5 and OP5' or seal air gaps in the fifth openings OP5 and OP5'. Subsequently, the first material layers 71 may be replaced with conductive layers 81 through the second openings OP2 and the slits SL.

Subsequently, the source contact structures SCT and SCT' may be formed in the second openings OP2 and the slits SL. The source contact structure SCT may include an insulating spacer 82 and a source contact plug 83. The source contact plug 83 may include a first conductive layer and a second conductive layer. The source contact structure SCT' may include an insulating spacer 82' and a source contact plug 83'. The source contact plug 83' may include a first conductive layer and a second conductive layer. According to an embodiment, both the source contact structure SCT and the source contact structure SCT' may be electrically coupled to a source layer of a base. According to an embodiment, only portions of the source contact structure SCT and the source contact structure SCT' may be electrically coupled to the source layer of the base. A planarizing process may then be performed to expose the channel patterns 75A and 75A'.

Figure 21A:
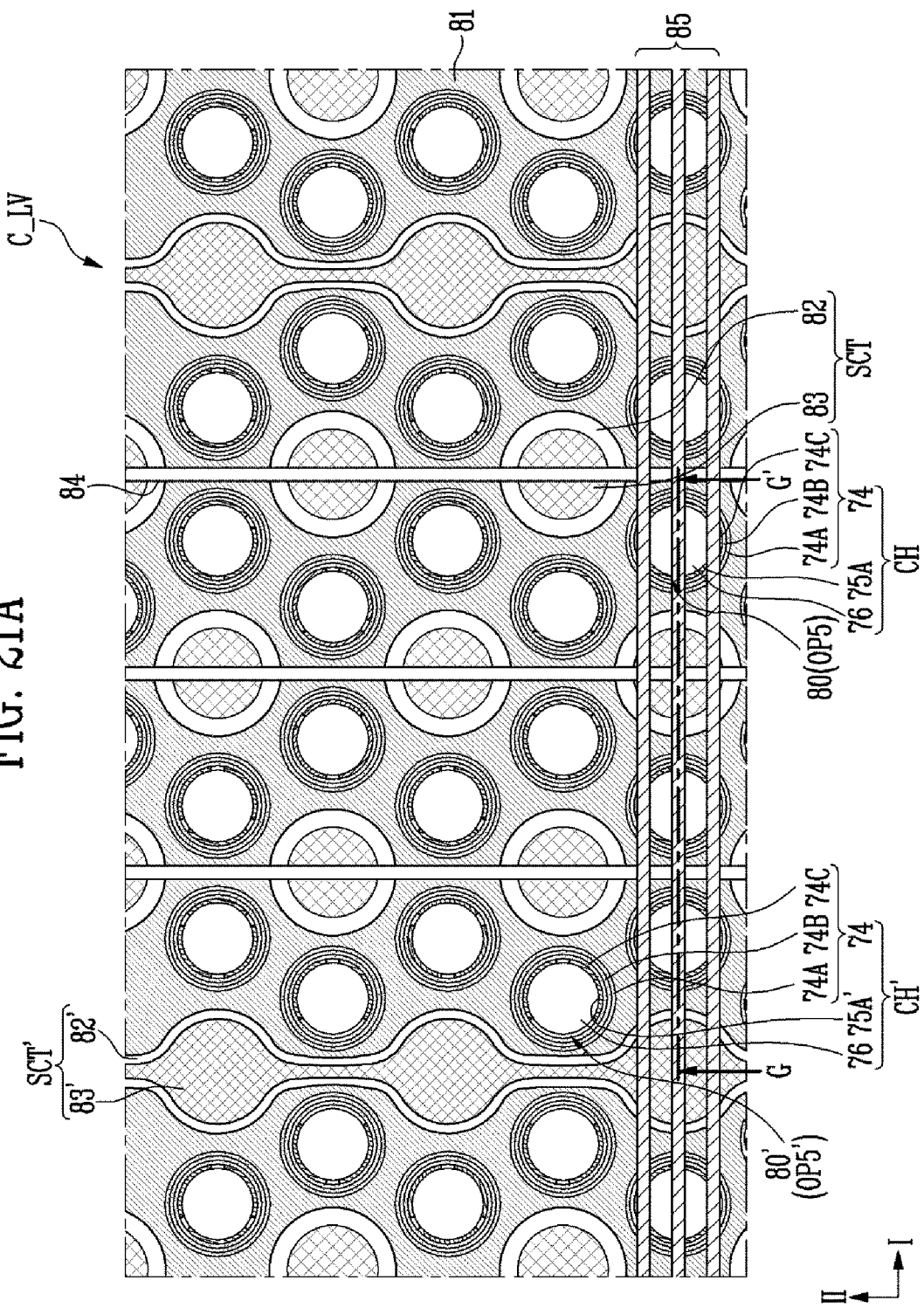
Figure 21B:
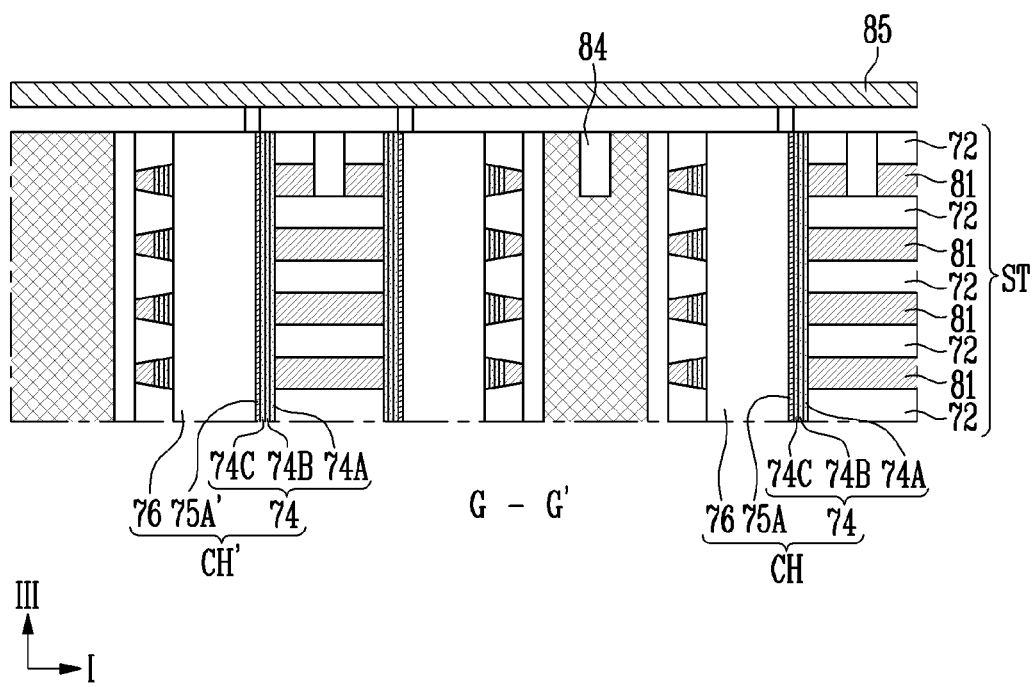

Referring to FIGS. 21A and 21B, isolation patterns 84 may be formed. After trenches are formed through the stacked structure ST to a predetermined depth, the isolation patterns 84 may be formed in the trenches. According to an embodiment, the second material layers 72, the conductive layers 81, and the source contact structure SCT may be etched to form the trenches.

Wires 85 that are electrically coupled to the channel structures CH and CH' may be formed. The wires 85 may be formed over the stacked structure ST and may extend in the first direction. For a better understanding of the present disclosure, the wires 85 are illustrated in part of FIG. 21A.

According to the above-described manufacturing method, a slit may be formed when the second openings OP2 are formed. Therefore, the channel structure CH with the channel patterns 75A that are separated from each other and the channel structure CH' with the channel patterns 75A' that are separated from each other may be formed. In addition, the stacked structure ST may be divided in units of memory blocks.

Figure 22:
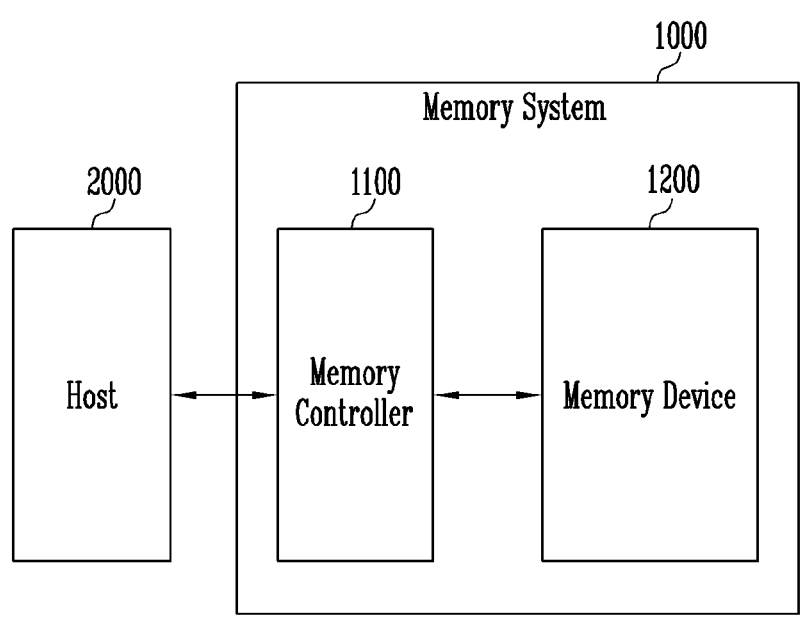
FIG. 22 is a diagram, illustrating a memory system, according to an embodiment of the present disclosure.

FIG. 22 is a diagram, illustrating a memory system 1000, according to an embodiment of the present disclosure.

Referring to FIG. 22, the memory system 1000 may include a memory device 1200 that is configured to store data and a controller 1100 performing communications between the memory device 1200 and a host 2000.

The host 2000 may be a device or system configured to store data in the memory system 1000 or retrieve data from the memory system 1000. The host 2000 may generate requests for various operations and output the generated requests to the memory system 1000. The requests may include a program request for a program operation, a read request for a read operation, and an erase request for an erase operation. The host 2000 may communicate with the memory system 1000 by using at least one interface protocol among Peripheral Component Interconnect Express (PCIe), Advanced Technology Attachment (ATA), Serial ATA (SATA), Parallel ATA (PATA), Serial Attached SCSI (SAS), Non-Volatile Memory express (NVMe), Universal Serial Bus (USB), Multi-Media Card (MMC), Enhanced Small Disk Interface (ESDI), and Integrated Drive Electronics (IDE).

The host 2000 may include at least one of a computer, a portable digital device, a tablet, a digital camera, a digital audio player, a television, a wireless communication device, or a cellular phone. However, embodiments of the disclosed technology are not limited thereto.

The controller 1100 may control overall operations of the memory system 1000. The controller 1100 may control the memory device 1200 in response to the requests of the host 2000. The controller 1100 may control the memory device 1200 to perform a program operation, a read operation and an erase operation at the request of the host 2000. Alternatively, the controller 1100 may perform a background operation for performance improvement of the memory system 1000 in the absence of the request from the host 2000.

To control the operations of the memory device 1200, the controller 1100 may transfer a control signal and a data signal to the memory device 1200. The control signal and the data signal may be transferred to the memory device 1200 through different input/output lines. The data signal may include a command, an address, or data. The control signal may be used to differentiate periods where the data signal is input.

The memory device 1200 may perform a program operation, a read operation and an erase operation in response to control of the controller 1100. The memory device 1200 may be a volatile memory that loses data when power supply is blocked, or a non-volatile memory that retains data in the absence of power supply. According to an embodiment, the memory device 1200 may be the above-descried semiconductor device, which may be a flash memory device.

At the request for a program, read, or erase operation from the host 2000, the controller 1100 may command the memory device 1200 which has the structure as described above with reference to FIGS. 1A to 6B, or which is manufactured by the method as described with reference to FIGS. 7A to 21B to perform a program, read, or erase operation. In this manner, a cell performance characteristics and retention characteristics may be improved.

Figure 23:
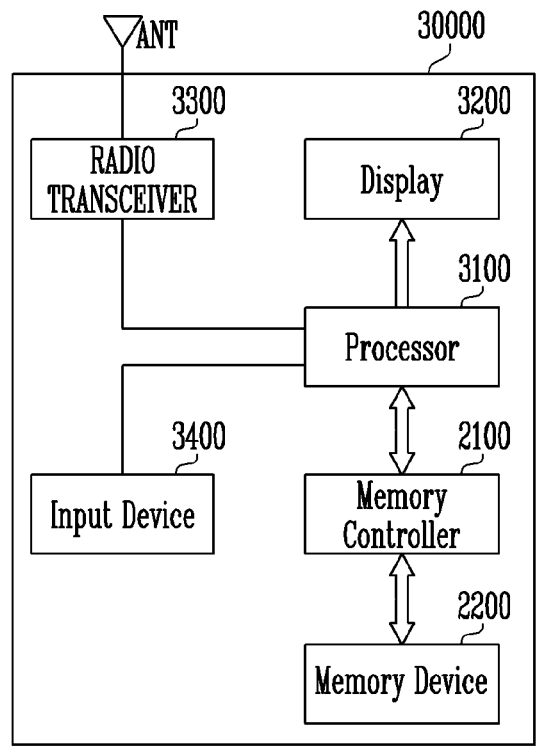
FIG. 23 is a diagram, illustrating a memory system, according to an embodiment of the present disclosure.

FIG. 23 is a diagram, illustrating a memory system 30000, according to an embodiment of the present disclosure.

Referring to FIG. 23, the memory system 30000 may be embodied into a cellular phone, a smart phone, a tablet, a personal computer (PC), a personal digital assistant (PDA), or a wireless communication device. The memory system 30000 may include a memory device 2200 and a controller 2100 controlling the operations of the memory device 2200.

The controller 2100 may control a data access operation of the memory device 2200, for example, a program operation, an erase operation or a read operation of the memory device 2200 in response to control of a processor 3100.

The data programmed into the memory device 2200 may be output through a display 3200 in response to control of the controller 2100.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the controller 2100 or the display 3200. The controller 2100 may transfer the signal processed by the processor 3100 into the memory device 2200. In addition, the radio transceiver 3300 may change a signal output from the processor 3100 into a radio signal and output the radio signal to an external device through the antenna ANT. A control signal for controlling the operations of the host or data to be processed by the processor 3100 may be input by an input device 3400, and the input device 3400 may include a pointing device, such as a touch pad and a computer mouse, a keypad, or a keyboard. The processor 3100 may control the operations of the display 3200 so that data output from the controller 2100, data output from the radio transceiver 3300, or data output from an input device 3400 may be output through the display 3200.

According to an embodiment, the controller 2100 capable of controlling the operations of the memory device 2200 may be realized as a portion of the processor 3100, or as a separate chip from the processor 3100.

Figure 24:
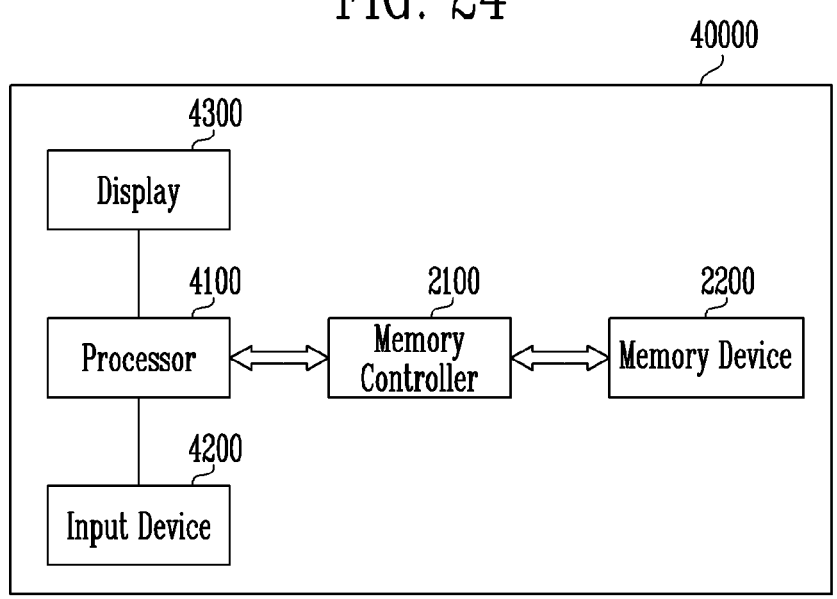
FIG. 24 is a diagram, illustrating a memory system, according to an embodiment of the present disclosure.

FIG. 24 is a diagram, illustrating a memory system 40000, according to an embodiment of the present disclosure.

Referring to FIG. 24, the memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 2200 and the controller 2100 controlling a data processing operation of the memory device 2200.

A processor 4100 may output data stored in the memory device 2200 through a display 4300 according to data input through an input device 4200. Examples of the input device 4200 may include a pointing device, such as a touch pad or a computer mouse, a keypad, or a keyboard.

The processor 4100 may control overall operations of the memory system 40000 and control operations of the controller 2100. According to an embodiment, the controller 2100 capable of controlling the operations of the memory device 2200 may be realized as a portion of the processor 4100, or as a separate chip from the processor 4100.

Figure 25:
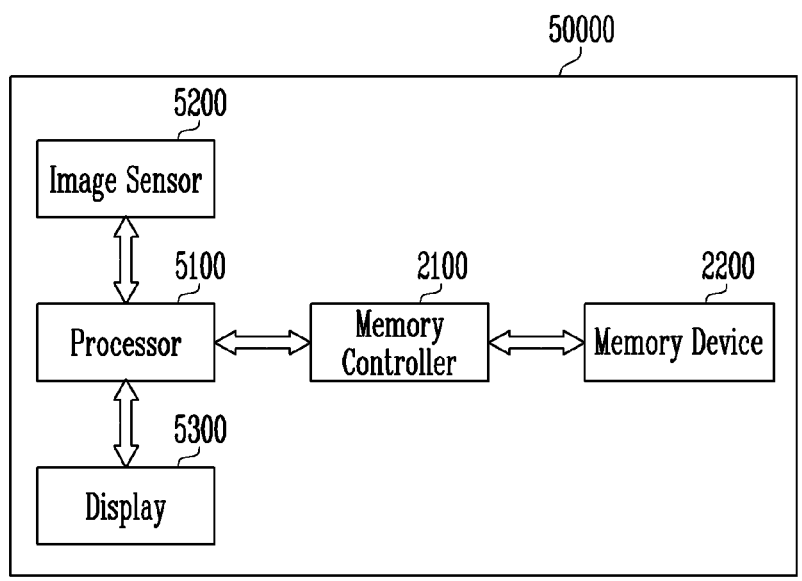
FIG. 25 is a diagram, illustrating a memory system, according to an embodiment of the present disclosure.

FIG. 25 is a diagram, illustrating a memory system 50000, according to an embodiment of the present disclosure.

Referring to FIG. 25, the memory system 50000 may be embodied into an image processor, for example, a digital camera, a cellular phone with a digital camera attached thereto, a smart phone with a digital camera attached thereto, or a table PC with a digital camera attached thereto.

The memory system 50000 may include the memory device 2200 and the controller 2100 controlling a data processing operation of the memory device 2200, for example, a program operation, an erase operation, or a read operation.

An image sensor 5200 of the memory system 50000 may convert an optical image into digital signals. The converted digital signals may be transferred to a processor 5100 or the controller 2100. In response to control of the processor 5100, the converted digital signals may be output through a display 5300 or stored in the memory device 2200 through the controller 2100. In addition, the data stored in the memory device 2200 may be output through the display 5300 in response to control of the processor 5100 or the controller 2100.

According to an embodiment, the controller 2100 capable of controlling the operations of the memory device 2200 may be formed as a part of the processor 5100, or a separate chip from the processor 5100.

Figure 26:
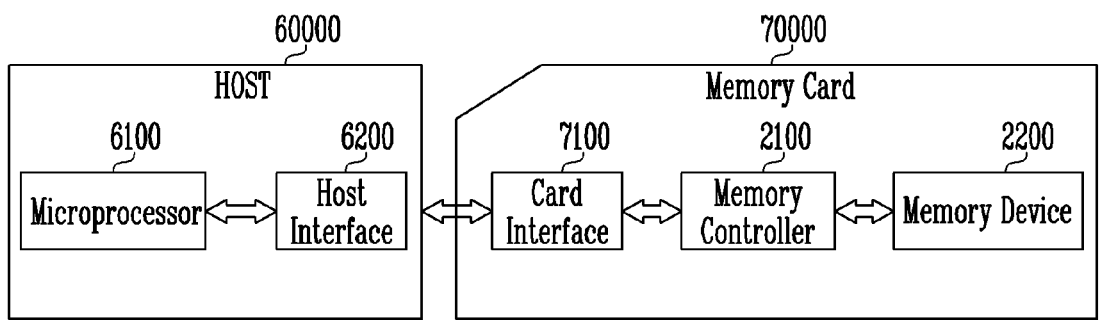
FIG. 26 is a diagram, illustrating a memory system, according to an embodiment of the present disclosure.

FIG. 26 is a diagram, illustrating a memory system 70000, according to an embodiment of the present disclosure.

Referring to FIG. 26, the memory system 70000 may include a memory card or a smart card. The memory system 70000 may include the memory device 2200, the controller 2100, and a card interface 7100.

The controller 2100 may control data exchange between the memory device 2200 and the card interface 7100. According to an embodiment, the card interface 7100 may be, but not limited thereto, a secure digital (SD) card interface or a multi-media card (MMC) interface.

The card interface 7100 may interface data exchange between a host 60000 and the controller 2100 according to a protocol of the host 60000. According to an embodiment, the card interface 7100 may support a Universal Serial Bus (USB) protocol and an InterChip (IC)-USB protocol. The card interface 7100 may refer to hardware capable of supporting a protocol which is used by the host 60000, software installed in the hardware, or a signal transmission method.

When the memory system 70000 is connected to a host interface 6200 of the host 60000, such as a PC, a tablet PC, a digital camera, a digital audio player, a cellular phone, a console video game hardware, or a digital set-top box, the host interface 6200 may perform data communication with the memory device 2200 through the card interface 7100 and the controller 2100 in response to control of a microprocessor 6100.

According to embodiments of the invention, a semiconductor device with a stabilized structure and improved reliability may be provided.

What is claimed is:

1. A semiconductor device, comprising:
   a stacked structure with conductive layers and insulating layers that are stacked alternately with each other in a stacking direction;
   an insulating pillar passing through the stacked structure;
   a first channel pattern surrounding a sidewall of the insulating pillar;
   a second channel pattern surrounding the sidewall of the insulating pillar;
   first insulators located between the first channel pattern and the second channel pattern; and
   a memory layer surrounding the first channel pattern, the second channel pattern, and each of the first insulators, the memory layer with a first opening that is located between the first channel pattern and the second channel pattern,
   wherein the first insulators are separated from each other in the stacking direction.

2. The semiconductor device of claim 1,
   wherein the first opening is located at a level that corresponds to each of the insulating layers.

3. The semiconductor device of claim 1,
   wherein each of the first insulators is an air gap.

4. The semiconductor device of claim 1, further comprising:
   a third channel pattern surrounding the sidewall of the insulating pillar;
   a second insulator between the second channel pattern and the third channel pattern; and a third insulator between the third channel pattern and the first channel pattern.

5. The semiconductor device of claim 4, wherein the memory layer further includes a second opening that is located between the second channel pattern and the third channel pattern and a third opening that is located between the first channel pattern and the third channel pattern.

6. The semiconductor device of claim 1, further comprising a source contact structure passing through the stacked structure.

7. The semiconductor device of claim 1, further comprising:
a first bit line coupled to the first channel pattern; and
a second bit line coupled to the second channel pattern.

8. A semiconductor device, comprising:
a stacked structure with conductive layers and insulating layers that are stacked alternately with each other in a stacking direction;
a source contact structure passing through the stacked structure;
channel structures passing through the stacked structure and arranged around the source contact structure;
insulating patterns each with a first portion that surrounds a sidewall of the source contact structure and second portions that protrude from the first portion and extend into the channel structures; and
insulators located between the second portions that are adjacent to each other in the stacking direction.

9. The semiconductor device of claim 8,
wherein the first portion includes contact points with the channel structures, and
wherein the second portions protrude from the contact points.

10. The semiconductor device of claim 8,
wherein each of the channel structures includes an insulating pillar, channel patterns that surround a sidewall of the insulating pillar, and a memory layer that surrounds the channel patterns, and
wherein the second portions pass through the memory layer to extend between the channel patterns.

11. The semiconductor device of claim 10,
wherein the insulators are located between the insulating pillar and the memory layer and the channel patterns are separated from each other by the insulators.

12. The semiconductor device of claim 9,
wherein each of the channel structures includes an insulating pillar, channel patterns that surround a sidewall of the insulating pillar, and memory patterns that surround the channel patterns, and
wherein the second portions extend between the memory patterns and between the channel patterns.

13. The semiconductor device of claim 12,
wherein the insulators are located between the insulating pillar and the conductive layers, and
wherein the insulators separate the memory patterns from each other and separate the channel patterns from each other.

14. The semiconductor device of claim 8,
wherein the source contact structure includes a source contact plug and an insulating spacer, the insulating spacer surrounding a sidewall of the source contact plug.

15. The semiconductor device of claim 8,
wherein distances from the source contact structure to the channel structures are substantially the same as each other.

16. A semiconductor device, comprising:
a stacked structure with conductive layers and insulating layers that are stacked alternately with each other;
an insulating pillar passing through the stacked structure;
a first channel pattern surrounding a sidewall of the insulating pillar;
a second channel pattern surrounding the sidewall of the insulating pillar;
first insulators located between the first channel pattern and the second channel pattern; and
a memory layer surrounding the first channel pattern, the second channel pattern, and each of the first insulators,
wherein the memory layer provides openings, and
wherein sidewalls of the openings of the memory layer are defined along sides of the insulating pillar at levels that correspond to the insulating layers.

* * * * *